US012793769B2

United States Patent

(12) United States Patent
Ramaraju

(10) Patent No.: US 12,793,769 B2
(45) Date of Patent: Nov. 10, 2026

(54) MEMORY DEVICE HAVING VARIABLE IMPEDANCE MEMORY CELLS AND TIME-TO-TRANSITION SENSING OF DATA STORED THEREIN

(71) Applicant: R&D 3 LLC, Round Rock, TX (US)

(72) Inventor: Ravindraraj Ramaraju, Round Rock, TX (US)

(73) Assignee: R&D 3 LLC

( * ) Notice: Subject to any disclaimer, the term of this patent is extended or adjusted under 35 U.S.C. 154(b) by 160 days.

(21) Appl. No.: 18/815,007

(22) Filed: Aug. 26, 2024

(65) Prior Publication Data

US 2024/0420759 A1 Dec. 19, 2024

Related U.S. Application Data

(63) Continuation-in-part of application No. 18/297,605, filed on Apr. 8, 2023, now Pat. No. 12,112,794.

(51) Int. Cl.
*G11C 11/40* (2006.01)
*G11C 11/405* (2006.01)
*G11C 11/4096* (2006.01)

(52) U.S. Cl.
CPC ........ *G11C 11/4096* (2013.01); *G11C 11/405* (2013.01)

(58) Field of Classification Search
CPC .......................... G11C 11/4096; G11C 11/405
See application file for complete search history.

(56) References Cited

U.S. PATENT DOCUMENTS 5,687,114 A * 11/1997 Khan .................. G11C 11/5621 365/230.03
5,841,695 A * 11/1998 Wik .................... G11C 11/5621 365/185.08
2015/0255157 A1* 9/2015 Ikeda ....................... G11C 7/16 365/185.23
2017/0317085 A1* 11/2017 Kurokawa ......... G06V 40/1306

* cited by examiner

*Primary Examiner* — Xiaochun L Chen
(74) *Attorney, Agent, or Firm* — Jason C. Cameron

(57) ABSTRACT

The present disclosure relates to circuits, systems, and methods of operation for a memory device. In an example, a memory device includes a plurality of memory cells, each memory cell having a data node, a first transistor, a second transistor, a third transistor, a write port for writing data to be stored in the memory cell, and a read port having a variable impedance that varies in accordance with a respective data value stored therein. The data value is one of at least three different data values that the memory cell is capable of storing. The second transistor and third transistor are coupled in series between the read port and a fixed reference. The first transistor is coupled between the write port and the data node.

17 Claims, 35 Drawing Sheets

MEMORY DEVICE HAVING VARIABLE IMPEDANCE MEMORY CELLS AND TIME-TO-TRANSITION SENSING OF DATA STORED THEREIN

CROSS-REFERENCE TO RELATED APPLICATIONS

The present application is a continuation of U.S. patent application Ser. No. 18/297,605, filed Apr. 8, 2023, titled “Memory Device Having Variable Impedance Memory Cells and Time-to-Transition Sensing of Data Stored Therein”, which is a continuation of U.S. patent application Ser. No. 17/328,538, filed May 24, 2021, titled “Memory Device Having Variable Impedance Memory Cells and Time-to-Transition Sensing of Data Stored Therein”, which is a continuation of U.S. patent application Ser. No. 16/802,902, filed Feb. 27, 2020, titled “Memory Device Having Variable Impedance Memory Cells and Time-to-Transition Sensing of Data Stored Therein”, which is a continuation of U.S. patent application Ser. No. 16/359,948, filed Mar. 20, 2019, titled “Memory Device Having Variable Impedance Memory Cells and Time-to-Transition Sensing of Data Stored Therein”, which is a continuation of U.S. patent application Ser. No. 16/040,419, filed Jul. 19, 2018, titled “Memory Device Having Variable Impedance Memory Cells and Time-to-Transition Sensing of Data Stored Therein”, which claims the benefit under 35 U.S.C. § 119 (e) of U.S. Provisional Application No. 62/650,067, filed Mar. 29, 2018, titled “Memory Structures and Related Methods of Operation”, and further claims the benefit under 35 U.S.C. § 119 (e) of U.S. Provisional Application No. 62/573,460, filed Oct. 17, 2017, titled “Memory Operation”. All applications are incorporated herein by reference in their entirety.

TECHNICAL FIELD

The present disclosure relates to circuits, systems, and methods of operation for a memory device, and more particularly relates to devices whose memory cells have a variable impedance that varies in accordance with a respective data value stored therein.

BACKGROUND

Memory may be used for many different types of purposes in a computing system. For example, memory may be used to store data or perform mathematical operations. Different types of memory may be used for these various purposes. Dynamic random-access memory (DRAM) may be used in situations that benefit from low-cost and high-capacity memory, and may be used in main memory components of a computing system. DRAM may be slower than other kinds of memory such as static random-access memory (SRAM).

SUMMARY

This summary is provided to introduce a selection of concepts, in a simple manner, which is further described in the detailed description of the disclosure. This summary is neither intended to identify key nor essential inventive concepts of the subject matter nor to determine the scope of the disclosure.

In an embodiment of the present disclosure, a memory cell comprises a data node, a first transistor, a second transistor, a third transistor. The memory cell further comprises a write port for writing data to be stored in the memory cell. The memory cell further comprises a read port having a variable impedance that varies in accordance with a data value stored therein. The data value is one of at least three different data values that the memory cell is capable of storing.

The second transistor and third transistor are coupled in series between the read port and a fixed reference. The first transistor is coupled between the write port and the data node.

In an embodiment, the write port is coupled with a write bit line. The read port is coupled with a read bit line.

In another embodiment, the memory cell further comprises a fourth transistor and a second read port. The fourth transistor and the second transistor are coupled in series to the second read port.

In yet another embodiment, the write bit line and the read bit line are orthogonal to each other.

In yet another embodiment, the write port is coupled with the write bit line. The second read port is coupled with a second read bit line. The write bit line and the second read bit line are orthogonal to each other.

In yet another embodiment, the memory cell further comprises the fourth transistor and a second write port. The fourth transistor is coupled between the second write port and the data node.

In yet another embodiment, the read port is coupled with the read bit line. The second write port is coupled with a second write bit line. The read bit line and the second write bit line are orthogonal to each other.

In an aspect, a method comprises determining more than one bit of information stored in a memory cell. The method comprises reading an output of a read port of the memory cell. The read port has an impedance that varies in accordance with, and is indicative of, a data value stored therein. The data value is one of at least three different data values that the memory cell is capable of storing. The determining is performed by a binary search.

In an embodiment, the memory cell is a volatile memory cell.

In another embodiment, the memory cell is a non-volatile memory cell.

In yet another embodiment, the memory cell is a 3T DRAM memory cell.

In yet another embodiment, the output of the read port is configured to perform a function operation.

In yet another embodiment, the function operation is an arithmetic operation.

In yet another embodiment, the function operation is a logical operation.

In yet another embodiment, the function operation is a logistic operation.

In yet another embodiment, the function operation is an activation operation.

In yet another embodiment, the memory cell corresponds to a memory cell of a plurality of memory cells. The binary search to determine the information stored in the plurality of memory cells performed depends on the respective value in each of the plurality of memory cells.

In yet another embodiment, the binary search to determine the information stored in the plurality of memory cells requires a logarithmic base two of possible different data values stored in the memory cells.

In yet another embodiment, the binary search is performed by applying a variable reference coupled to the read port of the memory cell.

In yet another embodiment, the variable reference is a variable reference bias current.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF THE DRAWINGS

For a detailed description of various embodiments, reference will now be made to the accompanying drawings in which.

It should be noted that the structures and timing diagrams depicted in the various figures are not necessarily drawn to scale, but rather are drawn in a manner to more clearly illustrate the teachings depicted therein.

DETAILED DESCRIPTION

Certain terms are used throughout the following description and claims to refer to particular system components. As one skilled in the art will appreciate, different companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The ability to store multiple bits in a single memory cell may be beneficial to computer users. The ability to store multiple bits in a single memory cell allows more data to be stored in the same physical space. Furthermore, the ability to perform mathematical operations using memory cells may be beneficial to machine language programmers. In order to implement both the ability to store multiple bits in a single memory cell as well as improve on an ability to perform mathematical operations using memory cells, various methods and systems are described below, directed to interpreting data stored in a memory cell.

Figure 1:
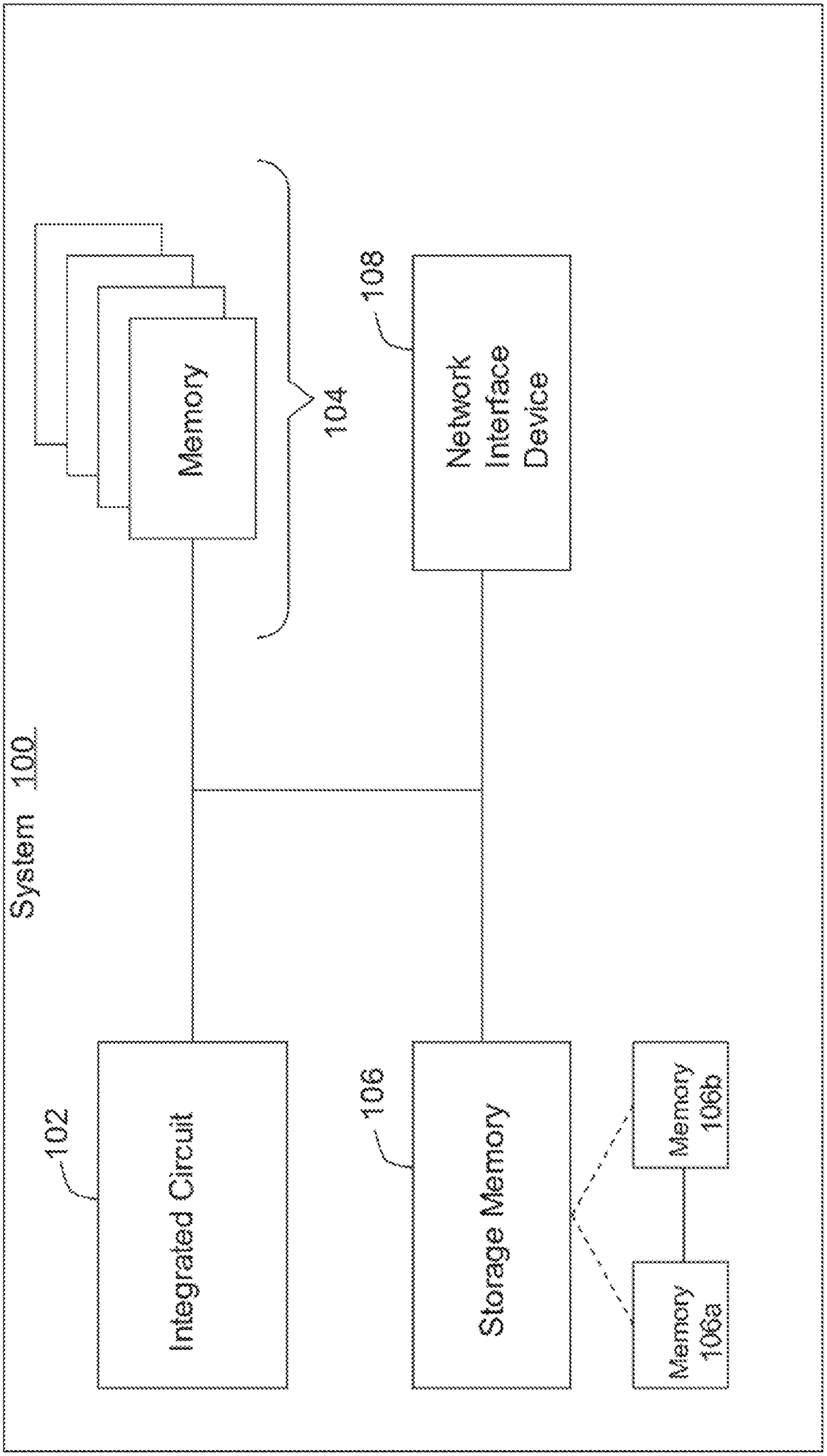
FIG. 1 shows, in block diagram form, an example computing system comprising memory structures in accordance with at least some embodiments.

FIG. 1 illustrates an environment within which memory in accordance with embodiments described herein may be used. In particular, FIG. 1 illustrates a computing system 100 that may utilize memory in accordance with embodiments described herein. The computing system 100 may be illustrative of, for example, a laptop, a desktop computer, a computer within a node of several computers, a cell phone, a tablet, or any other computing system that may utilize memory in accordance with embodiments described herein. In particular various components in the illustrative computing system 100 may use memory in accordance with embodiments described herein. The computer system 100 comprises an integrated circuit (IC) 102 and one or more memory 104 coupled to IC 102, where one or more memory 104 may comprise memory in accordance with embodiments described herein.

IC 102 represents any computing element present in a system. For example, IC 102 may be a central processing unit (CPU), a processing element, a graphics processing unit (GPU), hardware accelerator, system on a chip (SOC), digital signals processor (DSP), a machine learning unit, a matrix operations unit (MOU), etc. In some embodiments, IC 102 may comprise memory in accordance with embodiments described herein.

For example, IC 102 may comprise L3 cache memory in accordance with embodiments described herein. Additionally, memory in accordance with embodiments described herein, may be used as part of a computation process such as in the GPU, and in various chips such as the MOU tailored for machine learning. A MOU may perform matrix transpose and transformation operations. The MOU may also perform matrix arithmetic.

Additionally, IC 102 and one or more memory 104 may be coupled to storage device 106, and a network interface device 108. In some embodiments, the storage device 106 may comprise a hard drive, solid state disk, memory stick, optical disc, etc. The storage device 106 may comprise a non-transitory computer readable storage medium on which programs executable by IC 102 may be stored and accessed when needed by IC 102. Storage device 106 is not restricted to being comprised of only one type of memory. For example, in some embodiments, storage device 106 may comprise memory **106*a* and memory 106*b* used as a buffer for a solid state disk (storage device 106). Memory 106*a* may be a buffer for memory 106*b* which is a buffer for storage device 106**.

Programs stored on the storage device 106 may comprise programs to implement various processes on the computer system 100. In some cases, the programs are copied from the storage device 106 to the memory 104, and the programs are executed from the memory 104. Thus, both the memory 104 and storage device 106 shall be considered computer-readable storage mediums.

In various embodiments, network interface device 108 may allow computer system 100 to exchange data over a wireless or wired network. In some embodiments, the computer system 100 may be connected to a plurality of other computers within a shared network.

Additionally, although a computing system 100 has been described to illustrate an environment in which memory in accordance with embodiments described herein may be present, embodiments of memory discussed herein are not limited to this specific environment. For example, memory in accordance with embodiments discussed herein may be used in vehicles, internet appliances, wireless local area network (LAN) hardware, switches, network interface devices, audio players, flash storage cards, televisions, cameras, video recorders, etc.

Figure 2:
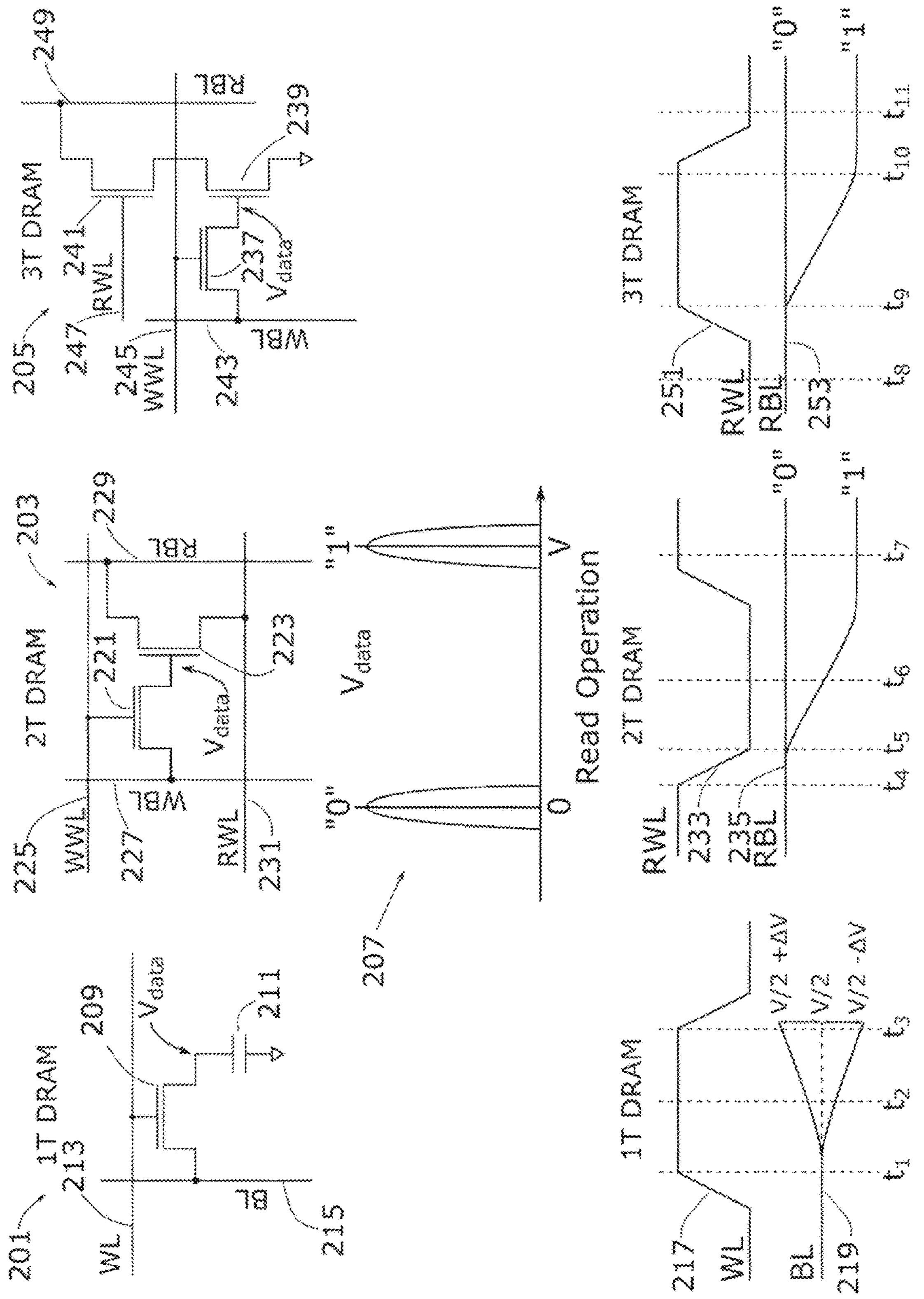
FIG. 2 shows, in partial block diagram form, DRAM memory cells and characteristics associated with each type of DRAM memory cell.

Turning now to FIG. 2, features of various memory in accordance with various embodiments of memory described herein are discussed. Where the memory described herein may be used, for example, in IC 102, memory 104 or storage device 106 are discussed. In particular, block diagrams 201, 203, and 205 illustrate a one transistor (1T) DRAM cell, a two transistor (2T) DRAM cell, and a three transistor (3T) DRAM cell, respectively. In each memory cell, a value $V_{data}$ is stored in a storage node either as a logical 0 ("0") or a logical 1 ("1"). Values for $V_{data}$ are shown in graph 207.

The 1T DRAM memory cell 201, comprises a transistor 209 connected in series with a capacitor 211. A gate terminal of the transistor 209 is connected to a word line (WL) 213, while a source or drain terminal of the transistor 209 is connected to the bit line (BL) 215.

The 1T DRAM memory cell 201 stores data $V_{data}$ at a storage node between the transistor 209 and capacitor 211. During operation, BL 215 is charged to a level V/2 and during a read operation, the voltage of the BL 215 will change by delta V (i.e., ΔV). That is, during a read operation, the voltage of BL 215 will either increase or decrease relative to V/2 by an amount ΔV, indicating the logical value stored in the memory cell. Characteristics of WL 213, and the BL 215 of the 1T DRAM memory cell 201 during a read operation are illustrated by line graphs 217 and 219.

In particular, line graph 217 illustrates voltage values of the WL 213 during a read operation, and line graph 219 illustrates voltage values of the BL 219 during the same read operation. At time $t_1$, the voltage level of the word line 213 increases. After a time delay, at a subsequent time $t_2$, the voltage level of the BL 219 begins to either increase or decrease, depending on the logical value stored in the memory cell. At time $t_3$, the voltage value of BL 315 reaches a threshold voltage value sufficient to be processed and interpreted as a logical "0" or "1".

A 2T DRAM memory cell 203 comprises two transistors 221 and 223 where a drain terminal of transistor 221 is connected to the gate terminal of the transistor 223. $V_{data}$ is also stored at a storage node comprising a connection between transistor 221 and transistor 223. A write word line 225 is connected to the gate terminal of transistor 221, while a write bit line 227 is connected to the source terminal of transistor 221. The source and drain terminals of transistor 223 are connected to read bit line 229 and read word line 231.

Of note, the source and drain terminals in any NMOS transistor discussed herein are interchangeable. Accordingly, if one example describes a configuration identifying a source and drain terminal, embodiments in which the source and drain terminal designations are switched are also contemplated. Furthermore, embodiments described herein are in accordance with implementations using NMOS transistors. Implementations using PMOS transistors are also contemplated and descriptions complementary to those provided herein as also contemplated.

Depicted in line graph 233, the voltage levels on read word line 231 during a read operation are shown and corresponding voltage level on read bit line 229 are shown in line graph 235. Initially, at time $t_4$, the voltage levels of the read word line 231 and read bit line 229 are "high", or some value above 0V.

In relation to voltages present at the terminals of a transistor, a "high" value may correspond to a logical "1" value. A "high" value may correspond to a "VDD" voltage value. A "low" value as referenced herein, may correspond to a voltage value that introduces a potential difference between a "high" value sufficient to keep a transistor off. The "high" value may be present at a drain terminal, while the "low" value is present at the source terminal of a transistor. In one example, the "low" value may be any voltage value that is lower than the "high" value by a threshold voltage amount, where the threshold voltage defines the minimum potential difference (voltage) needed between two terminals to keep a transistor off. Thus, a "low" value is not necessarily zero, although it may be zero in some embodiments.

Continuing the discussion of line graph 233, subsequent to time $t_4$, during a read operation, the read word line voltage level is dropped below the initial "high" value. At time $t_5$, the read word line voltage level reaches a "low" level. After a time delay and subsequent to time $t_5$, the read bit line voltage level may remain unchanged (stay "high") or begin changing to a "low" level (time $t_6$) depending on the value of $V_{data}$. Whether or not the read bit line voltage level stays the same or shifts indicates the value of $V_{data}$ stored in the memory cell. At time $t_7$, the read word line voltage level is returned to the initial "high" level.

A 3T DRAM memory cell 205 comprises three transistors 237, 239, and 241. Two transistors 239 and 241 are connected in series while a drain terminal of transistor 237 is connected to a gate terminal of transistor 239. $V_{data}$ is stored at the node where the drain terminal of transistor 237 is connected to the gate terminal of transistor 239. A source terminal of transistor 237 is connected to a write bit line 243, while a write word line 245 is connected to a gate terminal of transistor 237. A read word line 247 is connected to a gate terminal of transistor 241, while a drain terminal of transistor 241 is connected to a read bit line 249.

Depicted in line graph 251, the voltage levels on read word line 247 during a read operation are shown and corresponding voltage levels on read bit line 253 are shown in line graph 253. Initially at time $t_8$, the read word line voltage level starts out "low" while the read bit line voltage level starts out "high." During a read operation at time $t_9$, the voltage level on read word line 251 is increased. Subsequently after a time delay, at time $t_{10}$, depending on the value stored as $V_{data}$, the voltage level of read bit line 249 will remain unchanged or drop. At time $t_{11}$, the voltage level on the read word line 247 is returned to a "low" level.

As illustrated in line graphs 219, 235, and 253, changes in voltages on the read bit lines are gradual and occur after a time delay. The rate of change of the voltage may vary based on characteristics of a transistor and an amount of voltage on the gate terminal. Additionally, the amount of voltage on the gate terminal also correlates to the amount of current that will flow through the transistor.

Figure 3:
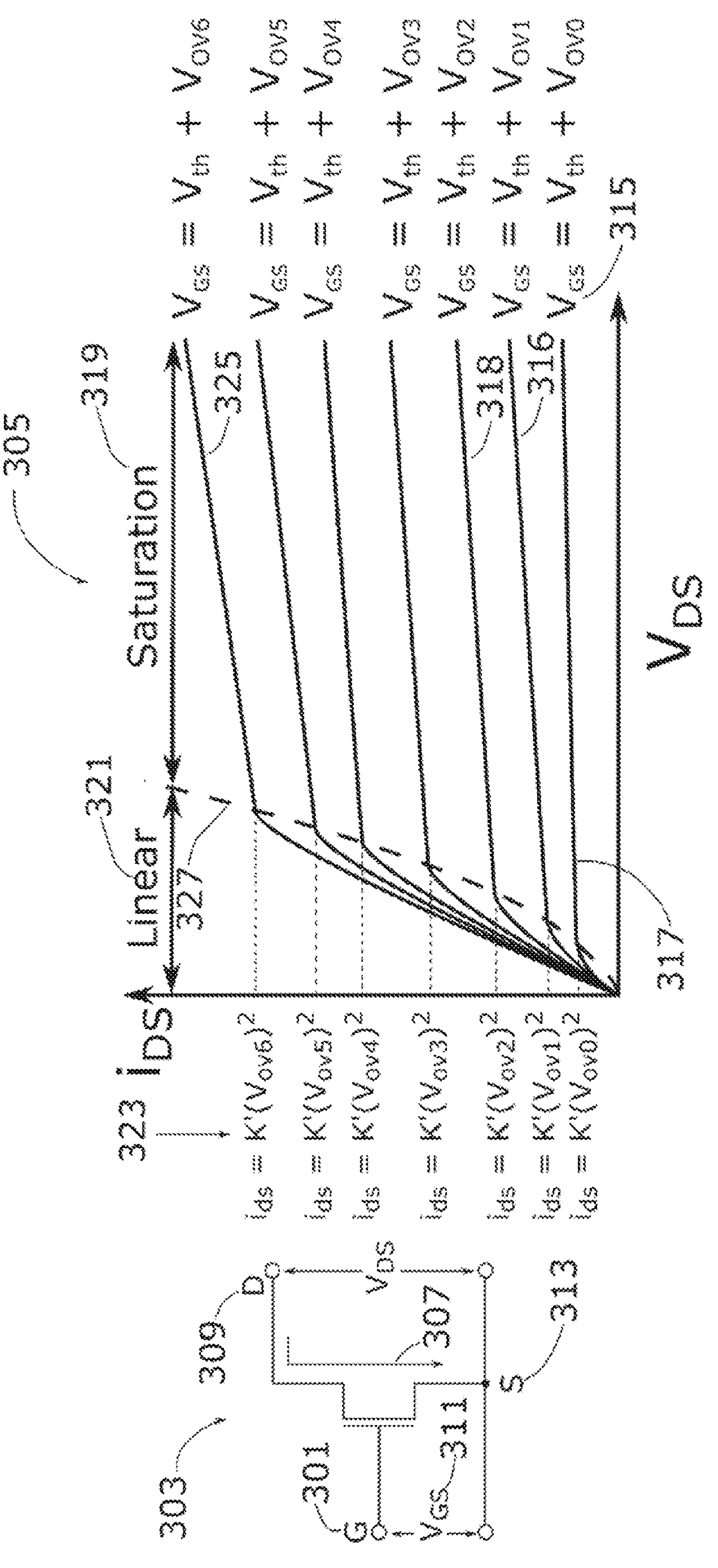
FIG. 3 shows an example graph depicting a relationship between current and voltage in a transistor.

Turning now to FIG. 3, current voltage characteristics of a transistor as well as a block diagram of a transistor are described. Current flow shown in transistor 303 is shown using conventional flow notation, as opposed to electron flow notation. In particular, the amount of voltage applied at a gate terminal 301 of transistor 303 may determine the amount of current 305 flowing through the transistor. The following characteristics as discussed in graph 305 of transistor 303 may be used to store multiple values in a single memory cell as described herein.

In the various configurations of a DRAM memory cell, discussed in FIG. 2, a read bit line (e.g., 215, 229, 249) is connected to a drain or source terminal of a transistor. Transistor 303 may represent any of the transistors 209, 223, and 241, where a read bit line is connected to a drain terminal 309. When a sufficient gate voltage 311 is applied to gate terminal 301, to turn on transistor 303, current 307 begins to flow from the drain terminal 309 to the source terminal 313.

As mentioned previously, the source and drain terminals of a typical negative-channel metal-oxide (transistor 303, are interchangeable. The source and drain terminals may be referred to as conduction electrodes. Given a sufficient voltage such as a voltage amount greater than a threshold voltage amount is applied at gate terminal 301, current will flow between the conduction electrodes based on whether one conduction electrode is at a lower potential in relation to the other conduction electrode. In an example scenario where sufficient voltage is applied to gate terminal 301, if no potential difference is present between the conduction electrodes, current will not flow between the conduction electrodes.

In application, a source or drain designation assigned to a respective conduction electrode may reflect a given state of the transistor and the direction of current flow between two conduction electrodes. In some scenarios, the drain terminal is at a higher potential than the source terminal. However, the source and drain designations assigned within this document are not meant to imply a direction of current flow for a given example described herein. To ease discussion, in the examples discussed herein, one conduction electrode of a transistor has been labeled a drain terminal and the other terminal labeled a source terminal. For a given example where respective conduction electrodes have been designated as source and drain, embodiments where the source and drain designations are switched from what is described herein, are contemplated as well.

Continuing the discussion of transistor 303, as a read bit line (e.g., 215, 229, or 249) is connected to a drain or source terminal, the current flowing between the drain and source terminals of a transistor (e.g., transistor 209, 223, 239, 241) may correspond to a bit line discharging. The amount of voltage 311 applied at a gate terminal of a transistor with respect to a source terminal or the amount of voltage 311 applied at a source terminal of a transistor with respect to a gate terminal may also determine the amount of time taken and the rate of discharge, of a bit line for example. For example, in a 1T or 3T DRAM cell, a voltage is applied at a gate terminal with respect to a source terminal. In a 2T DRAM cell, voltage is applied at a source terminal with respect to a gate terminal. Accordingly, based on a measured time delay for a bit line to discharge, the multiple values may be measured and detected.

In graph 305, the x-axis represents voltage values across the source and drain terminals (313 and 309, respectively) of transistor 303, while the y-axis represents an amount of current 307 flowing between the source and drain terminals (313 and 309). In graph 305, the different $V_{GS}$ curves (e.g., 317, 316, 318, and 325), represent different voltage amounts $V_{GS}$ applied at gate terminal 301 and corresponding current ($i_{DS}$) and voltage ($V_{DS}$) characteristics for each $V_{GS}$.

As shown by the different Vas curves, different voltage amounts applied to gate terminal 301 may determine an amount of current flowing through transistor 303 and an amount of voltage measured across the source and drain terminals (313 and 309). For example $V_{GS}$ curve 317 depicts the amount of current that may flow through transistor 303, for a particular $V_{GS}$ level 315 and as the voltage across the source and drain terminals is increased ($V_{DS}$).

Each $V_{GS}$ voltage level is set above the threshold voltage ($V_{th}$) by an amount defined as the overdrive voltage (e.g., $V_{OV1}$), where $V_{OV6}$ represents an amount greater than $V_{OV0}$. Accordingly, the $V_{GS}$ level equaling the threshold voltage plus $V_{OV6}$ is greater than the $V_{GS}$ level equaling the threshold voltage plus $V_{OV0}$. For a given $V_{GS}$ level, the amount of current flowing through the transistor 303 increases as $V_{DS}$ is increased initially (linear region of operation 321).

After some value of $V_{DS}$ is reached, for each $V_{GS}$ curve, additional increases in $V_{DS}$ do not substantially impact the current ($i_{DS}$) flowing through transistor 303 and the transistor is considered to be operating in a saturation region of operation 319. Changes in $V_{DS}$ have more influence on the current flowing through transistor 303 in the linear region of operation 321. For each $V_{GS}$ curve, the transition between modes of operation from the linear region of operation 321 to the saturation region of operation 319 is marked by dashed line 327.

As shown in graph 305, $i_{DS}$ is a function of the overdrive voltage ($V_{OV}$), which is the amount by which the gate-to-source voltage ($V_{GS}$) exceeds the threshold voltage ($V_{th}$). In particular, as shown in column 323, taking curve 317 as an example:

$$i_{DS} = K'(V_{OV0})^2 \qquad (1)$$

where K' is a parameter further representing technology and device parameter constants of the transistor, more specifically:

$$K' = \mu_n C_{ox}(W/L) \qquad (2)$$

where $\mu_n$ represents surface mobility, $C_{ox}$ represents gate oxide capacitance per unit area, W is a width of the transistor, and L represents a length of the transistor.

Based on the $V_{GS}$ value applied at the gate terminal 311, transistor 303 may behave differently and according to the various $V_{GS}$ curves (i.e., curves 316, 317, 318, and 325) shown in graph 305. Thus, transistor 303 may operate as a variable resistor, where the amount and rate of change of $i_{DS}$ (in the linear region of operation 321) is different for each curve. In particular, during a given read operation, where a read bit line is connected to a source or drain of transistor 303, the value of the gate voltage ($V_{GS}$) dictates the $i_{DS}$ vs. $V_{DS}$ curve that is representative of the amount of $i_{DS}$ flowing through transistor 303. The value of the gate voltage ($V_{GS}$) may determine the rate at which a read line may discharge. In various embodiments, a measure of the time taken to discharge a read bit line may be used to determine a particular voltage or value that is stored in a memory cell.

Figure 4:
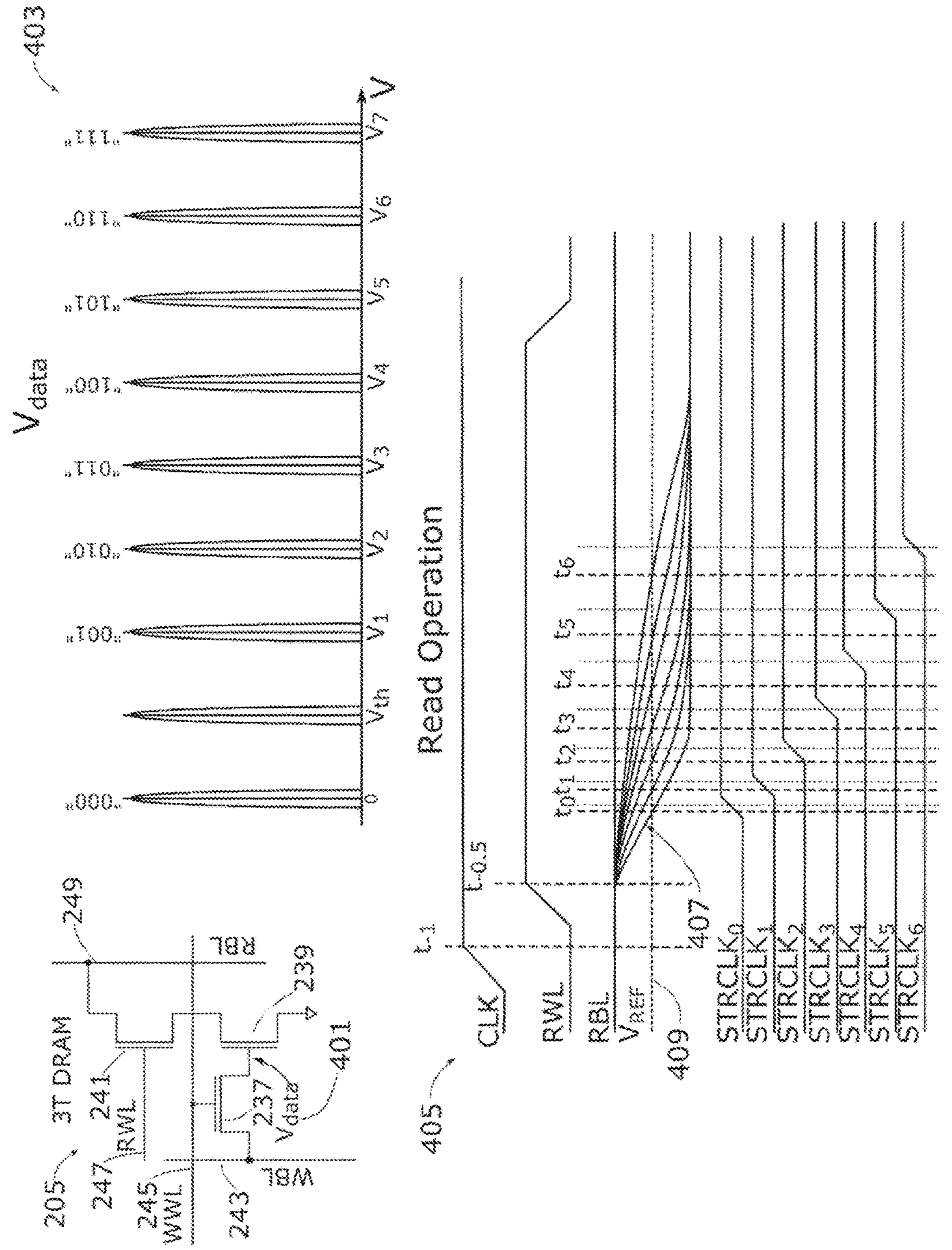
FIG. 4 shows a DRAM memory cell and a corresponding read operation in accordance with at least some embodiments.

Turning now to FIG. 4, a memory cell in accordance with various embodiments is discussed. The rate at which a voltage change occurs may be used to discern the value stored within the memory cell. The memory cell may include a data node where data values (i.e., $V_{data}$) are stored, and a three transistor (3T) DRAM cell 205 including at least one of: a first transistor 237, a second transistor 239, and a third transistor 241. The memory cell may further include a write port for writing data to be stored in the memory cell. The memory cell may further include a read port having a variable impedance that varies in accordance with a data value stored therein. In an embodiment, the data value is one of at least three different data values that the memory cell is capable of storing. In an embodiment, the second transistor 239 and third transistor 241 are coupled in series between the read port and a fixed reference. In an embodiment, the first transistor 237 is coupled between the write port 243 and the data node 401.

In an embodiment, the write port 243 is coupled with a write bit line 243. In an embodiment, the read port is coupled with a read bit line 249. In an embodiment, the write bit line 243 and the read bit line 249 are orthogonal to each other.

Taking the three transistor (3T) DRAM cell 205 as an example, a method for storing multiple values in the memory cell is described.

In this example, eight logical values 0-7 for $V_{data}$,represented in binary nomenclature in graph 403 may be programmed into the 3T DRAM cell 205. In graph 403, a voltage value is represented along the x-axis. Each logical value is stored as a different voltage value.

For example, the logical value "0" may be stored as a voltage value around zero volts, the logical value "1" may be stored approximately as a voltage value "$V_1$". The logical value "2" may be stored approximately as voltage value "$V_2$" where the value of "$V_2$" is higher than "$V_1$", and the remaining logical values may be programmed accordingly where successive logical values are programmed as increasingly larger voltage values.

During operation of the 3T DRAM cell 205, the voltage value representing each logical value may not be exactly zero or "$V_1$", "$V_2$", etc. Instead, the voltage value may be within some voltage value above or below the targeted voltage values of zero, "$V_1$", "$V_2$", for example. Accordingly, voltage values that may register as a particular logical value are represented as an individual bell curve in graph 403. Each bell curve captures a potential distribution of voltage values that may correspond to a respective logical value.

The manner in which the voltage values are assigned to represent different logical values is not limited to this example and other assigning schemes may be used. That is, the assignment scheme between a voltage value and a corresponding logical value is discussed for the purpose of illustrating an embodiment and is not meant to be limiting of the type of assigning scheme that may be used. For example, the logical value "0" may be stored as a voltage value "0" while the logical value "7" is stored as a voltage value "$V_7$". Graph 403 captures one example way in which different voltage values may be used to represent different logical values. Additionally, any assigning scheme discussed in the document is considered an example and shall not constitute a limiting example.

During a read operation of the 3T DRAM cell 205, at time $t_{-1}$, a clock may go high, as represented in line graph 405. Next at time $t_{-0.5}$, the read word line (RWL) goes high. Subsequently, the amount of $i_{DS}$ flowing through transistor 239 and the rate of change of $i_{DS}$ depends on the voltage value of $V_{data}$ 401. Finally, a strobe clock of a plurality of strobe clocks may go high in response to a voltage level of a bit line falling below a threshold voltage level $V_{REF}$ 409.

The manner and rate at which the bit line discharges depends on the voltage value of $V_{data}$ 401, where $V_{data}$ 401 is stored at a storage node. Recall the different $V_{GS}$ curves shown in graph 305 for different values of $V_{GS}$. The higher voltage value of $V_{GS}$ (curve 325) would correspond to a faster discharge rate of the bit line than a lower voltage value of $V_{GS}$, such as curve 317. That is, if a voltage value of "$V_7$" is stored as $V_{data}$, (in this example "$V_7$" may follow the curve represented by curve 325 in graph 305), the discharge may occur at time $t_0$ (407). As "$V_7$" may follow the curve 325 (graph 305), the discharge may occur sooner than the other $V_{GS}$ curves in graph 305.

In detecting a bit line discharge, the bit line is considered sufficiently discharged after it has reached a predetermined threshold amount such as a voltage level equal to $V_{REF}$ 409. Various circuitry may be used to assess the voltage level of the bit line and make a determination as to whether the bit line has sufficiently discharged. For example, a voltage comparator may be utilized to compare the bit line to a reference voltage, such as a reference voltage provided by a bandgap reference circuit, or other reference voltage. In another example, a "skewed" inverter having a higher than usual trip point may be utilized. Such a skewed inverter may be implemented by sizing the PMOS transistor to be stronger than the NMOS transistor.

In some embodiments, a strobe clock may be programmed to fire during a predefined time window, where an indicator is captured during the predefined time window. The indicator may be produced by the various circuitry used to assess the voltage level of the bit line. In some embodiments, the various circuitry may comprise a comparator, circuitry capable of capturing a voltage level of the bit line, etc. Thus the indicator may comprise various forms. For example, the indicator may be a value output by the comparator, or the value may reflect the voltage value of the bit line. Overall, the indicator contains data that may be used to determine whether a voltage level of the bit line has fallen below a predetermined threshold amount.

In one example, the strobe clock denoted $STRCLK_0$ captures an indicator at a predefined time window or time interval around time $t_0$. In the example shown in graph 405, a plurality of strobe clocks may be set to fire at or around different predefined time windows. For example, in graph 405, up to seven strobe clocks may be set to fire at different predefined time windows or time intervals. Based on the strobe clock that captures an indicator with data that the bit line has fallen below the predetermined threshold voltage value during a read operation, a determination may be made as to the voltage value of $V_{data}$ 401, and in turn correlated to a logical value.

In this example with seven strobe clocks, the earliest strobe clock of the seven that captures the indicator with data that the bit line has fallen below the predetermined threshold may be used to determine the logical value. In some embodiments, a subset of the plurality of strobe clocks may be set to fire. Thus not all seven strobe clocks may fire during a given read operation.

In another example, if a voltage value of "$V_7$" is stored in $V_{data}$ 401, $STRCLK_0$ is set to fire (e.g., switch to a high state) in a time window spanning from prior to time $t_0$ and in between time $t_0$ and time $t_1$. Since $V_{data}$ 401 stores a voltage value of "$V_7$", the voltage value of the bit line will have fallen below $V_{REF}$ 409. Thus, the indicator captured by $STRCLK_0$ will reflect that the bit line has fallen below $V_{REF}$ 409.

In another example, if $V_{data}$ is a voltage value of "$V_6$" with a voltage level lower than the voltage value of "$V_7$", the "$V_6$" voltage level may take longer to discharge the bit line than if "$V_7$" were stored as $V_{data}$. Accordingly, the bit line may discharge around time $t_1$ subsequent to time $t_0$.

In this example, $STRCLK_0$ will fire (e.g., switch to a high state) in the time window spanning from prior to time $t_0$ and in between time $t_0$ and time $t_1$. However, the indicator captured by $STRCLK_0$ will reflect that the bit line has not fallen below $V_{REF}$ 409. $STRCLK_1$ will fire (e.g., switch to a high state) in the time window spanning from prior to time $t_1$ and in between time $t_1$ and time $t_2$. As the voltage value of RBL 249 will fall below $V_{REF}$ 409 around the time $STRCLK_1$ is set to fire, when $STRCLK_1$ fires, the indicator captured when $STRCLK_1$ fires will reflect that the bit line has fallen below $V_{REF}$ 409.

Overall, the lower the voltage level of a stored $V_{data}$, the longer it may take a bit line to discharge. Accordingly, in the example provided in FIG. 4, $V_{data}$ 401 with a voltage level of "$V_7$" will experience a bit line that is sufficiently discharged, or a bit line that has reached a voltage level of $V_{REF}$ 409, around time $t_0$. $V_{data}$ 401 with a voltage level of "$V_6$" will experience a bit line that is sufficiently discharged, or a bit line that has reached a voltage level of $V_{REF}$ around time $t_1$. $V_{data}$ 401 with a voltage level of "$V_5$" will experience a bit line that is sufficiently discharged, or a bit line that has reached a voltage level of $V_{REF}$ 409 around time $t_2$. $V_{data}$ 401 with a voltage level of "$V_4$" will experience a bit line that is sufficiently discharged, or a bit line that has reached a voltage level of $V_{REF}$ 409 around time $t_3$, so on and so forth. For the case where $V_{data}$ 401 is equal to zero volts, the read bit line will continue to stay high. Accordingly, a read bit line that continues to stay high for a set time quantity may indicate that $V_{data}$ 401 is equal to zero volts.

As briefly mentioned previously, in order to detect the span of time taken by the bit line to sufficiently discharge, or has reached a voltage level of $V_{REF}$ 409, a plurality of strobe clocks may be coupled to the bit line. Each of the plurality of strobe clocks is set to fire at different time windows and cause surrounding circuitry to strobe the bit line or a comparator connected to the bit line to determine whether sufficient discharge has occurred. Upon detecting that a bit line voltage has fallen below the predetermined voltage level ($V_{REF}$ 409), the corresponding strobe clock may dictate the time window within which an indicator is captured. Based on the specific strobe clock that captures an indicator reflecting that the bit line has fallen below a predetermined threshold amount, surrounding circuitry may determine the span of time the bit line has taken to discharge to the voltage amount of $V_{REF}$ 409.

Whether or not sufficient discharge has occurred may be determined by any known method in art. For example, a determination may be made that sufficient discharge has occurred by checking a state of a comparator connected to read bit line 249. The voltage level of the read bit line 249 may be compared to a predetermined threshold amount such as $V_{REF}$ 409 voltage to assess whether read bit line 249 has discharged a sufficient amount.

Based on a length of time taken for a bit line to discharge sufficiently, surrounding circuitry may determine the voltage value of $V_{data}$ stored in the memory cell, which in turn is correlated to a logical value. In the situation where $V_{data}$ is equal to zero volts, the surrounding circuitry may determine $V_{data}$ is zero volts after detecting the bit line remains high for a time quantity that is greater than a predetermined threshold amount of time. The concept of correlating a time window for discharge to a voltage value and in turn a logical value may be applied to other types of memory cells such as a 2T or 1T DRAM cell.

Figure 5:
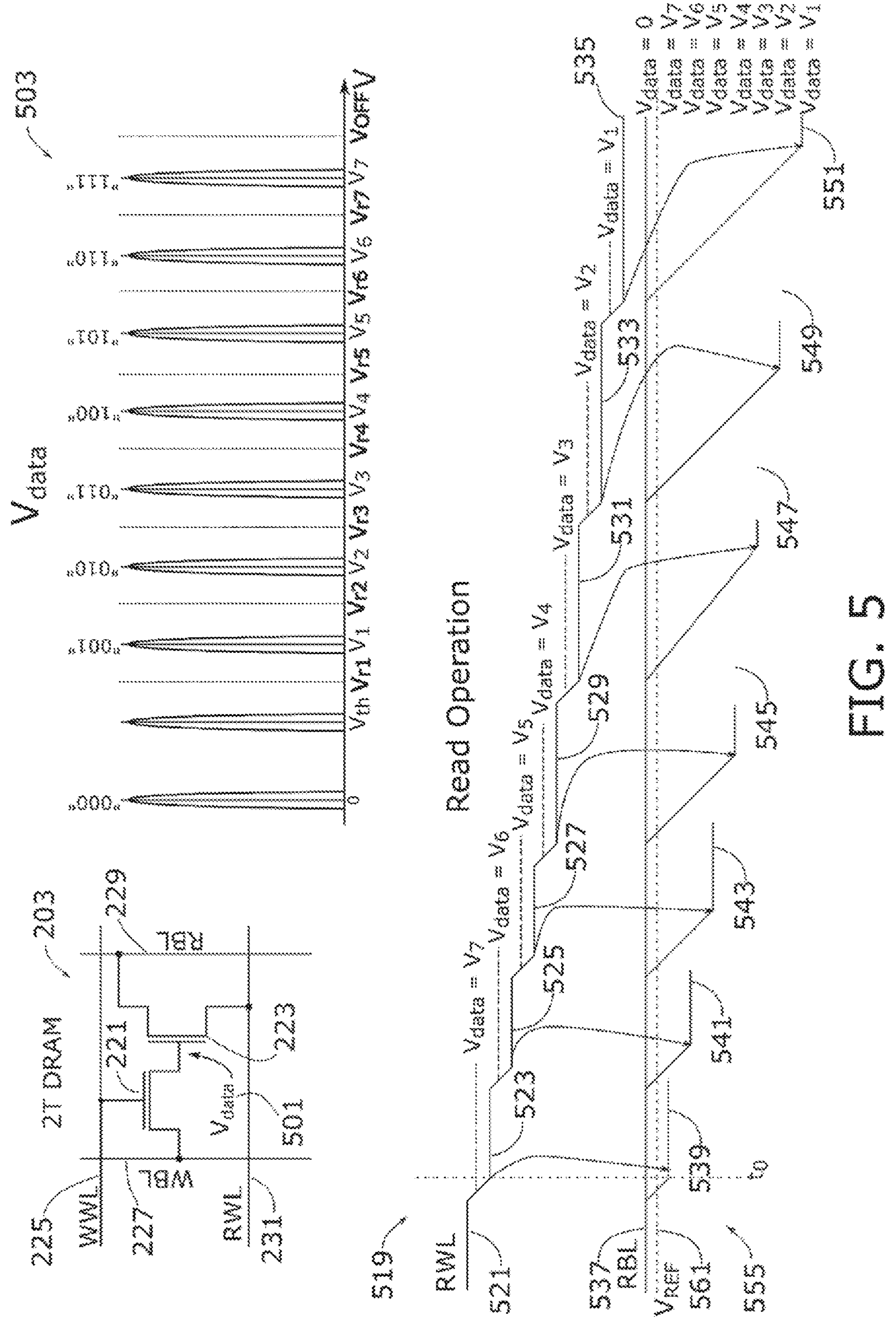
FIG. 5 shows a memory cell and a corresponding read operation in accordance with at least some embodiments.

Turning now to FIG. 5, a two transistor (2T) DRAM cell capable of storing multiple values is described. As described previously, a 2T DRAM cell 203 comprises transistors 221 and 223, where a drain terminal of transistor 221 is connected to the gate terminal of transistor 223. The gate terminal of transistor 221 is connected to a write word line WWL 225, while a source terminal of transistor 221 is connected to write bit line WBL 227. The drain terminal of transistor 223 is connected to read bit line 229, while the source terminal of the transistor 223 is connected to read word line 231. The labeling of the source and drain terminals continues to be for the ease of discussion of this example; these terminals are interchangeable. $V_{data}$ 501 is stored at a storage node comprising a connection between transistor 221 and transistor 223.

During operation of the 2T DRAM cell 203, RBL 229 and RWL 231 are precharged to a high voltage value, for example VDD. To understand the mechanism of detecting the logical value stored in the 2T DRAM cell 203, note that both the source and drain terminals for transistor 223 are at the same level, and charge will not flow between terminals even when transistor 223 is turned on, for example by a voltage applied to the gate terminal ($V_{data}>0$). Creating a difference in voltage between the gate and source terminals of transistor 223 causes current to flow through transistor 223 given a sufficient voltage or $V_{data}$ 501 voltage value is present between the gate terminal and the source terminal of transistor 223.

This characteristic may be utilized to read the voltage value of $V_{data}$ stored in a storage node in memory cell 203. In one embodiment, a difference in voltage between the RBL 229 and RWL 231 is incrementally created to determine the voltage value of $V_{data}$ 501. That is, the voltage value of RWL 231 may be incrementally reduced and the increment during which RBL 229 is sufficiently discharged may be correlated to a stored voltage value of $V_{data}$ 501, which in turn may correspond to a respective logical value.

The incrementally reduced voltage at RWL 231 increases the voltage between the gate terminal and source terminal of the transistor 223. Depending on the $V_{data}$ 501 voltage stored at the gate terminal of the transistor 223, the transistor 223 may turn ON when the RWL 231 is incrementally reduced to be lower than the threshold voltage of the transistor 223 with respect to the $V_{data}$ 501 at the gate terminal of the transistor 223.

Similar to the 3T DRAM cell, 2T DRAM cell 203 may store different values of $V_{data}$ 501, where $V_{data}$ 501 may be zero volts, "$V_1$", "$V_2$", . . . "$V_7$". The different voltage levels that may be programmed as $V_{data}$ 501 in memory cell 203, may each represent logical values 0-7, represented in binary nomenclature in graph 503. For example, $V_{data}$ 501 having a voltage value around zero volts may correspond to the logical value "0", $V_{data}$ 501 having a voltage value around "$V_1$" may correspond to the logical value "1", $V_{data}$ 501 having a voltage value around "$V_2$" may correspond to the logical value "2", etc.

Similar to operation of the 3T DRAM cell, during operation of the 2T DRAM cell 203, the voltage values representing each logical value are target voltage values, where actual voltage values that may be interpreted as corresponding logical values, comprise a spread of voltage value greater than and less than a given target voltage value. Accordingly, graph 503 illustrates voltage values that may register as a particular logical value as a bell curve that captures a potential distribution of voltage values that may correspond to a respective logical value.

During a read operation of the 2T DRAM cell 203, the voltage of RWL 231 may be incrementally lowered, as shown in graph 519. In graph 519, the x-axis represents time, while the y-axis represents voltage values. As RWL 231 is initially charged high, the voltage of RWL 231 may be at level 521, and subsequently, the voltage of RWL 231 may be lowered to level 523. The voltage of RWL 231, continues to be lowered incrementally at certain time increments, to levels 525, 527, 529, 531, 533, and 535.

For a given voltage value of $V_{data}$ 501, corresponding to voltage at the gate terminal of transistor 223, once the voltage difference between $V_{data}$ 501 stored at the gate terminal and RWL 231 surpasses the threshold voltage amount or a voltage amount sufficient to turn on transistor 223, RBL 229 may begin discharging. Further, given a sufficient amount of voltage difference is present between RBL 229 and RWL 231, the rate at which RBL 229 discharges and whether or not RBL 229 discharges at all depends on the voltage value of $V_{data}$ 501. For example, a higher $V_{data}$ voltage level will result in RBL 229 discharging for a higher voltage at RWL 231 (i.e., a smaller decremental voltage value 539, 541, 543, etc.) than will a lower $V_{data}$ voltage level.

Furthermore, the voltage level to which RBL 229 discharges will depend on the voltage level of RWL 231. For example, in the case where RBL 229 discharges after the voltage level of RWL 231 is lowered a single time $t_0$ level 523, the voltage level of RBL 229 will lower until it equals the voltage level of RWL 231. Thus, in graphs 519 and 555, the voltage levels 523 and 539 are about the same.

Graphs 519 and 555 demonstrate example voltage levels of RWL 231 and RBL 229 respectively during a read operation of the 2T DRAM cell 203. Line 521 represents a voltage level of RWL 231 during a read operation, while line 537 describes a voltage level of RBL 229. Further, the dashed line 561 in graph 537 represents a predetermined voltage level, such as $V_{REF}$, used to determine whether RBL 537 has discharged sufficiently.

In various embodiments, the different voltage levels 523, 525, 527, 529, 531, 533, and 535 of RWL 231 may be referred to as steps. The number of times the voltage level of RWL 231 has been stepped down before a RBL 229 begins to discharge may be assessed to determine the value of $V_{data}$ 501.

In an example, where $V_{data}$ 501 stores a voltage value of "$V_7$", where "$V_7$" is a higher voltage value than "$V_6$", "$V_5$", "$V_4$", "$V_3$", "$V_2$", and "$V_1$", RBL 229 may begin to discharge after the voltage level of RWL 231 is lowered to level 523. Accordingly, by time $t_0$, the voltage level of RBL 229 may discharge to voltage level 539. Recall voltage level 539 of RBL 229 will be around voltage level 523 of RWL 231, as when RBL 229 begins to discharge, it will continue discharging until the voltage level of RBL 229 has reached about the same voltage level of RWL 231.

In an example where $V_{data}$ 501 stores a voltage value of "$V_6$", where "$V_6$" is a lower voltage value than "$V_7$", RBL 537 may not discharge after the first step down in the voltage level of RWL 231. As "$V_6$" is a lower voltage value than "$V_7$", a greater difference in voltage between the gate and drain terminals may be needed before transistor 223 begins conducting (i.e., RBL 229 begins discharging). Accordingly, as shown in graphs 519 and 537, RBL 229 may begin discharging after the second step down (level 525) of voltage on RWL 231.

In an example where $V_{data}$ 501 stores a voltage value of zero volts, RBL 229 will not discharge. That is, when RWL 231 is at voltage level 535 the voltage between the gate and source terminal of the transistor is less than the threshold voltage required for turning transistor 223 ON.

In some embodiments, the number of times the voltage level of RWL is stepped down may be translated into the voltage value stored as $V_{data}$ 501, which is further correlated to a logical value corresponding to the voltage value of $V_{data}$ 501. For example, if RBL 229 begins discharging when RWL 231 is at voltage level 527 (the third step), surrounding circuitry, such as a counter, may store data reflecting that the voltage level of RWL 231 has been stepped down three times. This data that the level has been lowered three times may be correlated to $V_{data}$ storing a voltage value of "$V_5$", and subsequently converted to logical value "101".

Although an example using a counter has been described to assess how many times the voltage level of RWL 231 has been lowered, a counter is not the only method that may be used to assess this information. Other methods may be used. For example, the voltage levels may be measured where each voltage level corresponds to a particular step and a comparator may be used to determine which step RWL 231 is at. Similar to the example discussed with regards to the 3T DRAM cell 205, a clock and strobing technique may be used to assess the voltage value of $V_{data}$ 501.

The number of times the voltage level of RWL 231 is stepped down (or up in some situations) may be a preset number of times. If RBL 229 does not discharge during the preset number of times RWL 231 is stepped down, a conclusion may be made that $V_{data}$ 501 is storing a voltage value of zero. More generally speaking, the preset number of times may be determined by the possible number of values that may be stored as $V_{data}$ 501.

In one embodiment, the preset number of times may be one less than the possible number of values that may be stored as $V_{data}$ 501. For example, the 2T DRAM cell 203 may be programmed to store a possible number of values "n" as $V_{data}$ 501. Accordingly, a preset number of times may be equal to "n−1". If RBL 229 does not begin to discharge during the present number of times "n−1" that RWL 231 is stepped down, a conclusion may be made that $V_{data}$ 501 is storing a last possible value stored in $V_{data}$ 501 without introducing any additional voltage steps on RWL 231.

Another embodiment is envisioned in which the 2T DRAM cell 203 is one of a plurality of 2T DRAM cells. The plurality of 2T DRAM cells may comprise a row of memory. If a read operation reads a single memory cell and not the remaining cells in the row, as the voltage value of RWL is stepped down in the memory cell of interest, the voltage values of WWL in the surrounding cells may also be stepped down to deter $V_{data}$ voltage values in the other cells from discharging through a bit line. In other words, in an unselected memory cell on unselected row, the selected RBL node, as its voltage decreases, can act as a source terminal for the unselected 2T DRAM cell, while the unselected RWL at VDD can act as a drain terminal for the unselected 2T DRAM cell.

Figure 6:
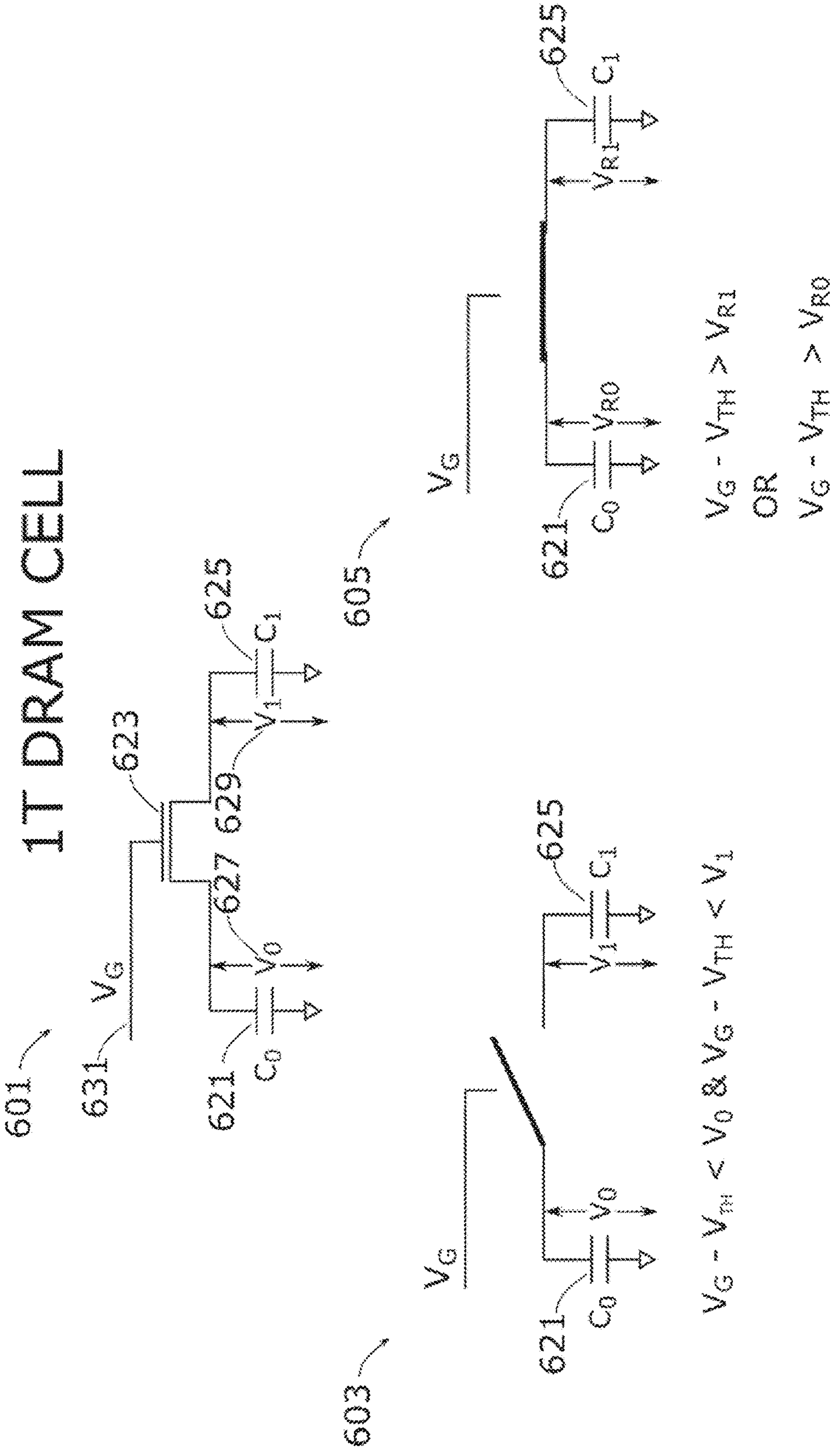
FIG. 6 shows diagrams of circuits demonstrating charge sharing.

Turning now to FIG. 6, a concept of charge sharing is described. This concept applies to the description of a one transistor (1T) DRAM cell, as described in FIG. 7. Block diagram 601 illustrates a transistor 623 with a gate terminal 631, and source and drain terminals connected to capacitors 621 and 625, respectively. Gate terminal 631 has a voltage value of $V_G$. Capacitor 621 holds a charge and respective voltage amount $V_0$, while capacitor 625 holds a charge and respective voltage amount $V_1$.

Transistor 623 is off when the $V_0$ voltage and the $V_1$ voltage are both greater than $V_G - V_{th}$, where Vin is a threshold voltage for transistor 623 (block diagram 603). Transistor 601 may turn on when either the source or drain terminals (conduction electrodes) is lower than the gate terminal (control electrode) by a threshold voltage amount (block diagram 605). Recall, a potential difference between the conduction electrodes is also present in the case where current is flowing between the conduction electrodes. Once the voltage difference between the gate electrode and both conduction electrodes no longer exceeds the threshold voltage of the transistor, the transistor will turn off (i.e., will no longer conduct).

Figure 7:
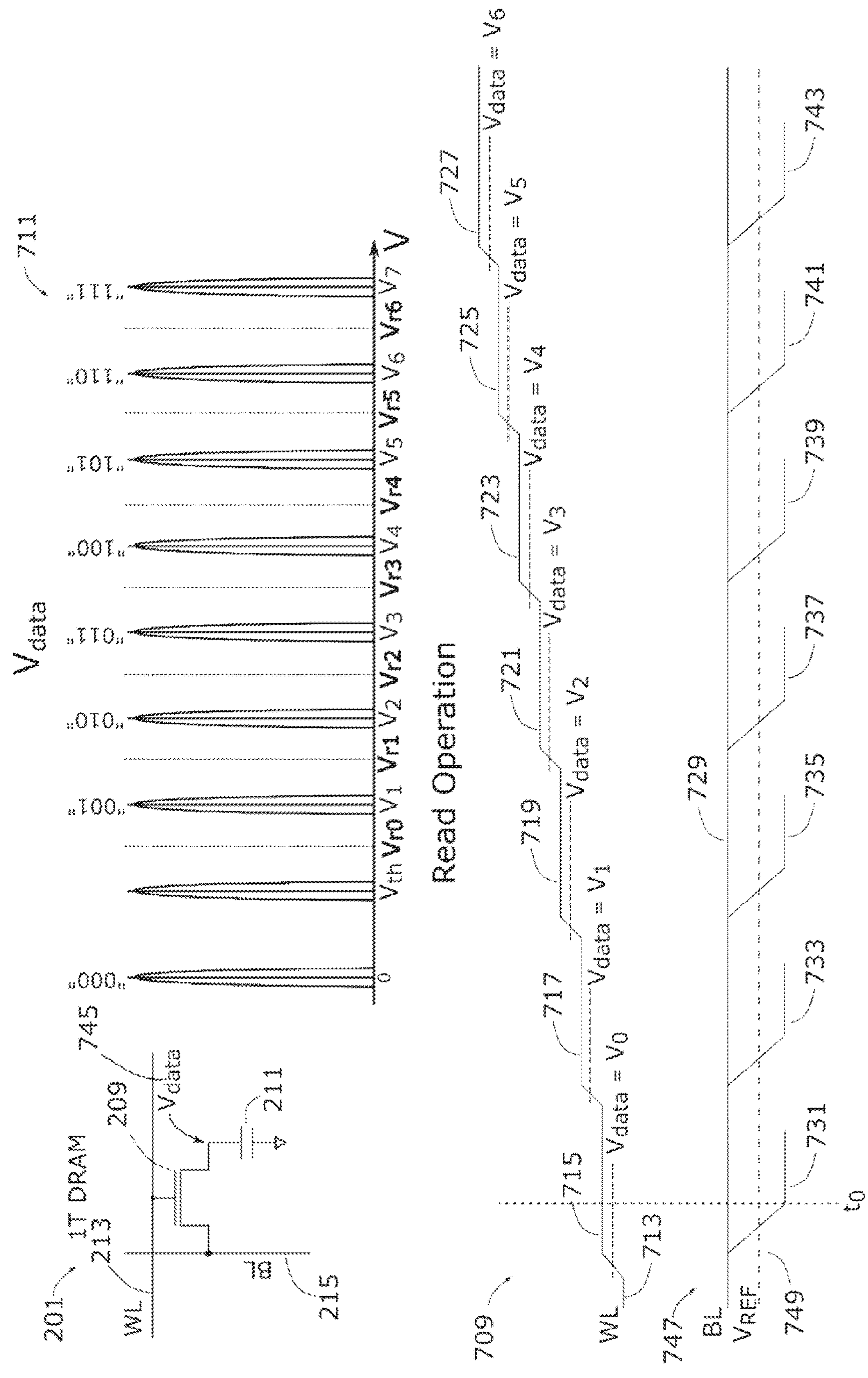
FIG. 7 shows a memory cell and a corresponding read operation in accordance with at least some embodiments.

Turning now to FIG. 7, a 1T DRAM cell capable of storing multiple values is described. As described previously, a 1T DRAM cell 201 comprises a transistor 201 and capacitor 211. The gate terminal of transistor 209 is connected to word line (WL) 213 while a source or drain terminal of transistor 209 is connected to bit line (BL) 215. The source or drain terminal not connected to BL 215 is connected to capacitor 211, and $V_{data}$ is stored at the storage node comprising the connection between transistor 209 and capacitor 211.

In this example, eight logical values 0-7 for $V_{data}$ are represented in binary nomenclature in graph 711. These eight logical values may be programmed into the 1T DRAM cell 201 as a respective voltage value represented along the x-axis. As shown in graph 711, each logical value is stored as a different voltage value.

For example, the logical value "0" may be stored as a voltage value around zero volts, the logical value "1" may be stored approximately as a voltage value "$V_1$". The logical value "2" may be stored approximately as voltage value "$V_2$" where the value of "$V_2$" is higher than zero volts, and "$V_1$" and the remaining logical values may be programmed accordingly where successive logical values are programmed as increasingly larger voltage values.

During operation of the 1T DRAM cell 201, the voltage value representing each logical value may not be exactly zero or "$V_1$", "$V_2$", etc. Instead, the voltage value may be within some voltage value above or below the targeted voltage values of zero, "$V_1$", "$V_2$", for example. Accordingly, voltage values that may register as a particular logical value are represented as an individual bell curve in graph 711. Each bell curve captures a potential distribution of voltage values that may correspond to a respective logical value. The manner in which the voltage values are assigned to represent different logical values is not limited to this example and other assigning schemes may be used.

During a read operation of the 1T DRAM cell 201, BL 215 is charged high while WL 213 is low. The voltage value of WL 213 is incrementally stepped up to determine the voltage value of $V_{data}$ 745. BL 215 will discharge (toward ground through transistor 209 and capacitor 211) when WL 213 sufficiently turns on transistor 209 as shown in graphs 709 and 747. In graph 709, example voltage values during a read operation of WL 213 are shown, where voltage values increase as the y-value increases. In graph 747, possible voltage values during a read operation of BL 215 are shown, where voltage values increase as the y-value increases.

In a 1T DRAM cell 201, charge sharing applies between BL 215 and capacitor 211. Accordingly, as the voltage value of WL 213 is incrementally stepped up to a respective voltage that is a predetermined amount higher than each possible voltage value of $V_{data}$ 745, when the voltage value of $V_{data}$ 745 is first exceeded by the voltage of the WL 213 (less a threshold voltage), the BL 215 will initially discharge to around the same voltage value irrespective of the $V_{data}$ 745 voltage, since the same amount of charge is initially coupled from the cell 201 into the BL 215 (at which point the access transistor 209 turns off). Accordingly, the different scenarios in which BL 215 discharges are represented by voltage values that level off at around the same initial value (e.g., voltages 731, 733, 735, etc.). Further the dashed line 749 in graph 747 represents a predetermined voltage level, such as $V_{REF}$, used to determine whether BL 215 has discharged sufficiently. After the access transistor 209 is first turned on, and as the WL 213 is incremented to even higher voltages, additional charge is coupled from the memory cell 201 into the BL 215, and the voltage of the BL 215 decreases further (e.g., see FIG. 13).

Similar to a read operation of the 2T DRAM cell 203, during a read operation of the 1T DRAM cell 201, the voltage of WL 213 is incrementally stepped. Instead of being lowered, however, the voltage value of WL 213 may be incrementally increased. The different voltage levels 713, 715, 717, 719, 721, 723, 725, and 727 of WL 213 may be referred to as steps. The number of times the voltage level of WL 213 has been stepped up before BL 215 begins to discharge may be assessed to determine the value of $V_{data}$ 745.

In an example, where $V_{data}$ 745 stores a voltage value of zero volts, BL 215 may begin to discharge after the voltage level of WL 713 is increased to level 715. The potential difference between the source and drain terminals of transistor 209 may be greatest when $V_{data}$ 745 stores zero volts, and thus a small increase in the voltage level of WL 213 may be sufficient to turn on transistor 209 as the source terminal of transistor 209 is at zero voltage and gate terminal connected to WL 213 is at a potential higher than the threshold voltage required to turn ON the transistor 209. Accordingly, when $V_{data}$ 745 stores zero volts, by time $t_o$, the voltage level of BL 215 may discharge to voltage level 731.

The voltage level of WL 213 at step 715 may be greater than the voltage value of $V_{data}$ 745 by at least a threshold voltage amount. To demonstrate this difference, the various possible voltage values of $V_{data}$ 745 in relation to voltage level of WL 213 is shown in graph 709.

In an example where $V_{data}$ 745 stores a voltage value of "$V_1$", BL 215 may begin to discharge after the voltage level of WL 213 is incrementally stepped to the second level 717. Each successive voltage value that may be stored as $V_{data}$ 745 may be detected with successive steps in the voltage level of WL 213. In an example where $V_{data}$ 745 stores a voltage value of "$V_7$", BL 215 may not discharge during the incremental changes in the voltage level of WL 213. In this example, if BL 215 does not begin discharging after seven incremental increases in the voltage level of WL 213, surrounding circuitry may conclude that $V_{data}$ 745 is storing a voltage level "$V_7$".

The number of times the voltage level of WL 213 is stepped up may be translated to a voltage value stored as $V_{data}$ 745, which is further correlated to a logical value corresponding to the voltage value of $V_{data}$ 745. For example, if BL 215 begins discharging when WL 213 is at voltage level 721 (the fourth step), surrounding circuitry, such as a counter, may store data reflecting that the voltage level of WL 213 has been stepped up four times. The data that the level has been stepped up four times may be correlated to $V_{data}$ storing a voltage value of "$V_3$", and subsequently converted to logical value "011".

Although an example using a counter has been described to assess how many times the voltage level of WL 213 has been stepped up, a counter is not the only method that may be used to assess this information. Other methods may be used. For example, the voltage levels may be measured where each voltage level corresponds to a particular step and a comparator may be used to determine which step WL 213 is at. Similar to the example discussed with regards to the 3T DRAM cell 205, a clock and strobing technique may be used to assess the voltage value of $V_{data}$ 745.

Similar to a read operation of the 2T DRAM cell 203, the number of times the voltage level of WL 213 is stepped up or down may be a preset number of times. If BL 215 does not discharge during the preset number of times WL 213 is stepped up or down, a conclusion may be made that the $V_{data}$ 745 is storing a last possible value.

For example, the 1T DRAM memory cell 201 may be programmed to store a possible number of values "n" as $V_{data}$ 745. After stepping through a preset number of times, n−1, without detecting BL 215 beginning to discharge, a conclusion may be drawn that the data stored in $V_{data}$ 745 is the last possible value, without introducing any additional voltage steps on WL 213. Avoiding stepping up to one more voltage level helps save power.

Figure 8:
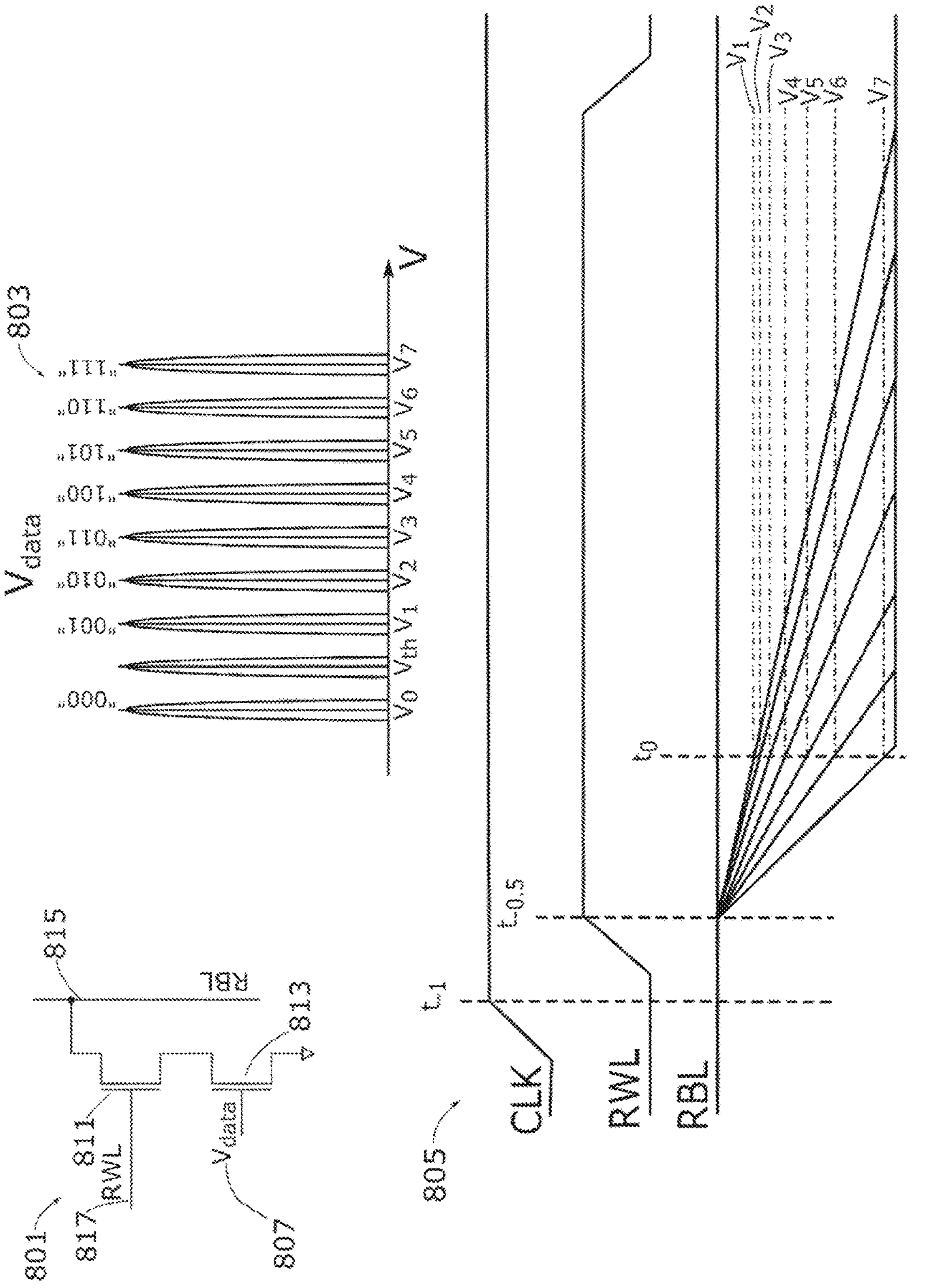
FIG. 8 shows a circuit configuration and a corresponding read operation in accordance with at least some embodiments.

Turning now to FIG. 8, a block diagram illustrates an example circuit configuration that may utilize the embodiments discussed herein. Diagram 801 comprises two transistors 811 and 813 connected in series, where a source or drain terminal of transistor 811 is coupled to a read bit line (RBL) 815. The gate terminal of transistor 811 is coupled to read word line (RWL) 817. $V_{data}$ 807 is stored on a storage node comprising the gate terminal of transistor 813.

A circuit configuration such as shown in diagram 801 may be found in various circuits, such as the 3T DRAM memory cell (FIG. 2, transistors 241 and 239). To determine the voltage value of $V_{data}$ 807, in accordance with various embodiments, RWL 817 may be precharged to a high value.

$V_{data}$ 807 may represent more than two possible logical values, where the logical values are stored as different voltage values. Graph 803 demonstrates one example correlation between different voltage values that may be stored as $V_{data}$ 807, and logical values corresponding to respective voltage values.

The voltage value may be determined using any method previously described, including strobing or implementing voltage steps. Another method for determining the voltage value of $V_{data}$ may check a voltage level of RBL 815 at a predetermined time interval and correlate the voltage level of RBL 815 during the predetermined time interval to a logical value represented by $V_{data}$.

Graph 805 illustrates the voltage levels of a clock (CLK), RWL 817, and RBL 815, during a method performed in accordance with this embodiment. At time $t_{-1}$, a clock may go high, subsequently, at time $t_{-0.5}$, RWL 817 goes high. Due to the semiconductor device physics explained previously (FIG. 3), RBL 815 will begin to discharge at different rates based on the voltage value of $V_{data}$ 807.

Thus, at a predetermined time interval, such as at time $t_0$, the voltage level of RBL 815 will be at different levels based on the voltage value of $V_{data}$ 807. The possible discharge curves of RBL 815 is shown in graph 805. The predetermined time interval may be set at such a location where a greater difference between the possible voltage curves is present. Accordingly, a measured voltage value may more clearly be identified and more accurately identified.

The measured voltage value of RBL 815 during a time interval to may be measured as an analog value that is subsequently converted to a digital value. The digital value may then be correlated to a corresponding logical value.

Figure 9:
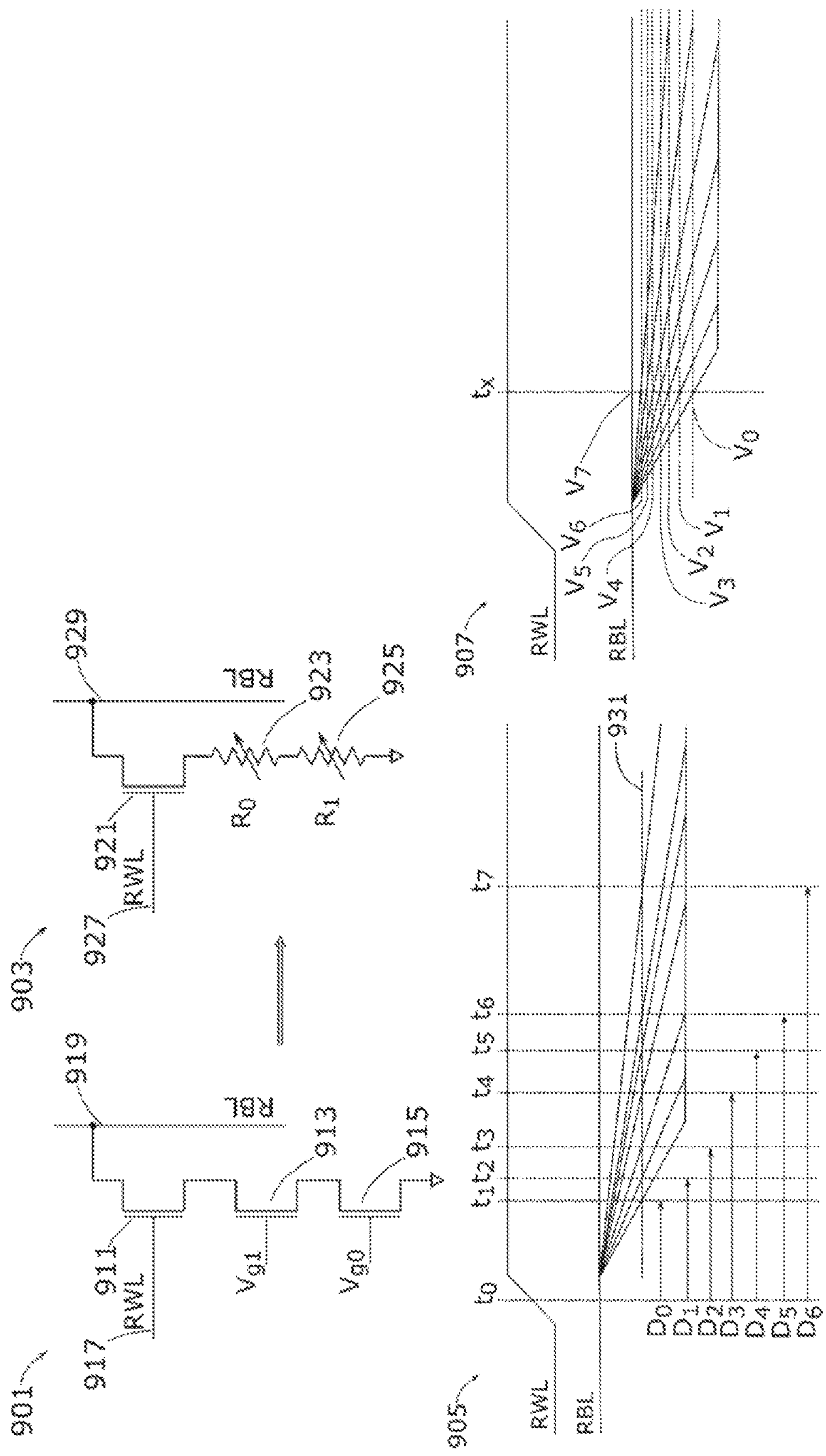
FIG. 9 shows a circuit configuration and a corresponding read operation in accordance with at least some embodiments.

Turning now to FIG. 9, a block diagram illustrates another example of a circuit configuration that may utilize the embodiments discussed herein. Diagram 901 comprises three transistors 911, 913, and 915, connected in series. A source or drain terminal of transistor 911 may be connected to read bit line (RBL) 919. Each gate terminal of transistor 913, and 915 may store a voltage value (e.g., $V_{g1}$ and $V_{g0}$) at a storage node.

Graph 905 demonstrates yet another method of reading the voltage values stored as $V_{g1}$ and $V_{g0}$. Of note, the determined voltage value would correspond to the sum of voltage values $V_{g1}$ and $V_{g0}$. Based on a voltage value stored (e.g., $V_{g1}$ and $V_{g0}$), the transistors 913 and 915 will conduct more or less.

Any method discussed may be used to determine the sum of the voltage value stored (e.g., strobing, measuring the voltage level at a given time). In FIG. 9, a time $t_0$ discharge method is shown that correlates a measured delay time $t_0$ a voltage value. The time delay may be defined as the time interval between a time $t_0$, which may correspond to a clock going high, and when RBL 919 has reached a predetermined threshold level 931. In graph 905, delay times are labeled $D_0$, $D_1$, $D_2$, $D_3$, $D_4$, $D_5$, and $D_6$. The time delay will vary based on the voltage values of $V_{g1}$ and $V_{g2}$.

Diagram 903 is a circuit diagram that is equivalent to diagram 901. Essentially, transistors 913 and 915 connected in series may be viewed as acting in a manner similar to variable resistors 923 and 925 connected in series. Where the total time to discharge of RBL 929 is equivalent to the product of the circuit resistance and the circuit capacitance.

$$RC \text{ time constant} = (R_0 + R_1) \times C_{BL} \tag{3}$$

Where $R_0$ and $R_1$ represent a variable resistance and $C_{BL}$ represents a capacitance of RBL 929. For different values of $R_0$ and $R_1$, the RC time constant value varies which changes the time delay for discharging. In equation 3, above, the resistance value of transistor 921 is considered to be so much smaller than resistances $R_0$ and $R_1$ that the resistance of transistor 921 is negligible. Thus the resistance value of transistor 921 is not included in the RC time constant calculation. In embodiments where the resistance value of transistor 921 is larger so as not to be negligible, the resistance value may also be included as an offset in the RC time constant calculation.

The output of RBL 919 in diagram 901 may be coupled to an inverter which is subsequently coupled to a time $t_0$ discharge converter (examples of which are described hereinbelow). Accordingly, the delay time may be measured and the sum of voltages stored at the gate terminals of transistors 913 and 915 may be determined.

In graph 907 a method of determining a stored voltage value discussed previously is illustrated. In graph 907, the voltage value of RBL 929 is measured at time $t_x$. Given the different rates of discharge of RBL 929, based on the value of the variable resistors, a determination may be made of the resistance values based on the measured voltage value at time $t_x$.

In diagrams 901 and 903, the final sum may result from a large variety of combinations of values stored in the plurality of transistors. For example, several combinations of resistance values $R_0$ and $R_1$ may result in the same sum. The RC delay is the linear combination of all the variable resistors in series. Further, for a given fixed capacitance the total time delay is the linear combination of the resistance in series. Further, if respective resistance values represent logarithmic values then the time delay correlates to the summation of the logarithmic values. This is one example in which product terms may be obtained, discussed further in regards to FIG. 10.

The circuits shown in diagrams 901 and 903 may comprise building blocks for circuits that perform matrix operations of matrix arithmetic. For example, the described methods to determine the sum of the voltages stored at the gates of the transistors connected in series may be used to add numerical values, where the values of $V_{g1}$ and $V_{g0}$ represent numerical values. Additional operations may be performed, for example, $V_{g0}$ and $V_{g1}$ may represent logarithmic values log(a) and log(b). That is, $$V_{g0} = \log(x) \text{ and } V_{g1} = \log(y) \tag{4A}$$

Accordingly, the measured sum of $V_{g0}$ and $V_{g1}$ may represent the log of the product of x and y. Thus, these circuits may be useful for numerous operations. For example, these circuits may be used to perform Cartesian addition, vector addition and to solve for a Cartesian product. Additionally, circuits shown in block diagrams 901 and 903 may be biased to perform similar to translinear circuit operations. Transistors are biased in the weak inversion region, a region within which transistors demonstrate exponential current voltage characteristics. Thus the transistors biased in the weak inversion region can perform log-log operation.

Figure 10:
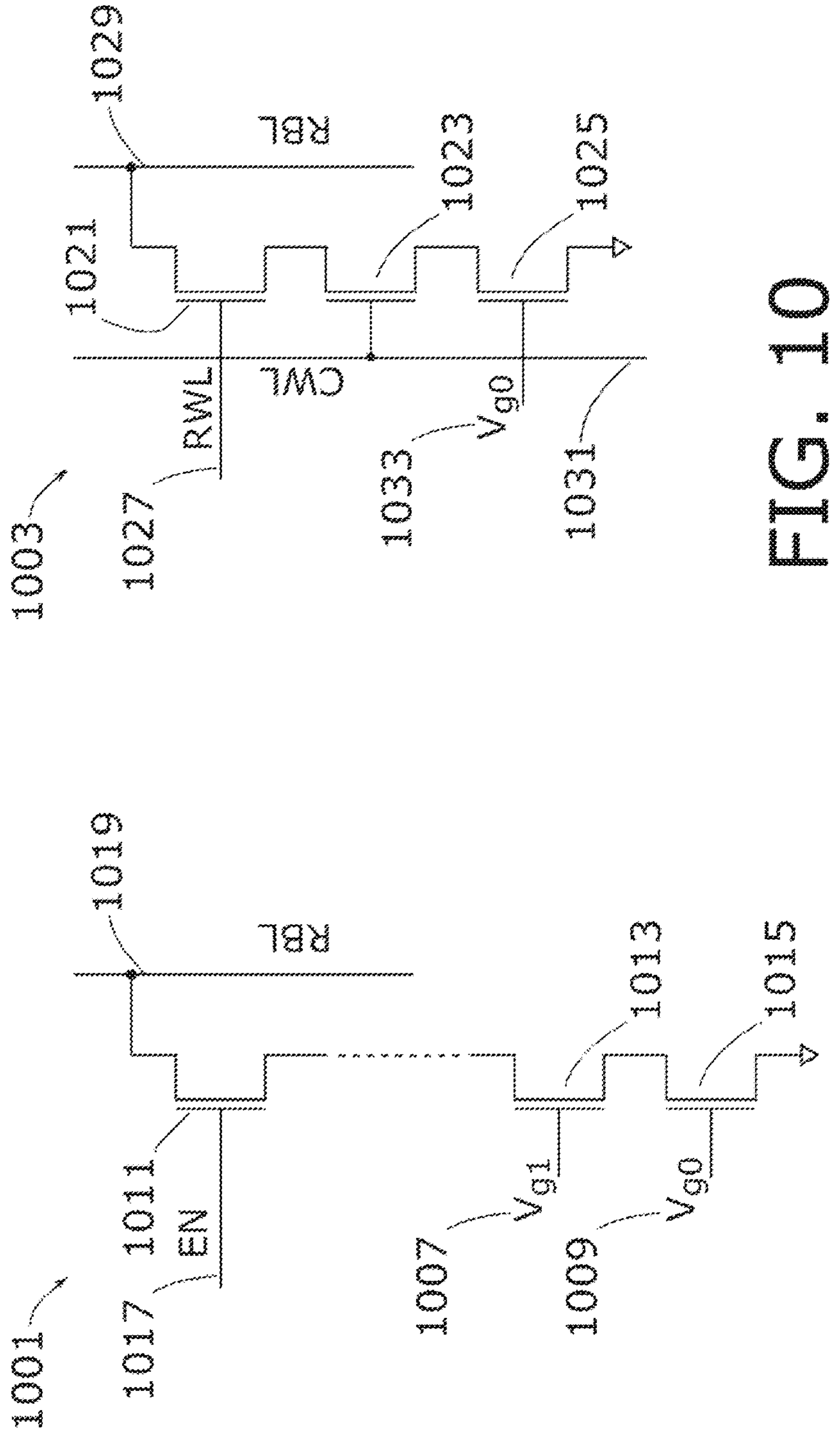
FIG. 10 shows a circuit configuration in accordance with at least some embodiments.

Turning now to FIG. 10, various embodiments discussed herein are shown in a configuration that may be used for digital domain signal processing. In particular, in block diagram 1001, a plurality of transistors 1011, . . . , 1013, and 1015 are connected in series. Although three transistors are shown connected in series, diagram 1001 may have more transistors connected in series than the three shown. In some embodiments, block diagram 1001 may include negative-AND-type (NAND-type) non-volatile memory comprising a plurality of transistors connected in series.

The gate terminal of transistor 1011 is coupled to enable line 1017 (WL in previous descriptions) that receives an enable signal. The gate terminals of transistors 1013 and 1015 are respectively coupled to wires transmitting signals 1007 ($V_{g1}$) and 1009 ($V_{g0}$) in the form of voltages. In various embodiments, signals 1007 and 1009 may originate from a storage node or a signal that is controlled. Through various means known in the art, the voltage values of signals 1007 and 1009 may be controlled.

Using read operation methods described herein, the sum of the voltage values stored at each gate of the plurality of transistors 1007 and 1009 may be read through RBL 1019. For example, measuring a time delay for RBL 1019 to discharge (time $t_o$ discharge), incrementally stepping up the voltage on enable line 1017, or determining a voltage level of RBL 1019 at a certain predetermined time are some read operation methods in accordance with embodiments disclosed herein. The sum of the voltage values stored at each of the gate terminals of the plurality of transistors may be used to perform multiplication or addition (of the voltage values stored at the gate terminals).

In various embodiments, a signal received at a respective gate terminal of a transistor of the plurality of transistors (e.g., transistors 1013 or 1015), may be set to be at least greater than a threshold voltage of that transistor. Accordingly, during a read operation, values from all the transistors in the plurality of transistors may be read out, as all the transistors will be turned “on” at some point during the read operation. In other cases, the signal received at a respective gate terminal of a transistor may be below the threshold voltage.

Continuing the discussion of FIG. 10, block diagram 1003 demonstrates a portion of circuitry such as memory, where the circuitry comprises a plurality of transistors arranged in rows and columns. Using read operation methods described herein, a Cartesian product operation may be performed using the rows and columns in a memory.

In diagram 1003, a plurality of transistors 1021, 1023, and 1025 are connected in series. An enable line 1027 is coupled to the gate terminal of transistor 1021. Additionally, a column word line (CWL) 1035 is coupled to the gate terminal of transistor 1023. Transistor 1023 may be coupled to other transistors in parallel, referred to as a column. CWL 1035 may be configured such that a particular column (e.g., comprising transistor 1023 and other transistors connected in parallel to each other and transistor 1023) may be read. Accordingly, a row and a column may be picked to perform a Cartesian product operation.

Using read operation methods described herein, a sum of voltage values may be read, where each voltage value is present at respective gate terminals of a row of transistors connected in series. Additionally, a sum of voltage values may be read, where each voltage value is present at respective gate terminals of a column of transistors connected in parallel. The voltage values may represent numerical values, or the voltage values may represent logarithmic values.

In general, logarithms, including natural logarithms, map multiplication into addition. The logarithm function is a group isomorphism from positive real numbers under multiplication to the group of real numbers under addition, represented as a function. That is:

$$\log(a)+\log(b)=\log(ab) \tag{4B}$$

Thus in the case where voltage values represent logarithmic values, a summation of these logarithmic values may be indirectly mapped to a product of the numerical values. That is, once the voltage values representing logarithmic values are summed, either using time delay method for RBL to reach a predetermined value or voltage value of RBL at predetermined time, the product of the numerical value can be inferred instead of logical value. Accordingly, extra circuits needed for an antilogarithmic step may be bypassed. Since, for a given set of n numerical values, there are a finite number of unique sums resulting from an addition operation or unique product resulting from a multiplication operation.

The sums output from block diagram 1003 may be subsequently summed up by a circuit such as block diagram 1001, where each sum read out of block diagram 1003 is sent as a voltage signal (e.g., signals 1007 and 1009) to a respective gate terminal of transistors connected in series. Accordingly, using read techniques described herein and as described in diagram 1001, a final sum may be determined. This use of diagram 1003 in conjunction with diagram 1001 may enable capability for performing matrix calculations, linear algebra operations, etc.

In various embodiments, diagrams 1001 and 1003 may be used for signal mixing purposes. For example, diagrams 1001 and 1003 may be used for additive mixing purposes. Signal mixing may be used for various communication purposes. Additionally, block diagram 1003 may be used to detect a difference in phase of two signals.

Figure 11:
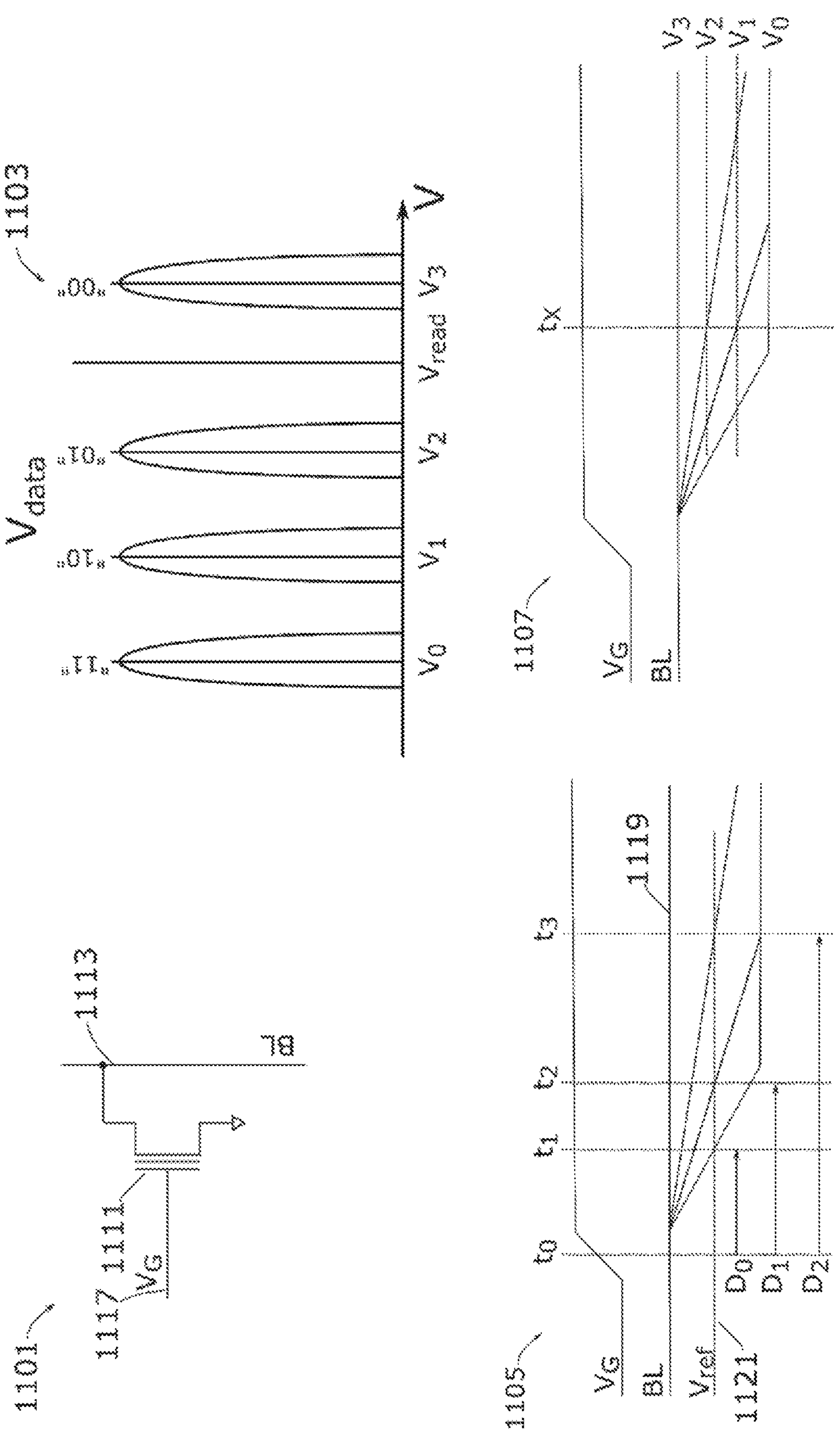
FIG. 11 shows a memory cell and a corresponding read operation in accordance with at least some embodiments.

Turning now to FIG. 11, an embodiment comprising NOR type non-volatile flash memory is shown in block diagram 1101. In block diagram 1101, a single flash memory cell is shown comprising floating gate 1111, a gate terminal connected to line 1117, and a source or drain terminal connected to BL 1113.

Using the read operation concepts described herein, a single read operation may determine the value of the voltage programmed into the floating gate 1111. In one example captured in graph 1103, four voltage values "$V_0$", "$V_1$", "$V_2$", and "$V_3$", may be stored in flash memory cell (block diagram 1101). Voltage values "$V_0$", "$V_1$", "$V_2$", and "$V_3$" may correspond to different logical values represented in binary format in graph 1103.

To determine which voltage value is stored in the flash memory cell, a single "$V_{read}$" voltage value may be set to a value between voltage value "$V_2$" and voltage value "$V_3$". Using concepts described previously, a delay time for BL 1113 to discharge may be used, or a measurement of the voltage value of BL 1113 at a predetermined time may be used to determine which voltage value of the four is stored in the flash memory cell.

Distinguished From Flash Memory Read Operation in the Prior Art

This method varies from read operations of flash memory in the prior art, in several different ways. For read operations conducted in the prior art, three different "$V_{read}$" levels may be implemented to read the voltage value stored in the flash memory cell. Additionally, for a read operation at a particular "$V_{read}$" level, the data collected corresponds to whether BL 1113 has discharged.

The embodiments described herein do not simply look for whether BL 1113 has discharged over the course of three separate read attempts using three particular "$V_{read}$" values. Instead, a single "$V_{read}$" value can be used to determine the value stored in the flash memory cell. Additionally, delay times for the bit line to discharge may be assessed instead of simply assessing whether the bit line has discharged. In another embodiment, the voltage value of the bit line is assessed instead of simply assessing whether the bit line has discharged.

Further, embodiments discussed herein may read an effective value and not an individual value as would be the case for flash memory in the prior art. Additionally, embodiments discussed herein do not perform sequential reads by applying a sequence of voltages on a word line as is the case for flash memory in prior art. Instead, in embodiments discussed herein, one voltage value is applied to the word line to read the $V_{data}$ stored in the memory cell.

Returning to the discussion of FIG. 11, graph 1105 demonstrates possible voltage levels of BL 1113 using a delay time $t_0$ discharge technique as previously described. Recall, depending on the voltage stored in floating gate 1111, BL 1113 will discharge at different rates. Accordingly, the time delay for BL 1113 to discharge may be corresponded to one of the possible stored logical values.

In the example captured in graph 1105, a strobing clock may determine how long it takes for a bit line to reach a specified voltage level such a $V_{ref}$ by determining the time period taken to reach $V_{ref}$. Delays $D_0$, $D_1$, and $D_2$ may correspond to respective voltage levels "$V_0$", "$V_1$", and "$V_2$". If a comparator detects BL 1113 has reached $V_{ref}$ within time delay "$D_1$", surrounding circuitry may determine that a "$V_1$" voltage value is stored in the flash memory cell. If BL 1113 fails to discharge within one of the predetermined time delays, a conclusion may be drawn that a voltage value "$V_0$" is stored in the flash memory cell.

Graph 1107 demonstrates possible measurements taken using a measured voltage value of BL 1113 during a predetermined time window. As the rate of discharge will vary based on the voltage value stored in floating gate 1111, the voltage level of BL 1113 will be different at a given time. In the example captured in graph 1107, the voltage level of BL 1113 is measured at time $t_x$.

Figure 12:
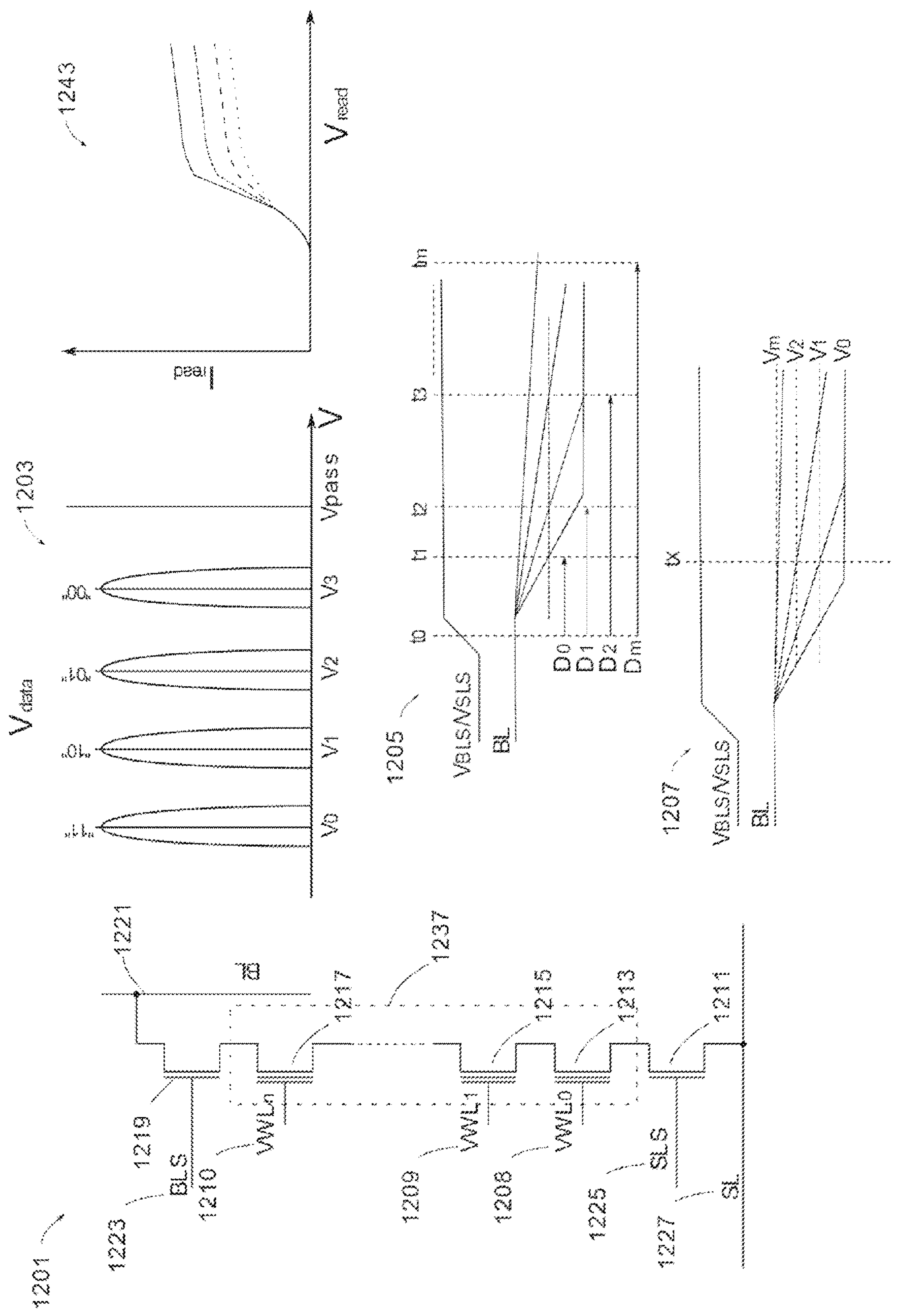
FIG. 12 shows a plurality of memory cells in a NAND arrangement and a corresponding read operation in accordance with at least some embodiments.

Turning now to FIG. 12, methods of reading a block of flash memory cells are described using read operations described herein. In circuit diagram 1201, a plurality of flash memory cells 1219, 1217, 1215, 1213, and 1211 are connected in series, to create a block of flash memory cells 1237. The block 1237 may comprise an "N" word line, where N represents the number of flash memories in block 1237. One end of block 1237 is connected in series to a transistor 1219, while the other end of block 1237 is connected in series to a transistor 1211.

Further, the gate terminal of transistor 1219 is connected to bit line select BLS line 1223, while the gate terminal of transistor 1211 is connected to source line select SLS line 1225. A source or drain terminal of transistor 1219 is connected to a bit line (BL) 1221, whereas a remaining source or drain terminal (terminal not connected to BL 1221) is connected to block 1237. A source or drain terminal of transistor 1211 is connected to a source line SL line 1227, whereas a remaining source or drain terminal (terminal not connected to SL 1227) is connected to block 1237.

In a scenario where data in a single flash memory cell is read, the plurality of flash memory cells except the memory cell being read is kept in a $V_{pass}$ state. A flash memory cell put in a $V_{pass}$ state has a gate voltage amount set to "$V_{pass}$", which ensures the flash memory cell remains on. Thus, where the plurality of transistors totals "N", "N−1" number of flash memory cells are kept in a $V_{pass}$ state, so that the value of interest in the memory cell being read may be stepped through the plurality of flash memory cells in block 1237. Logical data that may be stored as $V_{data}$ is shown in graph 1203.

Using read operation techniques described herein, based on a detected rate of discharge or time $t_0$ discharge of bit line (BL) 1221 the sum of gate voltages stored in block 1237 may be determined. In one embodiment, all the flash memory cells may be put into a "$V_{pass}$" state. Using read operation techniques described herein, a total sum of the resistance of block 1237 may be determined.

In one example the read current (I) for block 1237 may be defined as:

$$I = V_{BL}/(n*R_{ON}) \tag{5}$$

where $V_{BL}$ is the voltage of the bit line, n represents a number of transistors in series whose gate terminal voltage is at $V_{pass}$, and $R_{ON}$ represents the resistance of the flash memory cell when conducting current. For the flash memory cells in block 1237 operating in the ohmic region (i.e., the linear region, where $(V_{GS}-V_{TH})>V_{DS}$), the drain current $I_{DS}$ may be defined as:

$$I_{DS} = K\left[(V_{GS} - V_{TH}) * V_{DS} - \left(V_{DS}^2/2\right)\right] \tag{6}$$

where K represents a mobility factor, $V_{GS}$ represents the voltage between the gate and source terminals, $V_{TH}$ represents a threshold voltage amount that turns the flash memory cell "on", and $V_{DS}$ represents the voltage between drain and source terminals. In some embodiments, when $V_{DS}$ is small, $I_{DS}$ may be defined as:

$$I_{DS} = K[(V_{GS} - V_{TH}) * V_{DS}] \tag{7}$$

The resistance ($R_{ON}$) of the flash memory cells may be defined as:

$$R_{ON} = V_{DS}/I_{DS} = 1/[K*(V_{GS} - V_{TH})] \tag{8}$$

Two read operation techniques and example bit line voltage levels are shown in graphs 1205 and 1207. In graph 1205, a delay time for BL 1221 to discharge technique is captured, wherein a span of time taken for BL 1221 is measured as a delay time and based on the measured delay time, the voltage values stored in the flash memory cells in block 1237 may be determined. In graph 1207, a rate of discharge of BL 1221 may be measured, where a voltage value is measured of BL 1221 at a predetermined time $t_x$.

Figure 13:
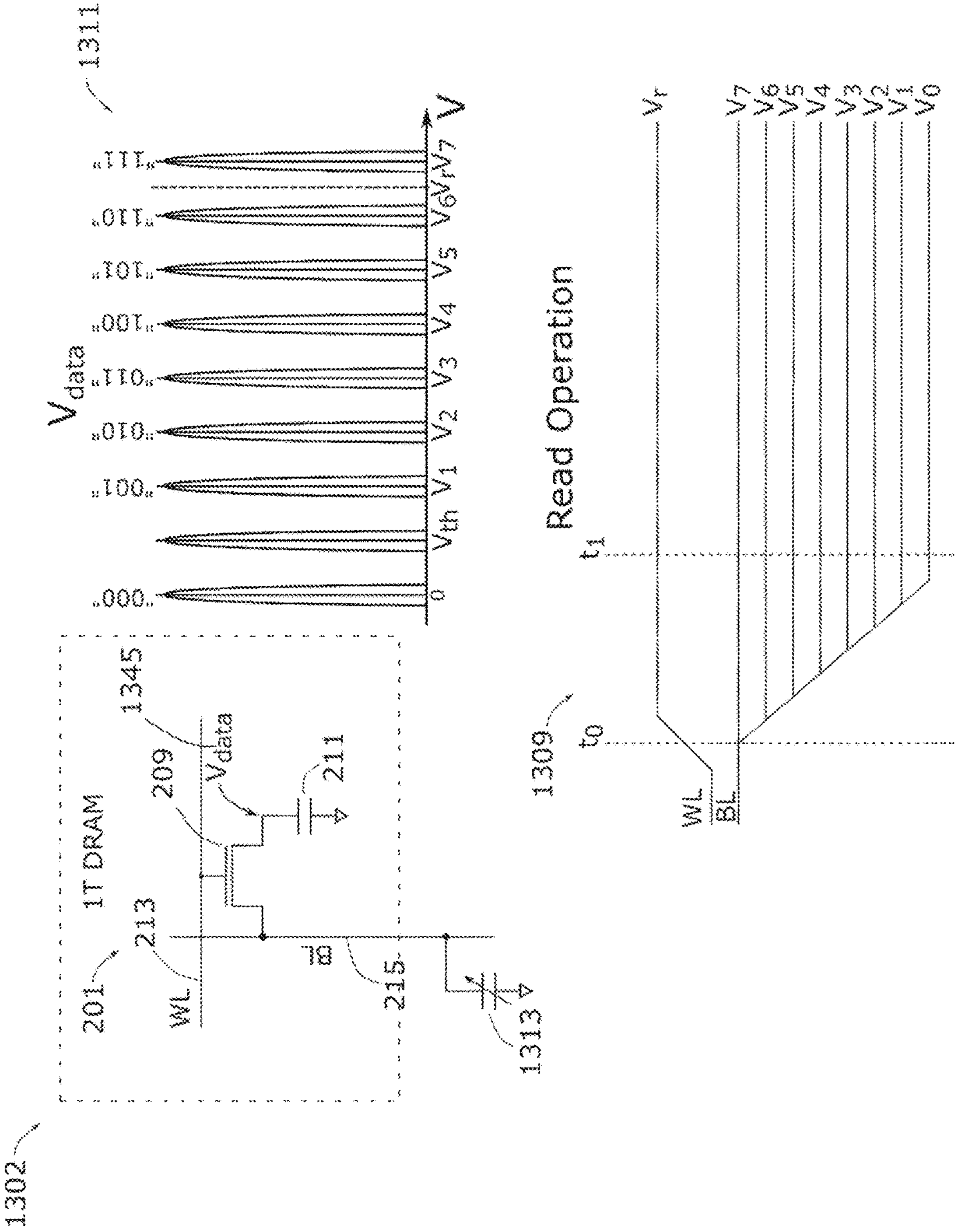
FIG. 13 shows a 1T DRAM memory cell and a corresponding read operation in accordance with at least some embodiments.

Turning now to FIG. 13, another read operation technique for a 1T DRAM cell is discussed. In block diagram 1302, previously described 1T DRAM diagram 201 is reproduced. Recall, BL 215 is connected to a source or drain terminal of transistor 209. Further BL 215 may be connected to a variable capacitor 1313 (to compensate for process variations of the memory cell capacitance and the nominal bit line capacitance). BL 215 may be set at a "high voltage" where a capacitance of variable capacitor 1313 may be varied. At time $t_0$, word line (WL) 213 may be turned on.

Based on the value of $V_{data}$ 1345, charge sharing will occur over BL 215. Depending on the value at which the charge sharing settles, a determination may be made of the voltage value of $V_{data}$ 1345. That is, BL 215 may discharge to a certain voltage level and settle at the voltage level after a span of time. Based on the level at which the voltage of BL 215 settles a determination may be made of the voltage value of $V_{data}$ 1345.

Graph 1311 demonstrates the various logical values that may be represented by respective voltage values stored as $V_{data}$ 1345. Graph 1309 demonstrates different levels at which BL 215 may settle after a span of time due to charge sharing. Thus, subsequent to time $t_0$ when WL 213 goes high, at a time predetermined time $t_1$, the voltage level of BL 215 may be measured to determine the voltage value of $V_{data}$ 1345.

Figure 14:
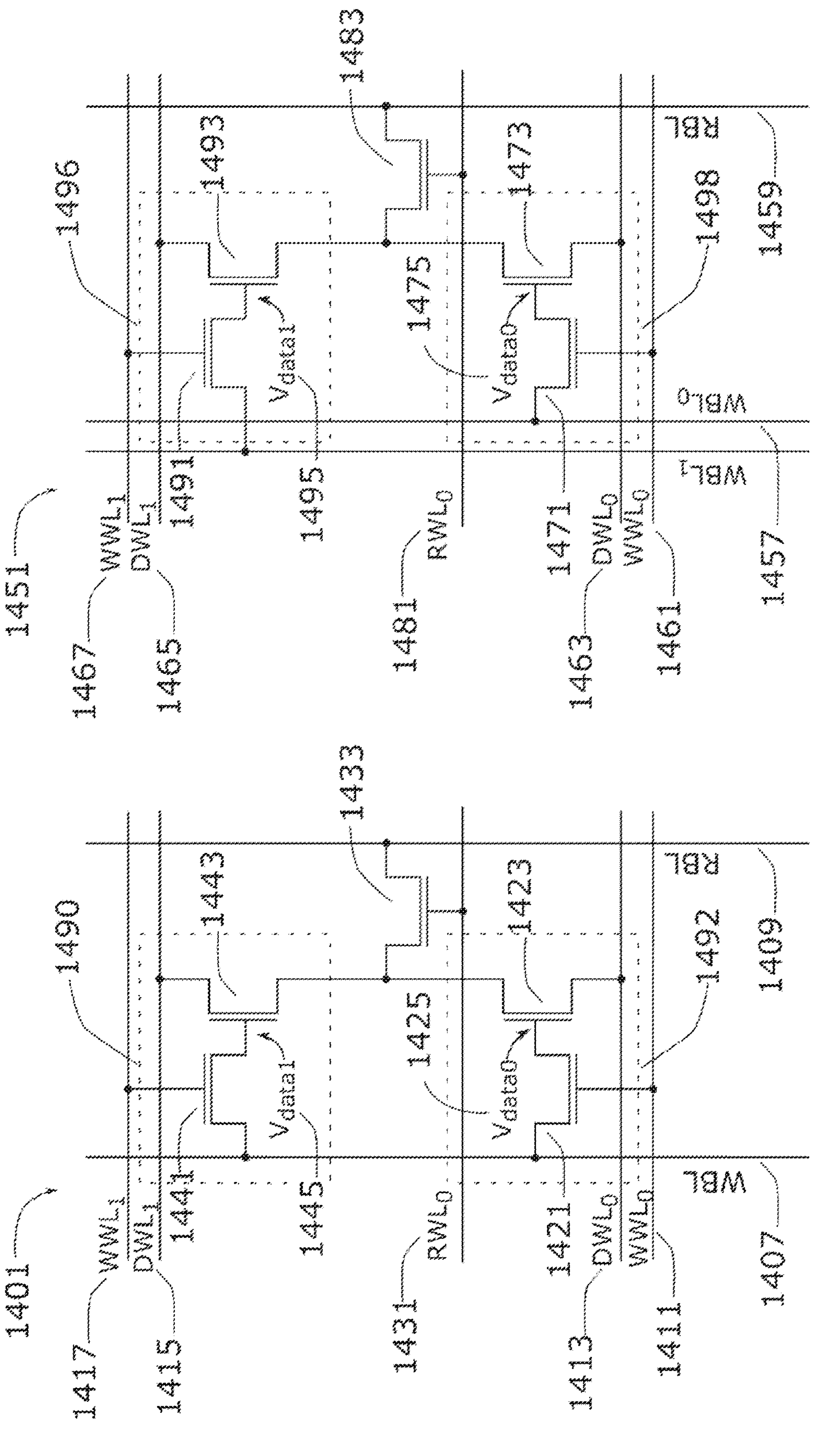
FIG. 14 shows a circuit configuration in accordance with at least some embodiments.

Turning now to FIG. 14, a block diagram of a circuit with the capability of comparing different $V_{data}$ voltage values is shown. Block diagram 1401 depicts two blocks 1490 and 1492, respectively, of transistors connected in a 2T DRAM configuration. In block 1490, a gate terminal of transistor 1441 is connected to a write word line ($WWL_1$) 1417 while a source terminal of transistor 1441 is connected to write bit line (WBL) 1407. As mentioned previously, the source and drain of transistors discussed herein are interchangeable. Thus, a source terminal may be a drain terminal in some embodiments, and vice versa.

The drain terminal of transistor 1441 is connected to a gate terminal of transistor 1443, where a source terminal of transistor 1443 is connected to a data word line ($DWL_1$) 1415. A drain terminal of transistor 1443 is connected to a source terminal of transistor 1433, and a source terminal of transistor 1433 is connected to a read bit line (RBL) 1409. A first data, $Vdata_1$, may be stored in the 2T DRAM cell (block 1490).

The source terminal of transistor 1433 is also connected to a source terminal of transistor 1423, where transistor 1423 comprises one of two transistors in the 2T DRAM cell denoted by block 1492. The drain terminal of transistor 1423 is connected to a $DWL_0$ line and a gate terminal of transistor 1423 is connected to a drain terminal of transistor 1421. The source terminal of transistor 1421 is connected to write bit line (WBL) 1407. A gate terminal of transistor 1421 is connected to write word line 0 ($WWL_0$) 1411. A second data, $Vdata_0$, may be stored in the 2T DRAM cell (block 1492).

To compare which data is greater between the two blocks 1490 and 1492, initially RBL 1409 may be charged to a "high" value such as VDD. $DWL_0$ may be at a voltage level around zero and $DWL_1$ may be at a voltage level around "high". Depending on values of $Vdata_1$ and $Vdata_0$, RBL 1409 may discharge differently.

Block diagram 1451 is similar to block diagram 1401, however, the respective blocks comprising 2T DRAM cells, blocks 1496 and 1498, are connected to separate write bit lines ($WBL_1$ and $WBL_0$). Whereas in block diagram 1451, the two blocks 1490 and 1492 share a single write bit line 1407.

Figure 15:
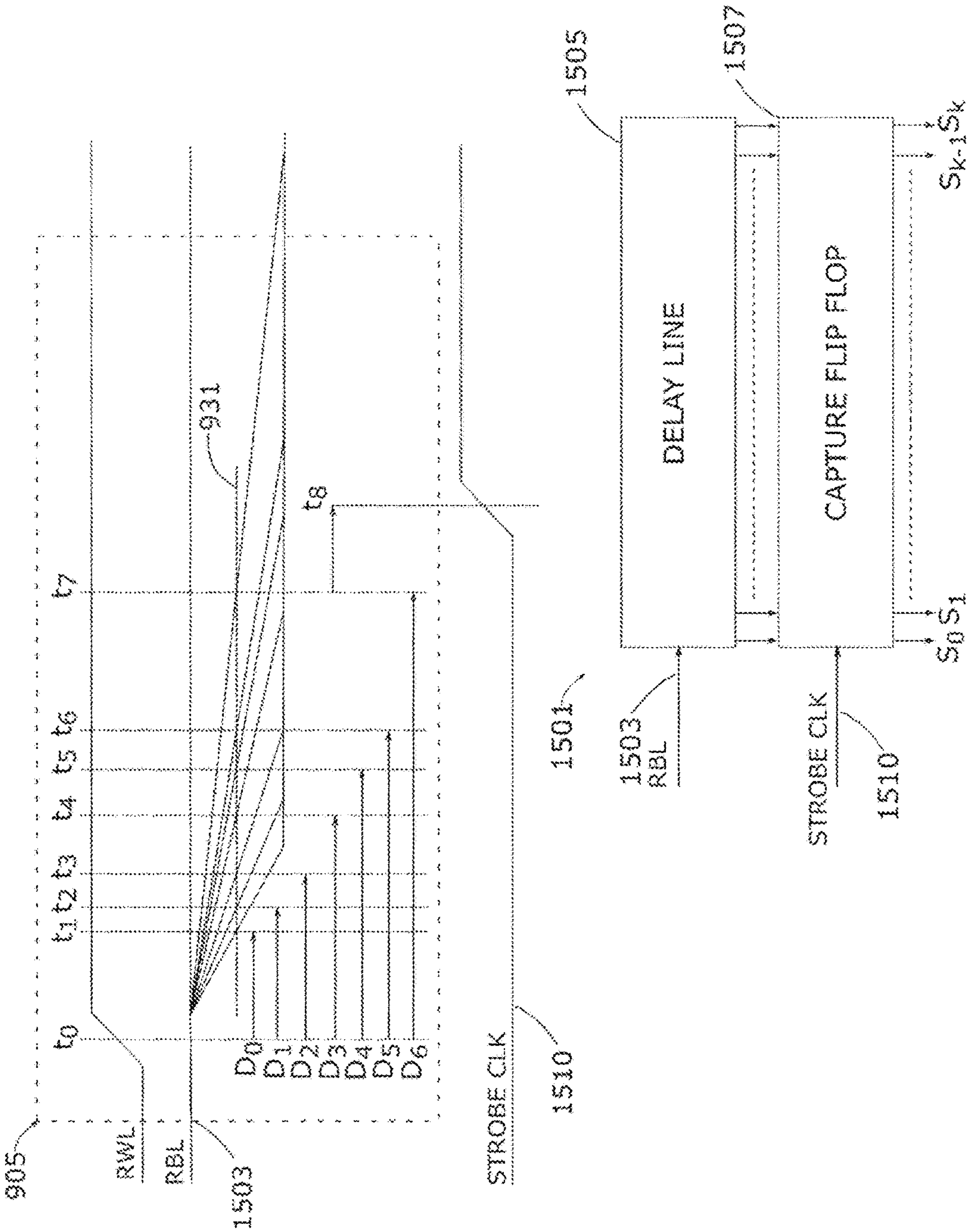
FIG. 15 shows, in block diagram form, a time-to-delay measurement circuit and a read operation in accordance with at least some embodiments.

Turning now to FIG. 15, an example of circuitry that may be used to correlate a measured delay time $t_0$ a stored voltage value is discussed. One of the read operations previously discussed includes a time $t_0$ discharge method that correlates a measured delay time $t_0$ a voltage value. Graph 905 is reproduced from FIG. 9, which captures voltage values of a read world line (RWL), read bit line (RBL), and delay times measured at predetermined times. Additionally, a strobe clock 1510 is shown superimposed on graph 905.

Block diagram 1501, illustrates in block diagram form some circuitry that may correlate a delay time $t_0$ a voltage value. In block diagram 1501, a delay line 1505 is connected to RBL 1503. The delay line 1505 in turn is connected to a capture flip flop 1507. A strobe clock signal 1510 is input to the capture flip flop 1507. The output capture flip flop 1507 may have several bits (e.g., $S_0, S_1, S_2, \ldots, S_{k-1}, S_k$). In some embodiments, the delay line 1505 may include a serial chain of non-inverting buffers, each having a respective output that is coupled to an input of an individual flip flop within the output capture flip flop 1507.

The various delay times $D_0, D_1, D_2, \ldots, D_6$ propagate through delay line 1505. The smallest delay $D_0$ propagates for the most amount of time through delay line 1505. The largest delay $D_6$ propagates for the least amount of time through the delay line. And for the condition where RBL 1503 does not switch, there is no change in value in delay line 1505. The propagation length of the delay time through delay line 1505 may be correlated to the logical value stored in a 3T DRAM cell.

For example, $D_0$ may be set to determine if a bit line falls below a threshold voltage value 931 within a first predetermined time window. In the event that the bit line falls below the threshold voltage value within the first predetermined time window, $D_0$ begins propagating a "1" through delay line 1505.

In the event that the bit line does not fall within the threshold voltage value within the first predetermined time window, $D_0$ will not propagate a "1". Taking this scenario further, $D_1$ may be set to determine if a bit line falls below a threshold voltage value within a second predetermined time window, where the second predetermined time window occurs later in time than the first predetermined time window. In the event that the bit line falls below the threshold voltage value within the second predetermined time window, $D_1$ begins propagating a "1" through delay line 1505. Thus, $D_1$, will have propagated a "1" for less time than the case where Do begins propagating. That is, the delay line 1505 may reflect the below values for respective delay times:

$$D_0\text{: }11111111111111111000 \tag{9}$$

$$D_1\text{: }11111111111111100000 \tag{10}$$

$$\ldots$$

$$D_6\text{: }11000000000000000000 \tag{11}$$

A strobe clock 1510 may be set to fire at a time $t_8$, after all delay times have passed. The strobe clock may capture data reflecting how long a "1" has propagated through the delay line and this may be correlated to voltage value of $V_{data}$ and in turn a logical value.

Figure 16:
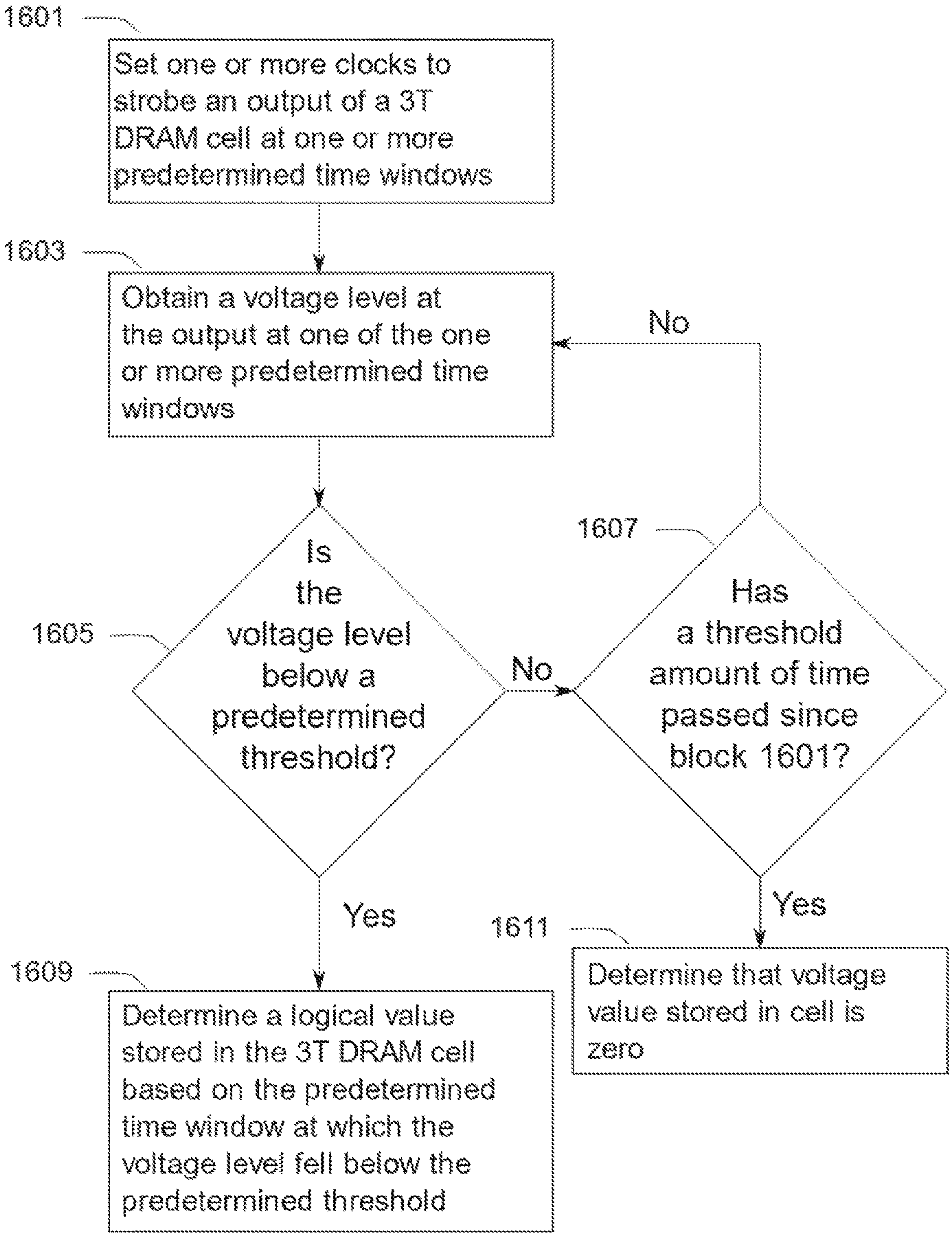
FIG. 16 shows an example method in accordance with at least some embodiments.

Turning now to FIG. 16, an example method in accordance with at least some embodiments for performing read operations is discussed. The method measures a time $t_0$ discharge of a bit line. In various embodiments, some of the blocks shown in FIG. 16 may be performed concurrently, in a different order than shown, or omitted. Additional method elements may be performed as desired.

Initially, one or more clocks may be set to strobe an output of a 3T DRAM cell at one or more predetermined time windows (block 1601). Next, a voltage level at the output of the 3T DRAM cell may be obtained during one of the one or more predetermined time windows (block 1603). An assessment may be made as to whether the obtained voltage level is below a predetermined threshold (decision block 1605).

If the obtained voltage level is below the predetermined threshold, then a logical value may be determined based on the predetermined time window during which the voltage level fell below the predetermined threshold (block 1609). If the obtained voltage level is not below the predetermined threshold, a second assessment is made on whether a threshold amount of time has passed since the beginning of the read operation (decision block 1607).

If a determination is made that the threshold amount of time has passed, then a conclusion is drawn that the voltage value stored in the 3T DRAM cell is zero (block 1611). Recall, when a lower voltage value is stored in the 3T DRAM cell, the bit line of the cell may be slower to discharge than if a higher voltage value was stored. If a determination is made that the threshold amount of time has not passed, then the method flows to block 1603 where a voltage level is measured at one of the one or more predetermined time windows.

Figure 17:
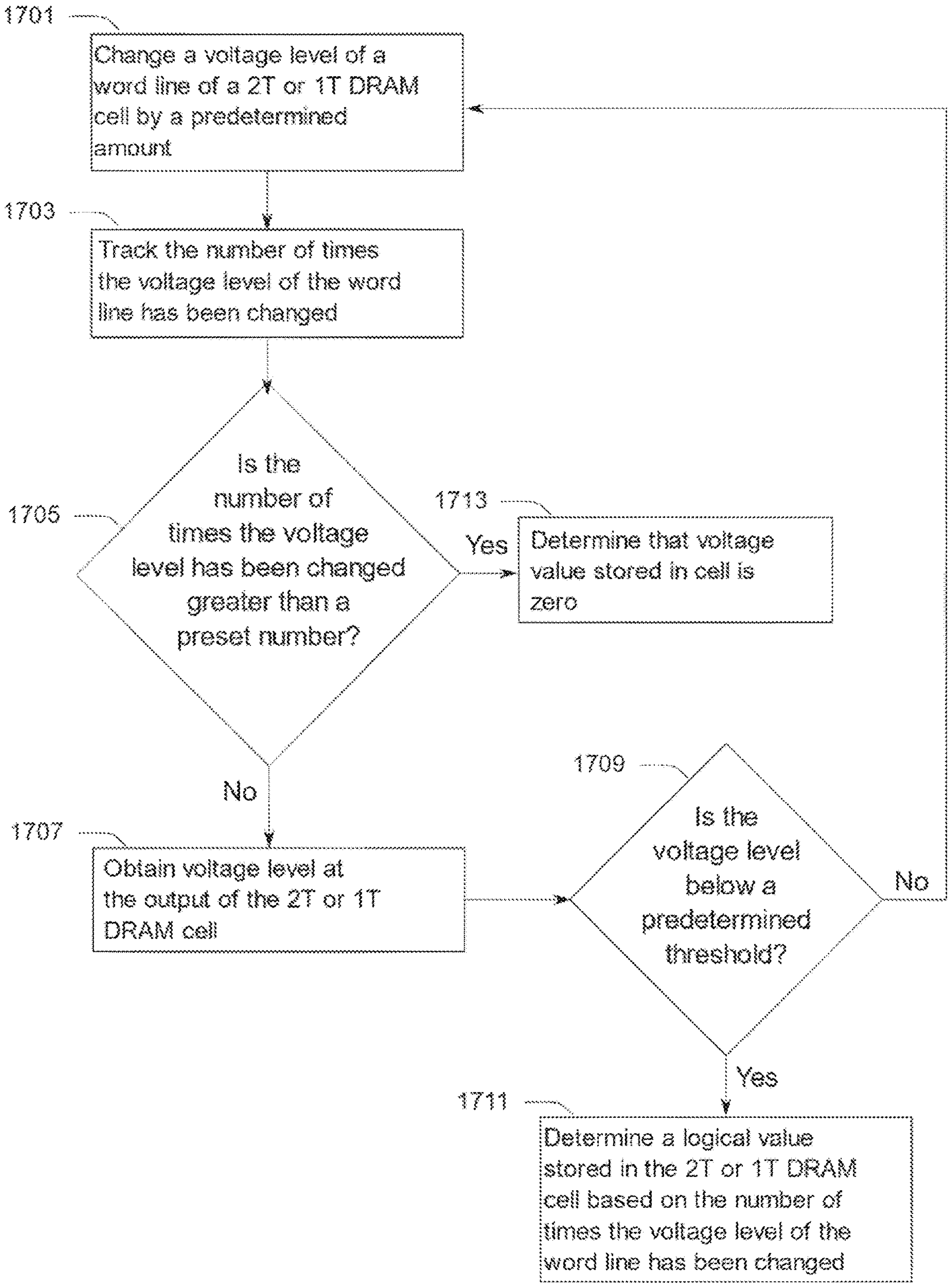
FIG. 17 shows an example method in accordance with at least some embodiments.

Turning now to FIG. 17, an example method in accordance with at least some embodiments for performing read operations is discussed. The method may track the number of times a voltage level of a word line has changed before a bit line begins discharging. In various embodiments, some of the blocks shown in FIG. 17 may be performed concurrently, in a different order than shown, or omitted. Additional method elements may be performed as desired.

Initially, a voltage level of a word line of a 2T or a 1T DRAM cell may be changed by a predetermined amount (block 1701). Next, a counter or some other mechanism may be used to track the number of times the voltage level of the word line has changed (block 1703).

An assessment is made whether the number of times the voltage level has changed is greater than a preset number (decision block 1705). If the number of times the voltage level has changed is greater than a preset number, then a conclusion is drawn that the voltage value stored in the cell is zero (block 1713).

If the number of times the voltage level has changed is less than a preset number, then a voltage level of the bit line of the 2T or 3T DRAM cell is obtained (block 1707). Next a determination is made as to whether the obtained voltage level is below a predetermined threshold (decision block 1709).

If the obtained voltage level is not below the predetermined threshold then the method flows to block 1701 where a voltage level of the word line is changed by a predetermined amount. If the obtained voltage level is below the predetermined threshold then a determination of the logical value stored in the 2T or 1T DRAM cell is made (block 1711). As discussed previously, the number of times the voltage level has been changed is correlated to a voltage value stored as $V_{data}$ and in turn $V_{data}$ is correlated to a logical value.

Figure 18:
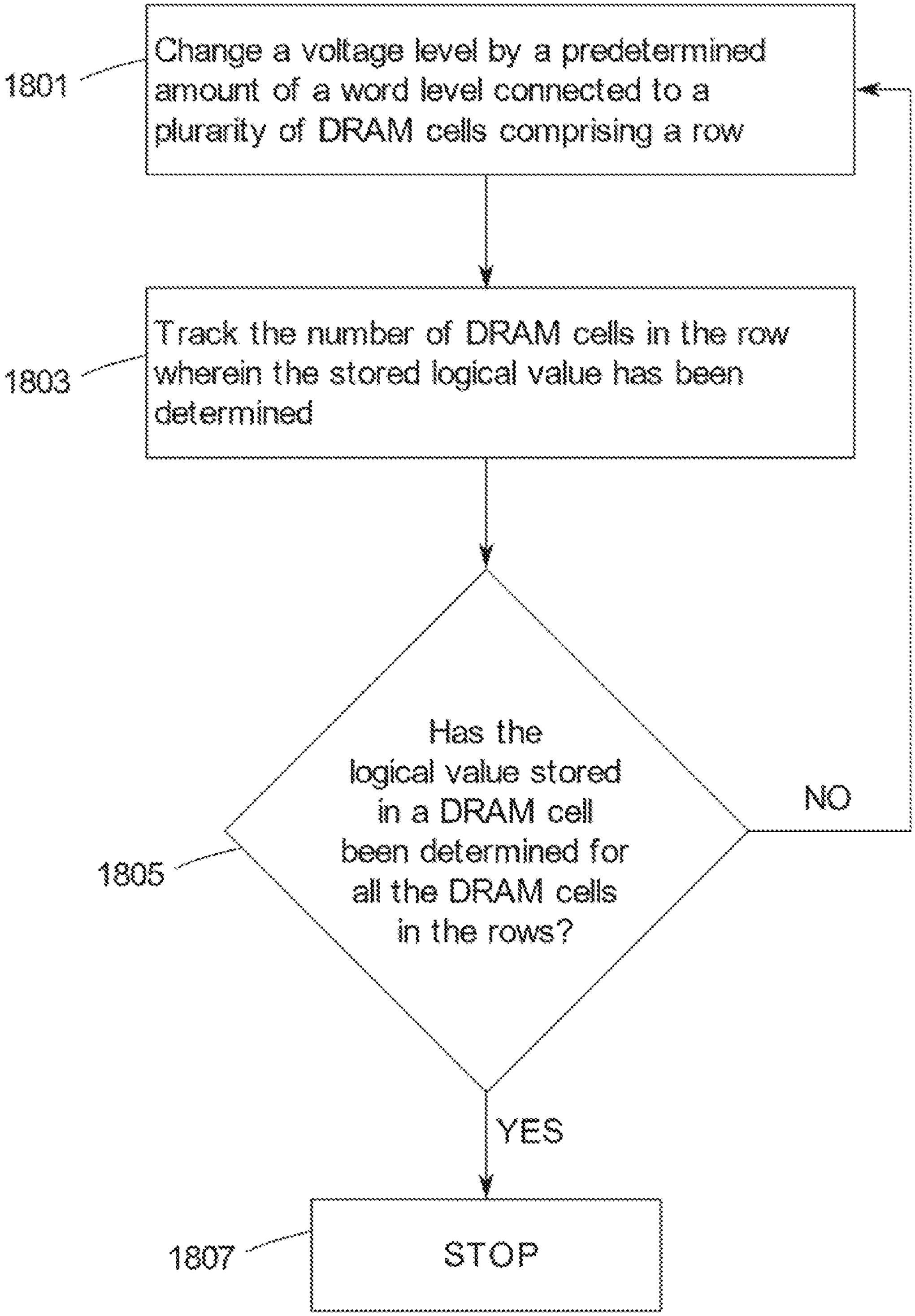
FIG. 18 shows an example method in accordance with at least some embodiments.

Turning now to FIG. 18, an example method in accordance with at least some embodiments for performing a read operation of a row of memory cells is discussed. The method stops the read operation once a determination is made that all values in the row of memory cells have been determined. In various embodiments, some of the blocks shown in FIG. 16 may be performed concurrently, in a different order than shown, or omitted. Additional method elements may be performed as desired.

Initially, a voltage level is changed, of a word line connected to a plurality of DRAM cells comprising a row (block 1801). Next the number of DRAM cells in the row where the stored logical value has been determined is tracked (block 1803). Next an assessment is made as to whether the logical value stored in a DRAM cell has been determined for all the DRAM cells in the row (decision block 1805).

If some logical values have yet to be determined in the row of DRAM cells, the method flows to block 1801, where a voltage level of the word line is changed by a predetermined amount. If all logical values have been determined in the row of DRAM cells, the method stops (block 1807).

The method described in FIG. 18 implements a power saving method for reading a row of memory cells in accordance with read operation methods described herein. For example, eight memory cells may be connected to a single word line. The memory cells may be programmed to store one of eight logical values.

To determine the logical values stored in each of the memory cells, the read word line voltage may be stepped down in increments, in accordance with a read operation described in FIG. 5. The read operation may read the eight memory cells simultaneously. In this example, logical values are assigned to voltage values "$V_1$"-"$V_7$" similar to the example discussed in FIG. 5.

In cases where the voltage values stored in respective memory cells is greater than "$V_1$", the power savings method may save power. For example, if none of the voltage values stored in the row of memory cells was below "$V_4$", the read operation would initially step down the voltage value of the word line by one increment. If any memory cells in the row contain a voltage value of "$V_7$", these values would be detected at the respective output bit line. Next, the voltage level of the word line would be stepped down by another increment. If any memory cells in the row contain a voltage value of "$V_6$", these values would be detected at the respective output bit line. The stepping down of the word line voltage continues until voltage values of all eight memory cells is determined.

A counter may track the number of cells of the eight memory cells where a determination has been made of the stored voltage value. In this example, where the lowest voltage value stored in the row is "$V_4$", the method of stepping down the voltage value of the word line may end once the "$V_4$" value is read out. The counter tracking the number of memory cells where the stored value has been determined would reflect that all eight values have been determined. Accordingly, the method would not have to continue stepping down the voltage level of the word line beyond the level for reading "$V_4$". Thus, instead of conducting a voltage change of the word line seven times, in this example, the entire row may be read after changing the voltage level of the word line four times. This example illustrates that power may be saved during a read operation.

Figure 19:
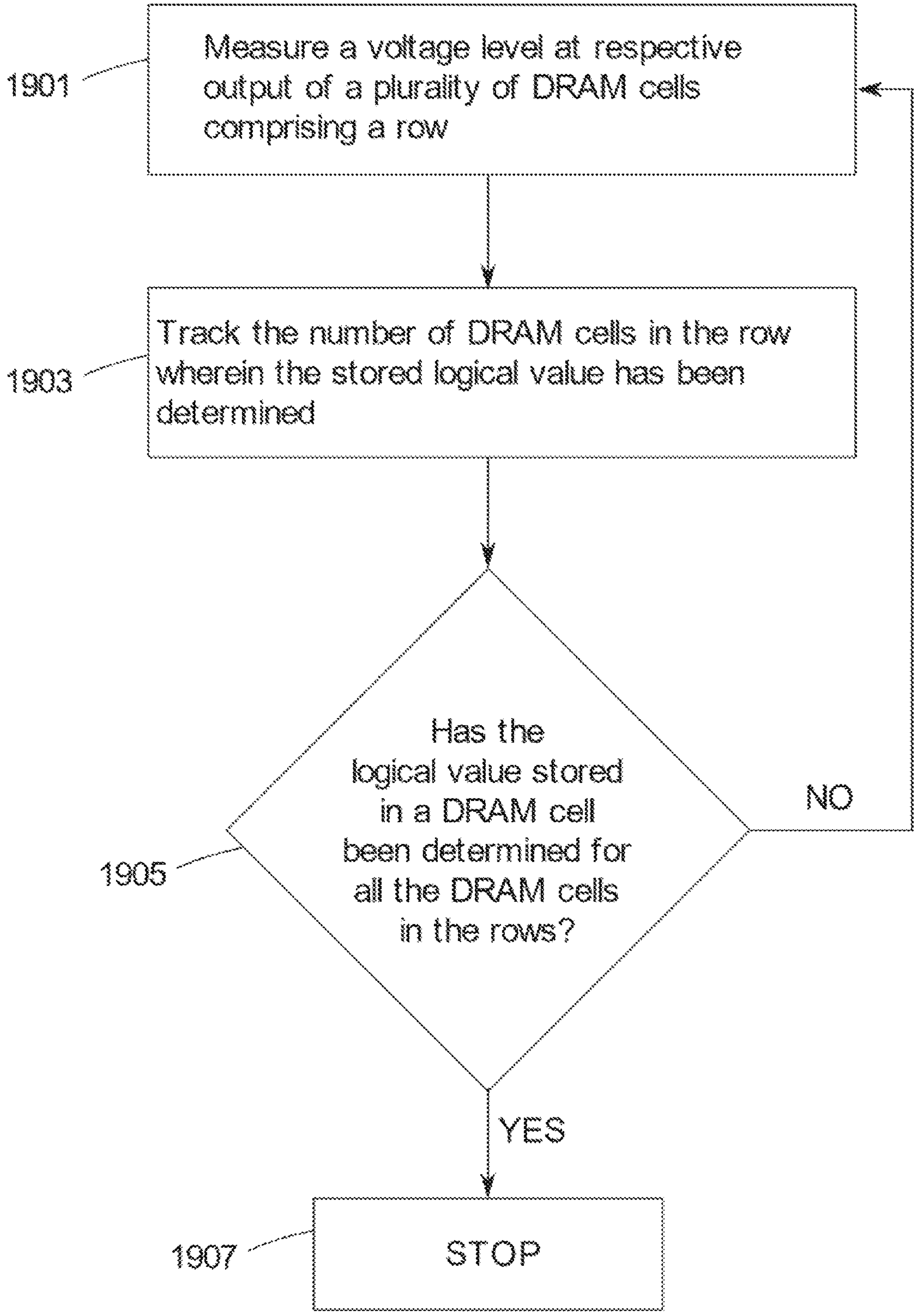
FIG. 19 shows an example method in accordance with at least some embodiments.

Turning now to FIG. 19, an example method in accordance with at least some embodiments for performing a read operation of a row of memory cells is discussed. The method stops the read operation once a determination is made that all values in the row of memory cells has been determined. In various embodiments, some of the blocks shown in FIG. 19 may be performed concurrently, in a different order than shown, or omitted. Additional method elements may be performed as desired.

Initially a voltage level is measured at respective outputs of a plurality of DRAM cells comprising a row (block 1901). Next, the number of DRAM cells in the row where the stored logical value has been determined is tracked (block 1903). Next an assessment is made as to whether the logical value stored in a DRAM cell has been determined for all the DRAM cells in the row (decision block 1905).

If some logical values have yet to be determined in the row of DRAM cells, the method flows to block 1901, where a voltage level at respective bit lines of the row of DRAM cells is measured. In various embodiments, the read operations that may be used in this method include measuring a delay time $t_0$ discharge of a bit line. If all logical values have been determined in the row of DRAM cells, the method stops (block 1907).

Similar to the method described in FIG. 18, the method described in FIG. 19 implements a power saving method for reading a row of memory cells in accordance with read operation methods described herein.

Figure 20:
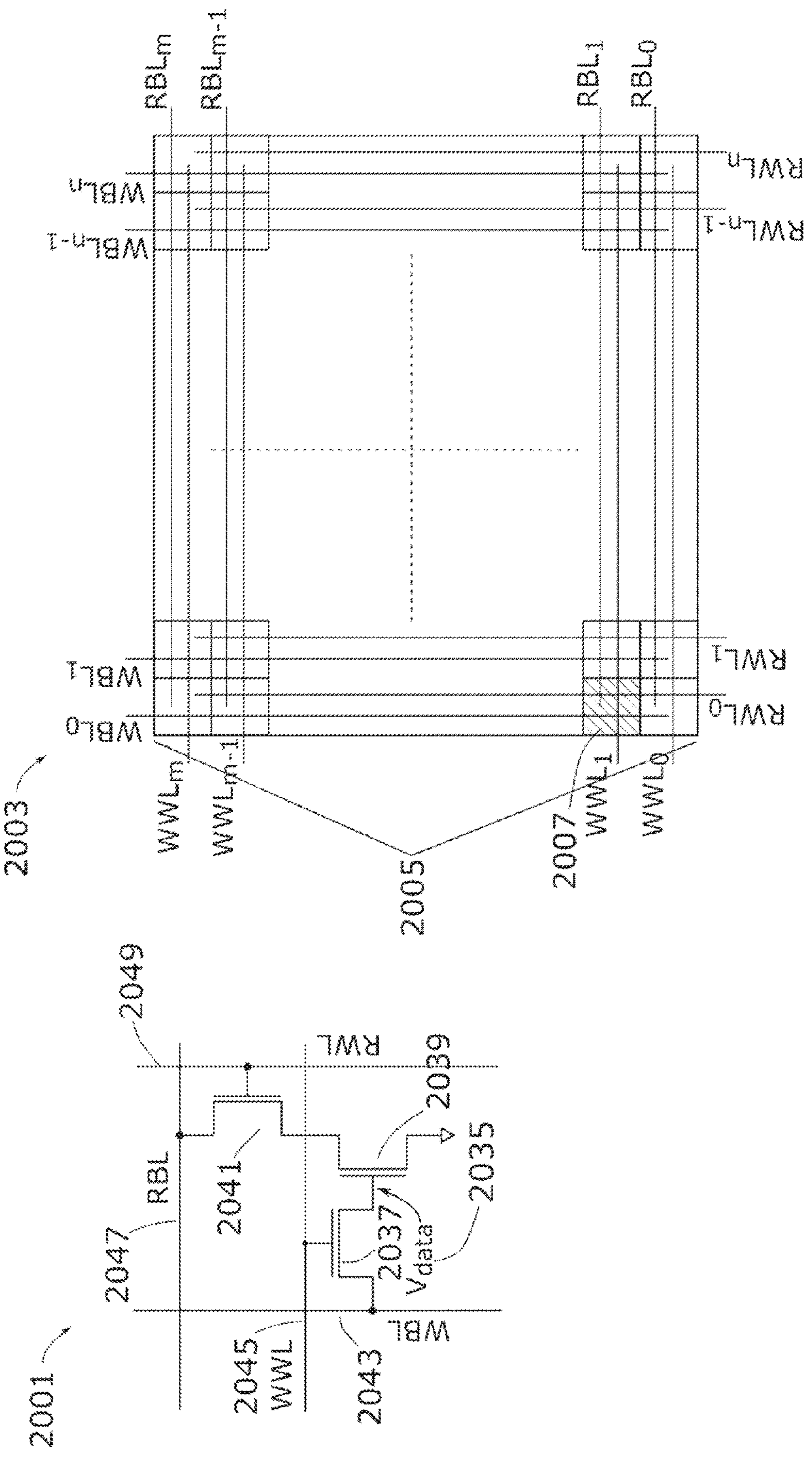
FIG. 20 shows, in block diagram form, a circuit configuration in accordance with at least some embodiments.

Turning now to FIG. 20, block diagrams 2001 and 2003 illustrate configurations that allow for row-column operation of bit cells such as bit cell 2007, arranged in one or more arrays 2005. Block diagram 2003 may implement an orthogonal read write operation. Block diagram 2003 may comprise a two dimensional array where one or more rows are shown as write word lines $WWL_0$, $WWL_1$, . . . , and $WWL_m$ and one or more columns are shown as read word lines $RWL_0$, $RWL_1$, . . . , and $RWL_m$. The row and column designations are interchangeable between the write word lines and read word lines. The read and write word lines are orthogonal with respect to each other and similarly corresponding read and write bit lines are also orthogonal with respect to each other.

An orthogonal read write operation using array 2003 is enabled by the bit cell 2007, which may comprise a 3T DRAM memory cell. As shown in block diagram 2001, a 3T DRAM memory cell comprises three transistors 2037, 2039, and 2041. Two transistors 2039 and 2041 are connected in series while a drain terminal of transistor 2037 is connected to a gate terminal of transistor 2039. $V_{data}$ 2035 is stored at the node where the drain terminal of transistor 2037 is connected to the gate terminal of transistor 2039. A source terminal of transistor 2037 is connected to a write bit line 2043, while a write word line 2045 is connected to a gate terminal of transistor 2037. A read word line 2047 is connected to a gate terminal of transistor 2041, while a drain terminal of transistor 2041 is connected to a read bit line 2049. Block diagram 2001 is similar to bit cell 205 (FIG. 2) except that the read and write word lines are mutually orthogonal to each other.

Block diagram 2003 may store a matrix of dimension (m, n) where m and n may be equal or different. Further the write and read operation performed by block diagram 2003 may perform a matrix transpose operation. For example, write word lines are corresponding to row orientation of a matrix, then during the write operation the data is written into the matrix in row orientation. And during the read operation the data from the matrix is read in the column orientation which is the transpose operation of the matrix.

Figure 21:
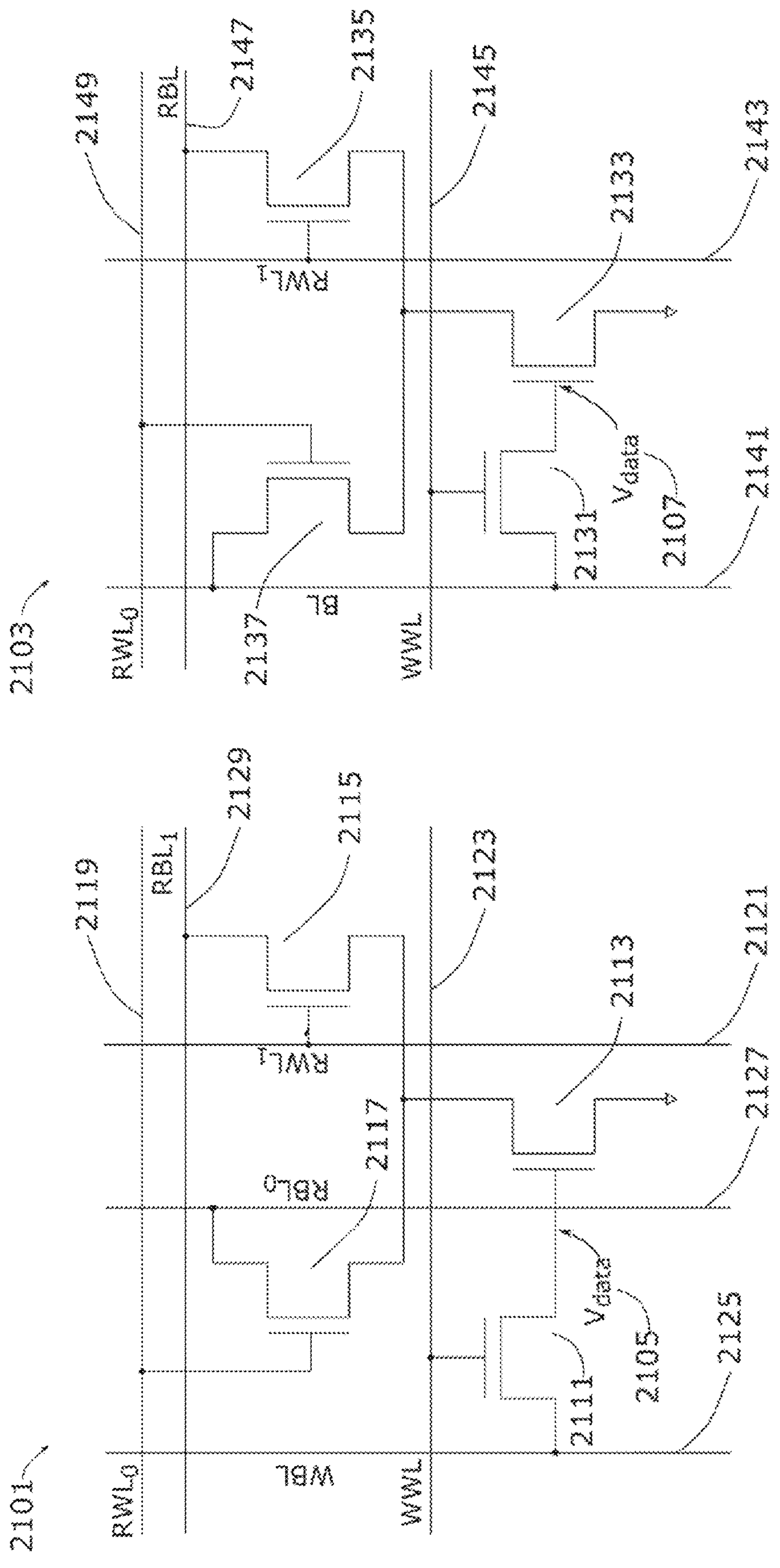
FIG. 21 shows a circuit configuration in accordance with at least some embodiments.

Turning now to FIG. 21, block diagrams 2101 and 2103 illustrate configurations that may be used with 4T DRAM with orthogonal read. Block diagram 2101 comprises a 4T DRAM and has an additional transistor (i.e., a fourth transistor) 2117 which enables read operation in the same orientation of write operation. Block diagram 2103 comprises a 4T DRAM and has an additional transistor (i.e., a fourth transistor) 2137 when compared to the 3T DRAM (FIG. 20). Compared to the array of bit cells discussed in block diagram 2003, the array of bit cells of 2101 has an additional set of read word lines and corresponding read bit lines. Similarly, the array of bit cells 2103, compared to the array of bit cells discussed in block diagram 2003, has additional sets of read word lines sharing a common bit line with the corresponding write word lines. The arrays of bit cells in block diagrams 2101 and 2103 during write and read operations perform a matrix transpose operation similar to the array of bit cells in block diagram 2003, in addition to a normal matrix read operation. In an embodiment, the fourth transistor and a second transistor are coupled in series to a read port (i.e., a second read port). In an embodiment, the write port is coupled with a write bit line. In an embodiment, the second read port is coupled with a second read bit line. In an embodiment, the write bit line and the second read bit line are orthogonal to each other. In another embodiment, the fourth transistor is coupled between a write port (i.e., a second write port) and the data node. In an embodiment, the read port is coupled with the read bit line. In an embodiment, the second write port is coupled with a second write bit line. In an embodiment, the read bit line and the second write bit line.

Figure 22:
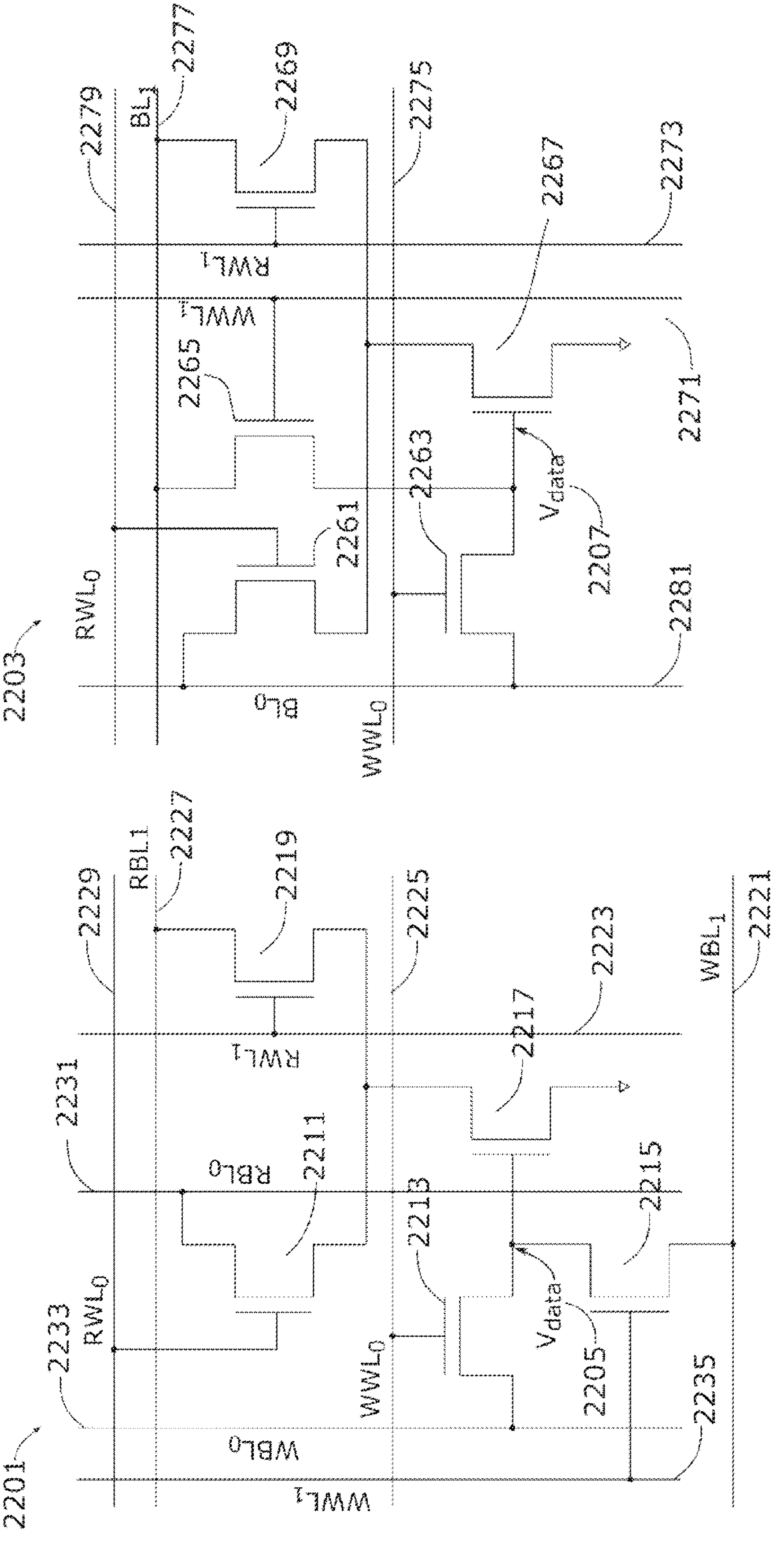
FIG. 22 shows a circuit configuration in accordance with at least some embodiments.

Turning now to FIG. 22, block diagrams 2201 and 2203 illustrate configurations that may be used with 5T DRAM with orthogonal read and write. Compared to the 4T DRAM illustrated in 2101 and 2103, the 5T DRAM illustrated in 2201 and 2203 have a pair of additional transistors 2211, 2215 and 2261, 2265 respectively. This additional pair of transistors with the corresponding read and write word line enables read and write operation in both row and column orientation in an array of bit cells. Compared to the array of bit cells discussed in block diagram 2003, the array of bit cells in block diagram 2201 has additional sets of read and write word lines with the corresponding read and write bit lines. Similarly, the array of bit cells in block diagram 2203, compared to the array of bit cells discussed in block diagram 2003, has an additional set of read and write word lines. Both sets of mutually orthogonal read and write word lines share a corresponding set of common bit lines. Also, the sets of common bit lines are mutually orthogonal to each other. The arrays of bit cells in block diagrams 2201 and 2203 during write and read operations perform a matrix operation like arrays of bit cells in block diagram 2003 and, additionally, perform a column orientation read and write operations to read and write data to a column of a matrix. The 5T DRAM compared to 4T DRAM illustrated in FIG. 21 has an additional write port to perform write operations in both row and column orientation.

The 3T DRAM described in FIG. 4 along with several embodiments described herein, such as embodiments in FIGS. 9, 10, 12, etc. are applicable to DRAMs illustrated in FIGS. 20, 21 and 22.

Figure 23:
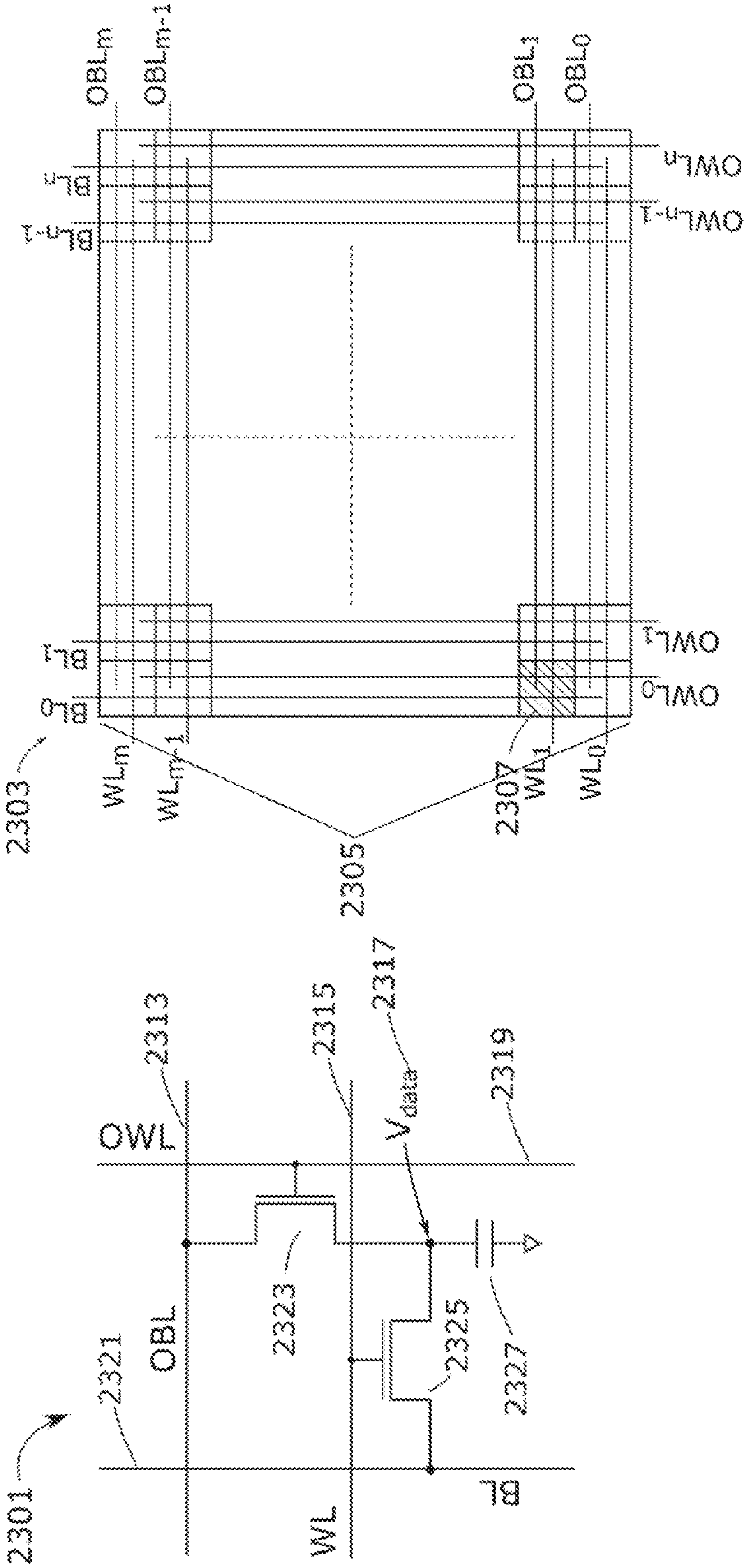
FIG. 23 shows, in block diagram form, a circuit configuration in accordance with at least some embodiments.

Turning now to FIG. 23, block diagram 2301 illustrates configurations that may be used with 2T DRAM with orthogonal read and write similar to a 5T DRAM. Block diagram 2303 illustrates configurations that allow for row-column operation of bit cells such as bit cell 2307, arranged in one or more arrays 2305. Block diagram 2303 may comprise a two dimensional array where one or more rows are shown as word lines $WL_0$, $WL_1$, . . . , and $WL_m$ and one or more columns are shown as orthogonal word lines $OWL_0$, $OWL_1$, . . . , and $OWL_m$. The row and column designations are interchangeable between the word lines and orthogonal word lines. The word lines and orthogonal word lines are orthogonal with respect to each other and similarly, the corresponding bit lines and orthogonal bit lines are also orthogonal with respect to each other.

The array of bit cells in block diagram 2303 during write and read operation performs a matrix operation similar to arrays of bit cells in block diagrams 2201 and 2203. The 1T DRAM described in FIG. 7 and FIG. 13, along with several embodiments described herein, are applicable to the 2T DRAM illustrated in FIG. 23

Figure 24:
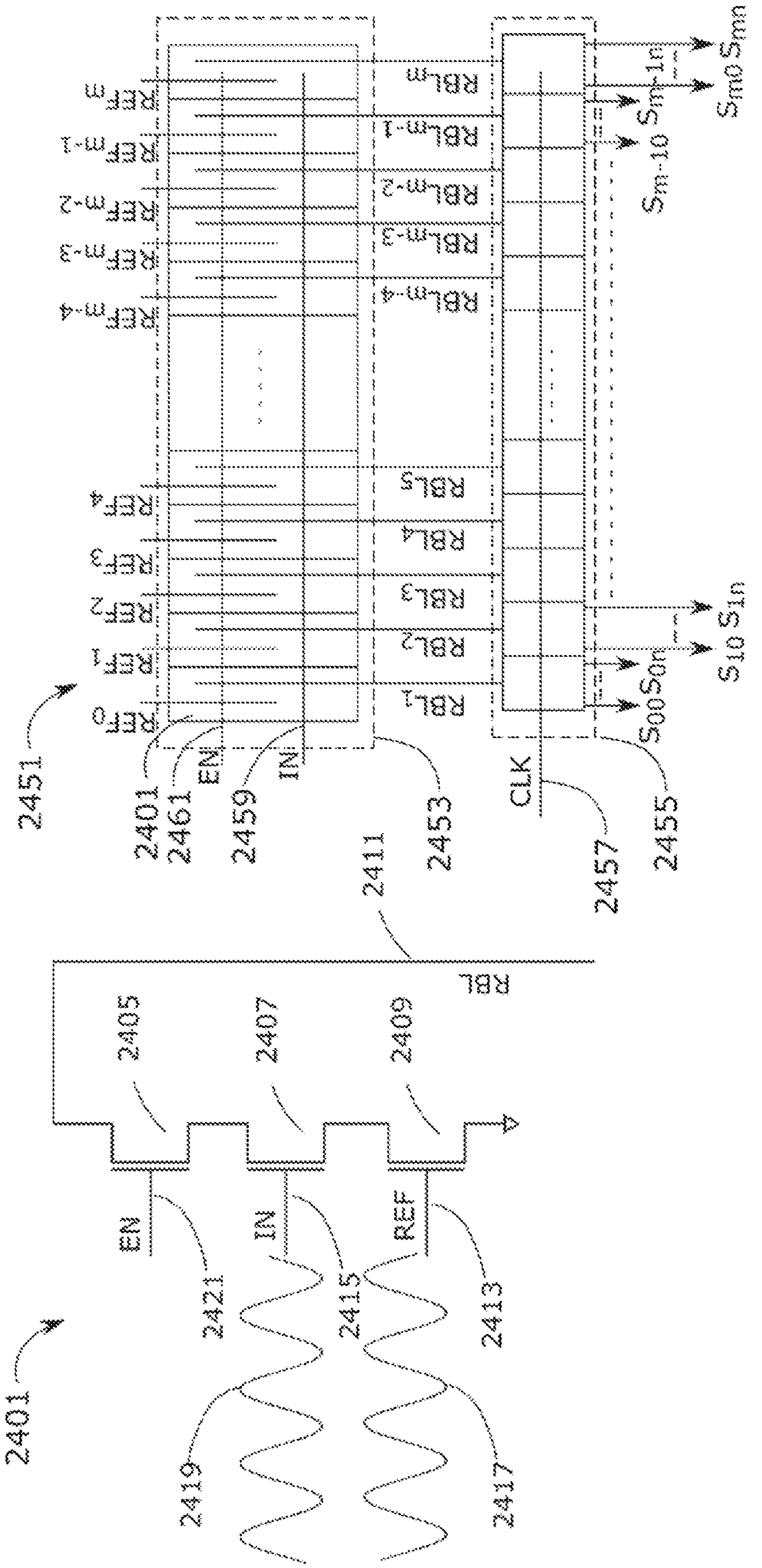
FIG. 24 shows, in block diagram form, a circuit configuration in accordance with at least some embodiments.

Turning now to FIG. 24, block diagram 2401 of a circuit that may be used to compare two signals is shown. Block diagram 2401 comprises three transistors 2405, 2407, and 2409, connected in series. A gate terminal of transistor 2405 is connected to an enable line (EN) 2421, a gate terminal of transistor 2407 is connected to an input line (IN) 2415, and a gate terminal of transistor 2409 is connected to a reference line (REF) 2413. A conduction electrode (e.g., source or drain) of transistor 2405 is connected to a read bit line (RBL) 2411.

The time $t_0$ discharge method described in FIG. 9 may be applied to measure the phase overlap of two signals 2417 and 2419. The two signals 2417 and 2419 may be aligned to turn on transistors 2407 and 2409. Furthermore, a signal on enable line 2421 may also turn on transistor 2405 contemporaneous to when signals 2417 and 2419 are applied to transistors 2407 and 2409. Signals 2415 and 2413 may be applied to transistors 2407 and 2409 for a duration of time sufficient to discharge RBL 2411. Whether or not signals 2417 and 2419 are aligned in phase may be determined based on the time to discharge of RBL 2411. For example, if signals 2417 and 2419 are aligned in phase, the time $t_0$ discharge of RBL 2411 will be lesser than when signals 2417 and 2419 are out of phase. Accordingly, the time $t_0$ discharge method may be used to assess the phase alignment of at least two signals.

In another example, a plurality of block diagrams such as block diagram 2401 may be connected in parallel or in series. Using the plurality of block diagrams 2401, a plurality of reference signals (i.e., 2417) may be used to assess a phase of an input signal. The plurality of reference signals may differ in both phase and/or frequency. The block diagram 2451 is an illustrative example comprising a plurality of block diagrams 2401 having a common enable signal EN (2461) and input signal IN (2459) with plurality of reference signals $REF_1$, $REF_2$, $REF_3$, . . . . $REF_m$ used to assess the phase of the input signal IN. By applying a time $t_0$ discharge method as discussed herein, the phase of the input signal may be determined and this is performed in block 2455.

Figure 25:
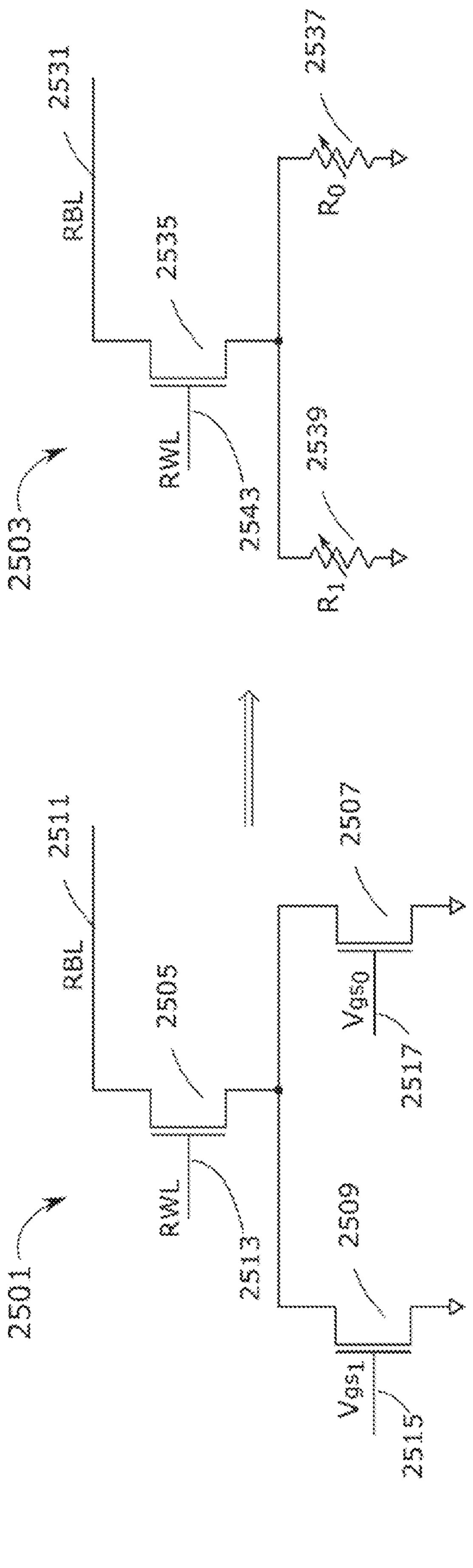
FIG. 25 shows a circuit configuration in accordance with at least some embodiments.

Turning now to FIG. 25, a block diagram illustrates another example of a circuit configuration that may utilize the embodiments discussed herein. Diagram 2501 comprises two transistors 2509 and 2507 connected in parallel, with respective voltages $V_{gs1}$ and $V_{gs0}$ coupled to their respective gates. Additionally, a conduction electrode (e.g., source or drain) of transistor 2505 is connected to respective conduction electrodes of transistors 2509 and 2507. A gate terminal of transistor 2505 is connected to read word line (RWL) 2513, while a conduction electrode (e.g., source or drain not connected to the transistors in parallel), is connected to read bit line (RBL) 2511.

Diagram 2503 is a circuit diagram equivalent to diagram 2501. However, the transistors 2509 and 2507 are represented as variable resistors 2539 and 2537 connected in parallel. Where the total time $t_0$ discharge of RBL 2531 is equivalent to the product of the circuit resistance and the circuit capacitance.

$$RC \text{ time constant} = (R_0 \| R_1) \times C_{BL} \tag{12}$$

$$\Rightarrow RC \text{ time constant} = \left(\frac{R_0 R_1}{R_0 + R_1}\right) \times C_{BL} \tag{13}$$

where $R_0$ and $R_1$ represent a variable resistance and $C_{BL}$ represents a capacitance of RBL 2531. For different values of $R_0$ and $R_1$, the RC time constant value varies which changes the time delay for discharging. In equation 12, above, the resistance value of transistor 2535 is considered to be so much smaller than resistances R0 and R1 that the resistance of transistor 2535 is negligible. Thus, the resistance value of transistor 2535 is not included in the RC time constant calculation. In embodiments where the resistance value of transistor 2535 is larger so as not to be negligible, the resistance value may also be included as an offset in the RC time constant calculation.

Figure 26:
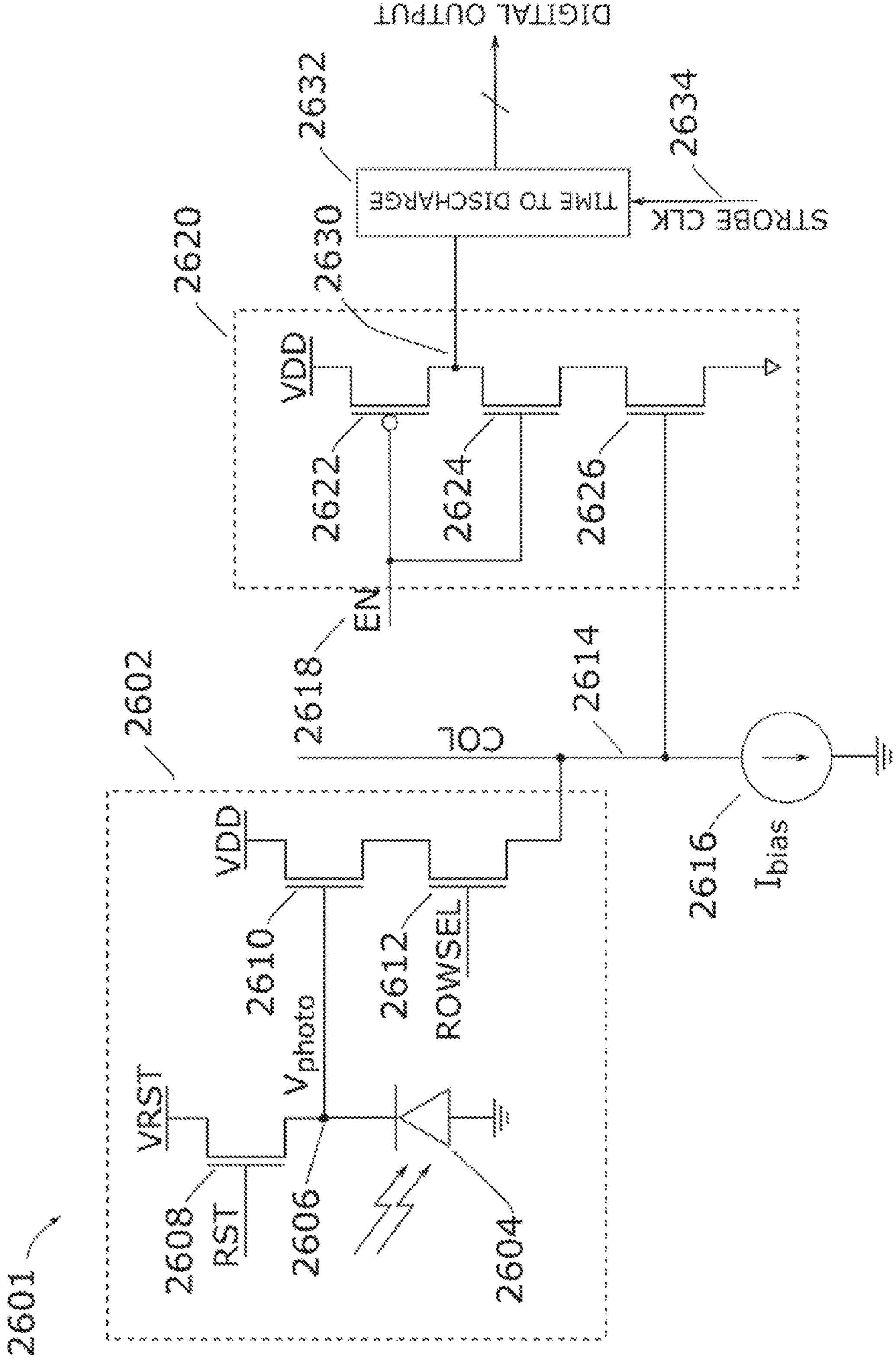
FIG. 26 shows, in partial block diagram form, a circuit configuration in accordance with at least some embodiments.

Turning now to FIG. 26, block diagram 2601 illustrates configurations that may be used with a memory array of cells that include a photodiode sensor. Each memory cell 2602 includes a photodiode sensor 2604 coupled between internal $V_{photo}$ node 2606 and ground. When a reset signal RST is active, this $V_{photo}$ node 2606 is driven by transistor 2608 to a reset voltage VRST that is coupled to the drain terminal of transistor 2608. When the reset signal RST is inactive, the current generated through the photodiode sensor 2604, in response to incident light, results in a decreasing voltage on $V_{photo}$ node 2606 that is a function of the magnitude of incident light times the accumulation time. To interrogate the memory cell 2602, a row select signal ROWSEL is activated to couple the memory cell 2602 to a column line 2614, also labeled COL, which is loaded by a bias current ($I_{bias}$) 2616 to ground. Since the drain terminal of transistor 2610 is coupled to VDD, and since the gate terminal of transistor 2610 (i.e., the $V_{photo}$ node 2606) is typically lower in voltage than its drain terminal, transistor 2610 functions as a source-follower. The select transistor 2612 may be viewed as a switch, and thus the resulting voltage on the column line 2614 is driven to a value that is approximately a threshold voltage below the $V_{photo}$ node 2606 voltage. In other words, the circuit comprising transistors 2610, 2612 and current source 2616 functions as a voltage translation or level-shifting circuit to impart on the column 2614 a voltage that offset from (i.e., corresponds to) the voltage of the $V_{photo}$ node 2606 in the selected memory cell 2602.

The voltage of the column line 2614 may be determined by using a time to discharge technique as described earlier herein. In this embodiment, a sensing block (i.e., discharge circuit) 2620 comprises two N-channel transistors 2626 and 2624 connected in series between a discharge node 2630 and ground. The gate terminal of transistor 2626 is coupled to the column line 2614, and the gate terminal of transistor 2624 is coupled to an enable signal EN conveyed on node 2618. A third P-Channel transistor 2622 couples the discharge node 2630 to VDD when the enable signal EN coupled to its gate terminal is inactive (e.g., low). Similar to the description in regards to FIG. 8, when the enable signal EN is active (e.g., high), the discharge node 2630 will discharge a rate based on the voltage of the column line 2614, which voltage, as mentioned above, likewise depends on the voltage of the $V_{photo}$ node 2606.

Figure 34:
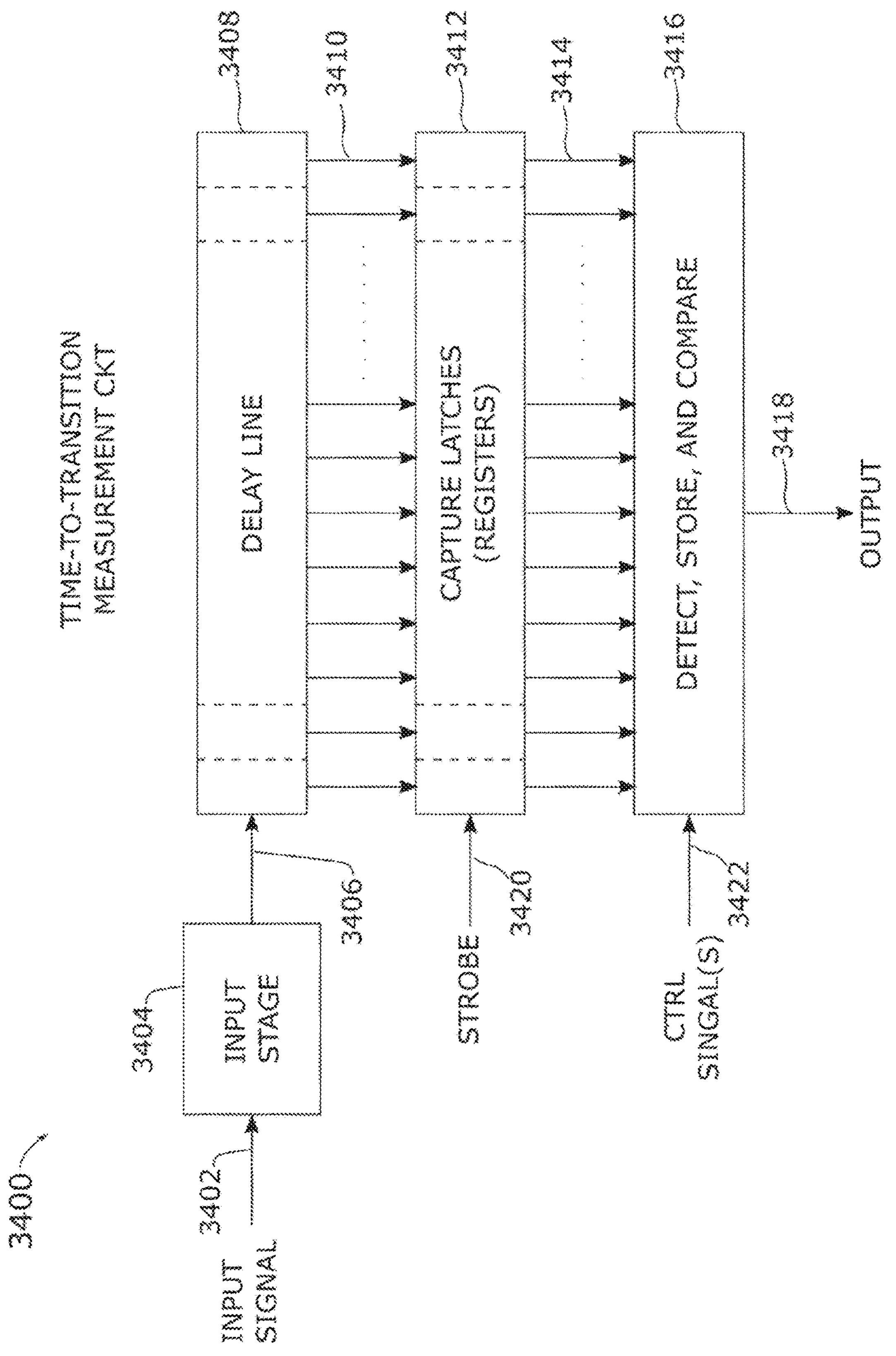
FIG. 34 shows, in block diagram form, a time-to-transition measurement circuit configuration in accordance with at least some embodiments.

A time $t_0$ discharge circuit 2632, such as described herein in regards to FIG. 15 or FIG. 34, may be coupled to the discharge node 2630 and driven by a strobe clock signal STROBE CLK conveyed on node 2634, to generate a digital output reflective of the incident light falling upon the memory cell 2602. In some embodiments, the accumulation time for a given cell, such as cell 2602, may be determined by the length of time necessary to interrogate all of the other cells coupled to the same column line 2614 (which other cells are not shown in FIG. 26).

Other embodiments are contemplated for memory cells incorporating photodiode sensors. For example, a configuration as shown in FIG. 4 may be used, in which the $V_{photo}$ node is coupled to the gate of transistor 239 (i.e., the $V_{data}$ node 401).

Figure 27:
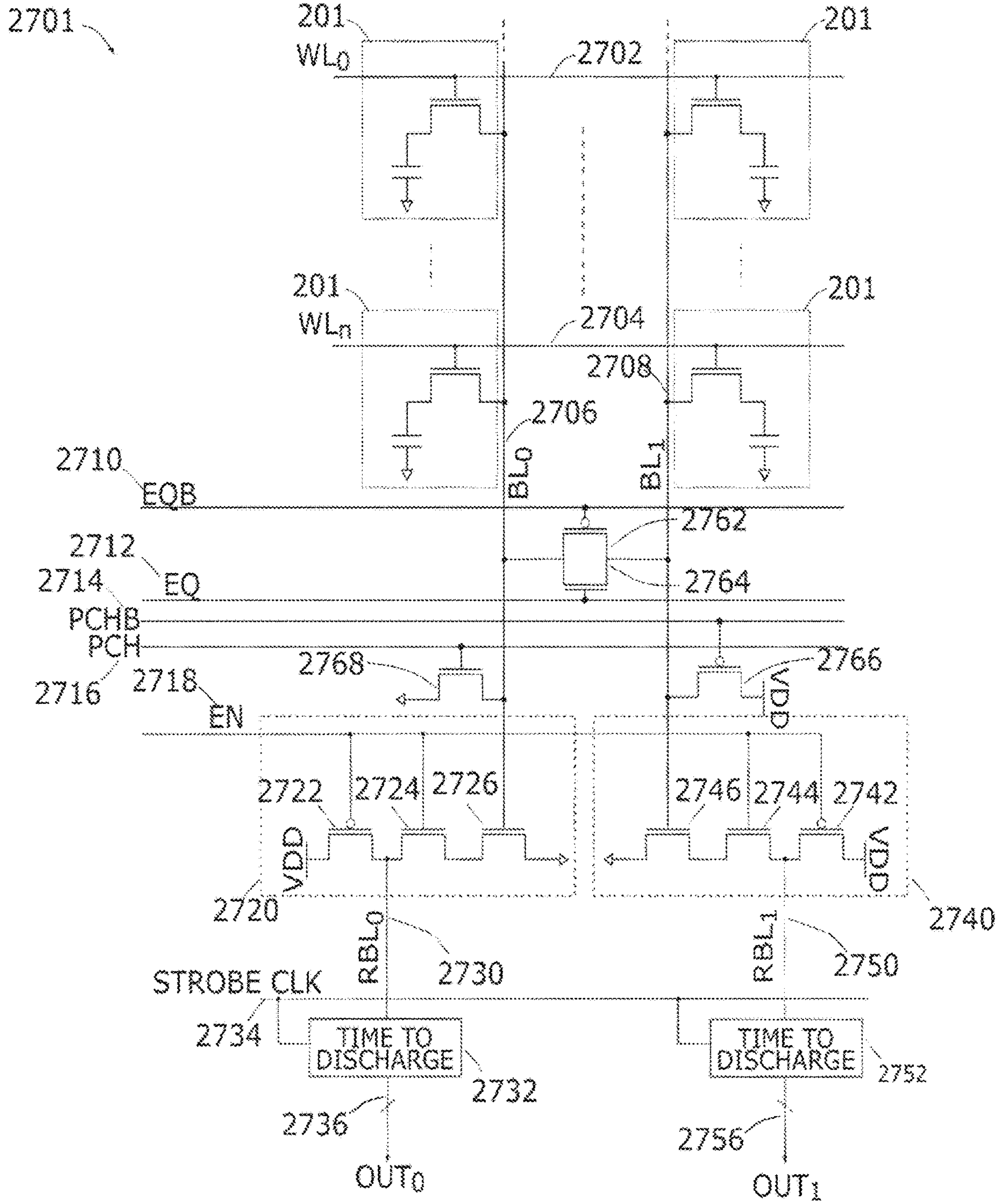
FIG. 27 shows, in partial block diagram form, a circuit configuration in accordance with at least some embodiments.

Turning now to FIG. 27, block diagram 2701 illustrates a configuration that may be used with an array of 1T DRAM memory cells such as memory cell 201 shown in FIG. 2. Four such memory cells 201 are shown, each coupled to a respective one of word lines 2702, 2704 and a respective one of bit lines 2706, 2708, although in anticipated embodiments additional such word lines (not shown) would be present, each coupled to a respective pair of additional memory cells 201 (not shown). Between active cycles, a complementary pair of precharge signals PCH, PCHB are asserted. During such time, a first precharge transistor 2768 couples the bit line 2706 to GND since the precharge signal PCH conveyed on node 2716 is high, and a second precharge transistor 2766 couples the bit line 2708 to VDD since the complementary precharge signal PCHB conveyed on node 2714 is low. The complementary precharge signals PCH, PCHB are then de-asserted, and a complementary pair of equilibration signals EQ, EQB conveyed on respective nodes 2712, 2710 are then asserted to couple together the pair of bit lines 2706, 2708 by way of P-channel equilibration transistor 2762 and N-channel equilibration transistor 2764, and thus establish an equilibration voltage (i.e., a reference condition) on both bit lines 2706, 2708 that is an intermediate voltage between VDD and ground. In this example, the equilibration voltage is approximately VDD/2 on both bit lines 2706, 2708.

The voltage of the bit lines 2706, 2708 may be determined by using a time to discharge technique as described herein. In this embodiment, a sensing or discharge circuit 2720 comprises two N-channel transistors 2726 and 2724 connected in series between a read bit line ($RBL_0$) node 2730 and ground. The gate terminal of transistor 2726 is coupled to the bit line 2706, and the gate terminal of transistor 2724 is coupled to an enable signal EN conveyed on node 2718. A P-Channel transistor 2722 couples the read bit line node 2730 to VDD when the enable signal EN coupled to its gate terminal is inactive (e.g., low). Similar to the description in regards to FIG. 8, when the enable signal EN is active (e.g., high), the read bit line node 2730 will discharge at different rates based on the voltage of the bit line 2706. A time $t_0$ discharge circuit 2732, such as described above in regards to FIG. 15 or FIG. 34, is coupled to the read bit line node 2730 and driven by a strobe clock signal STROBE CLK conveyed on node 2734, to generate a digital output $OUT_0$ (conveyed on node(s) 2736) reflective of the discharge rate of the read bit line 2730, which in turn is reflective of the voltage on $BL_0$ (i.e., bit line 2706).

A second sensing or discharge circuit 2740 comprises two N-channel transistors 2746 and 2744 connected in series between a read bit line ($RBL_1$) node 2750 and ground. The gate terminal of transistor 2746 is coupled to the bit line 2708, and the gate terminal of transistor 2744 is coupled to the enable signal EN conveyed on node 2718. A P-Channel transistor 2742 couples the read bit line node 2750 to VDD when the enable signal EN coupled to its gate terminal is inactive (e.g., low). When the enable signal EN is active (e.g., high), the read bit line node 2750 will discharge at different rates based on the voltage of the bit line 2708. A second time-to-discharge circuit 2752 is coupled to the read bit line node 2750 and driven by the strobe clock signal STROBE CLK conveyed on node 2734, to generate a digital output signal $OUT_1$ (conveyed on node(s) 2756) reflective of the discharge rate of the read bit line 2750, which in turn is reflective of the voltage on $BL_1$ (i.e., bit line 2708).

Figure 28:
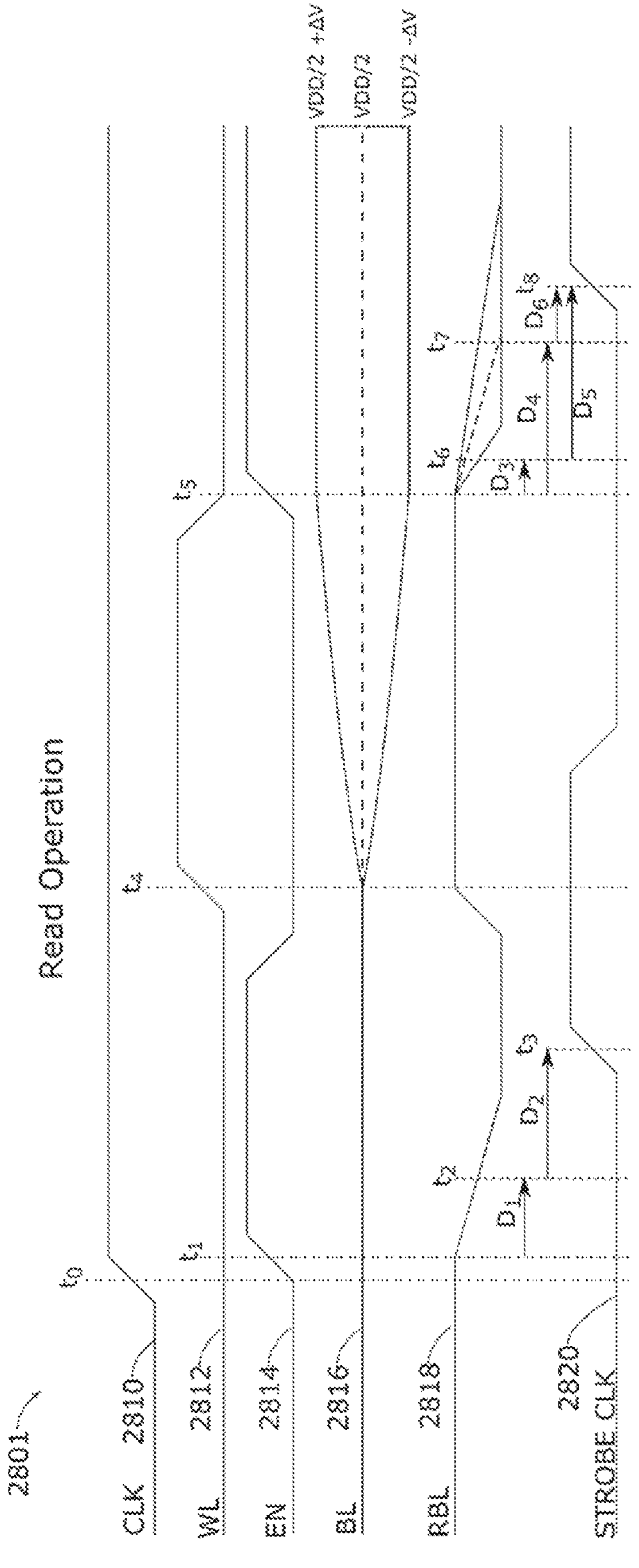
FIG. 28 shows a corresponding read operation in accordance with at least some embodiments, including the embodiment shown in FIG. 27.

Turning now to FIG. 28, block diagram 2801 illustrates example waveforms corresponding to the configuration shown in FIG. 27, and which illustrates self-referencing operation in which a calibration is first performed before a read operation to determine a respective reference delay for each respective column, and then a respective memory cell for each respective column is accessed and compared to the respective reference delay to determine whether the respective cell being read is a “0” or a “1.”

In the block diagram 2801, the waveform 2810 represents a clock signal CLK that may correspond to an external or internal timing signal initiating a memory read cycle. The WL waveform 2812 corresponds to a selected word line, such as word line $WL_0$ (node 2702) or word line $WL_n$ (node 2704). The EN waveform 2814 corresponds to the enable signal EN conveyed on node 2718. The BL waveform 2816 corresponds to one of the bit lines, such as bit line $BL_0$ (node 2706) or bit line $BL_1$ (node 2708). The RBL waveform 2818 corresponds to one of the read bit lines, such as read bit line $RBL_0$ (node 2730) or read bit line $RBL_1$ (node 2750). Lastly, the STROBE CLK waveform 2820 corresponds to the strobe clock signal conveyed on node 2734.

The waveforms shown in block diagram 2801 assume the bit lines (e.g., $BL_0$, $BL_1$) have already been equilibrated at VDD/2, and the read bit lines (e.g., $RBL_0$, $RBL_1$) have already been precharged to VDD, both as described above. The waveforms begin at time $t_0$ with the assertion of the clock signal CLK to initiate a memory read cycle. At time $t_1$ the enable signal EN (waveform 2814) is asserted to enable the respective discharge circuits 2720, 2740 to begin discharging the respective read bit lines $RBL_0$, $RBL_1$ coupled to each respective output node 2730, 2750. For ease of discussion, a single bit line, read bit line, and corresponding output will now be discussed, although it should be understood that all such nodes and associated circuits behave similarly. At time $t_2$ the read bit line RBL has fallen to half its initial voltage (or some other predetermined percentage of its initial voltage, as further described below), and at time $t_3$ the strobe clock signal STROBE CLK conveyed on node 2734 is asserted to latch the outputs of the time-to-discharge circuits 2732, 2752 in order to determine reference delays $D_1$ and $D_2$ corresponding to the bit line BL being at the equilibration voltage VDD/2 without any influence of a memory cell (i.e., with the selected word line still inactive). Subsequently the enable signal EN is de-asserted to again precharge the RBL line. The operation thus far accomplishes a calibration operation to determine the respective pair of reference delays $D_1$ and $D_2$ for each respective bit line BL.

Then, at time $t_4$, the selected word line WL is asserted (e.g., driven high) to couple the charge from the corresponding memory cell onto the bit line BL, which causes the voltage on the BL to either rise or fall by an amount “ΔV” corresponding largely to the charge stored in the memory cell and the capacitance of the bit line BL. At time $t_0$ the enable signal EN is re-asserted to discharge the read bit line RBL at a rate corresponding to the voltage of the associated bit line BL. In a case where the bit line BL voltage is VDD/2+ΔV, time $t_6$ corresponds to the time when the read bit line RBL has fallen to half its initial voltage. In the case where the bit line BL voltage is VDD/2−AV, time $t_7$ corresponds to the time when the read bit line RBL has fallen to half its initial voltage. Time $t_7$ occurs later than time $t_0$ because the bit line voltage is lower, and thus the gate drive of the transistor discharging the read bit line (e.g., transistor 2726) is lower. At time $t_0$ the strobe clock signal STROBE CLK is asserted to latch the outputs of the time-to-discharge circuits 2732, 2752 in order to determine the time when the associated read bit line RBL falls to half its initial value (i.e., to determine relative delays $D_3$ and $D_5$ in the case where the bit line BL voltage is VDD/2+ΔV, or to determine relative delays $D_4$ and $D_6$ in the case where the bit line BL voltage is VDD/2−ΔV). The measured delay (i.e., $D_3$ or $D_4$) can be compared to the reference delay $D_1$ to determine whether the memory cell being read is a “1” or a “0”.

The above embodiment is described in the context of using a time-to-discharge circuit to determine when the voltage of a read bit line RBL falls to half its initial voltage, as a result of low swing signaling on the bit line itself (i.e., rather than measuring the time $t_0$ discharge the bit line). These principles may be applied on a broader scale to measure signal nodes other than a read bit line, including performing a calibration delay measurement followed by a read delay measurement, and comparing the measured read delay against the measured calibration delay to determine the stored data value(s).

Turning now to FIG. 34, an embodiment 3400 of a time-to-transition circuit is shown in block diagram form. As introduced in FIG. 15 described above, such a circuit can correlate a delay time $t_0$ a voltage value. Moreover, the embodiment 3400 can be utilized to measure a calibration delay and measure a read delay, and compare the measured read delay against the measured calibration delay to determine the stored data, as described above. In this embodiment an input signal 3402 is coupled to an input stage 3404, whose output 3406 is coupled to an input of a delay line 3408. The delay line 3408 has a parallel outputs 3410, each respectively corresponding to a respective stage of the delay line 3408. These outputs 3410 are coupled to the inputs of capture latches 3412, which are latched by a STROBE signal 3420 to generate corresponding latch outputs 3414. A detect, store and compare block 3416 receives the latch outputs 3414 and, in response to control signals 3422, generates an output 3418.

In some embodiments, the delay line 3408 may include a serial chain of non-inverting buffers, each having a respective output that is coupled to an input of an individual flip flop (e.g., latch, register) within the capture latches 3412. In some embodiments, the delay line 3408 may include a serial chain of inverting buffers, with the capture latches 3412 having alternating true and complementary outputs to present all such outputs with the same polarity.

The input stage 3404 can be configured to set the "predetermined percentage" described above, and also to "condition" the input signal 3402 to provide a better output signal 3406 to the delay line 3408. For example, the input threshold of input stage 3404 can be configured to a desired value, such as the midpoint voltage between power and ground, or offset to a value higher or lower than the midpoint, or a predetermined percentage of the initial voltage of an input signal (e.g., a read bit line or other signal node), as desired. This can be achieved by appropriate sizing of an input inverter, or by using a comparator with an appropriate reference voltage, or by using other techniques. As another example the input stage 3404 can "sharpen" a slowly-changing input signal 3402 by generating an output signal 3406 having a sharper (i.e., more precise) timing edge, irrespective of the input threshold value.

During a calibration measurement operation, the detect, store and compare block 3416 receives the latch outputs 3414 (as latched by the STROBE signal 3420), determines which capture latch output 3414 reflects the delay time of the "calibration" input signal through the delay line (i.e., determines which latch output 3414 corresponds to the change from one data value to the other data value as the calibration input signal propagated through the delay line 3408), then saves that determined value. During a subsequent read measurement operation, the detect, store and compare block 3416 again receives the latch outputs 3414 as latched by the STROBE signal 3420, determines which capture latch output 3414 reflects the delay time of the "read" input signal through the delay line, then compares that value against the saved value to determine the value of the output signal 3418.

In some embodiments, a calibration functionality is not utilized. In such embodiments, the detect, store and compare block 3416 can determine which capture latch output 3414 reflects the delay time of the "read" input signal through the delay line, then generate an output signal 3418 reflective of that value.

Figure 35:
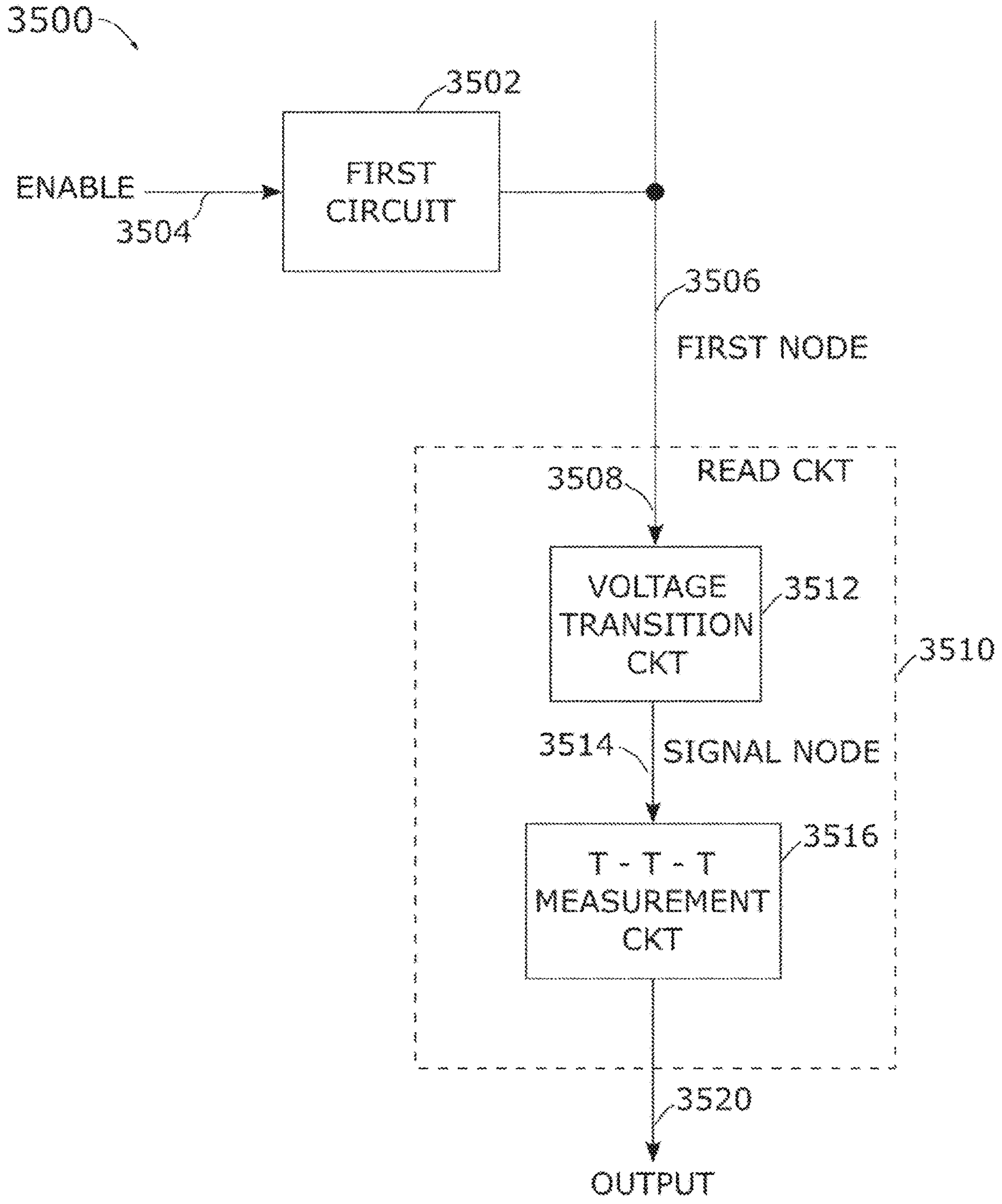
FIG. 35 shows, in block diagram form, a circuit configuration in accordance with at least some embodiments.

Referring now to FIG. 35, an embodiment 3500 is depicted which represents a generalized block diagram of a read circuit not unlike that described above in regards to FIG. 27. In this embodiment, a first circuit 3502 is coupled to a first node 3506. When enabled by the ENABLE signal 3504, the first circuit 3502 couples a first signal onto the first node 3506. A read circuit 3510 includes a voltage transition circuit 3512 and a time-to-transition measurement circuit 3516. The first node 3506 is coupled to an input 3508 of the voltage transition circuit 3512, which causes a voltage transition on signal node 3514 in response to the first signal coupled onto the first node 3506. The time-to-transition measurement circuit 3516 can measure the delay of the transitioning signal on the signal node 3514, and generate an output signal 3520 accordingly.

In some embodiments, the voltage transition circuit 3512 can be viewed as a sensing or discharge circuit (e.g., the read discharge circuit 2720 depicted in FIG. 27), and can also include, in some embodiments, initialization circuits (e.g., equilibration and precharge circuits). In some embodiments, the time-to-transition measurement circuit 3516 can be a time-to-discharge circuit (e.g., such as that described in regards to FIG. 15 or FIG. 34) or a time-to-charge circuit. In some embodiments, the first circuit 3502 can be a memory cell, such as a 1T DRAM memory cell 201 as shown in FIG. 2.

As can be appreciated, the various circuits and techniques described herein utilize a variable delay as an indicator of a value stored in a memory cell. Consequently, the time delay can be viewed as a state variable that provides information about the data value stored in the memory, and the circuits described herein may be viewed as "time-based circuits."

Figure 29:
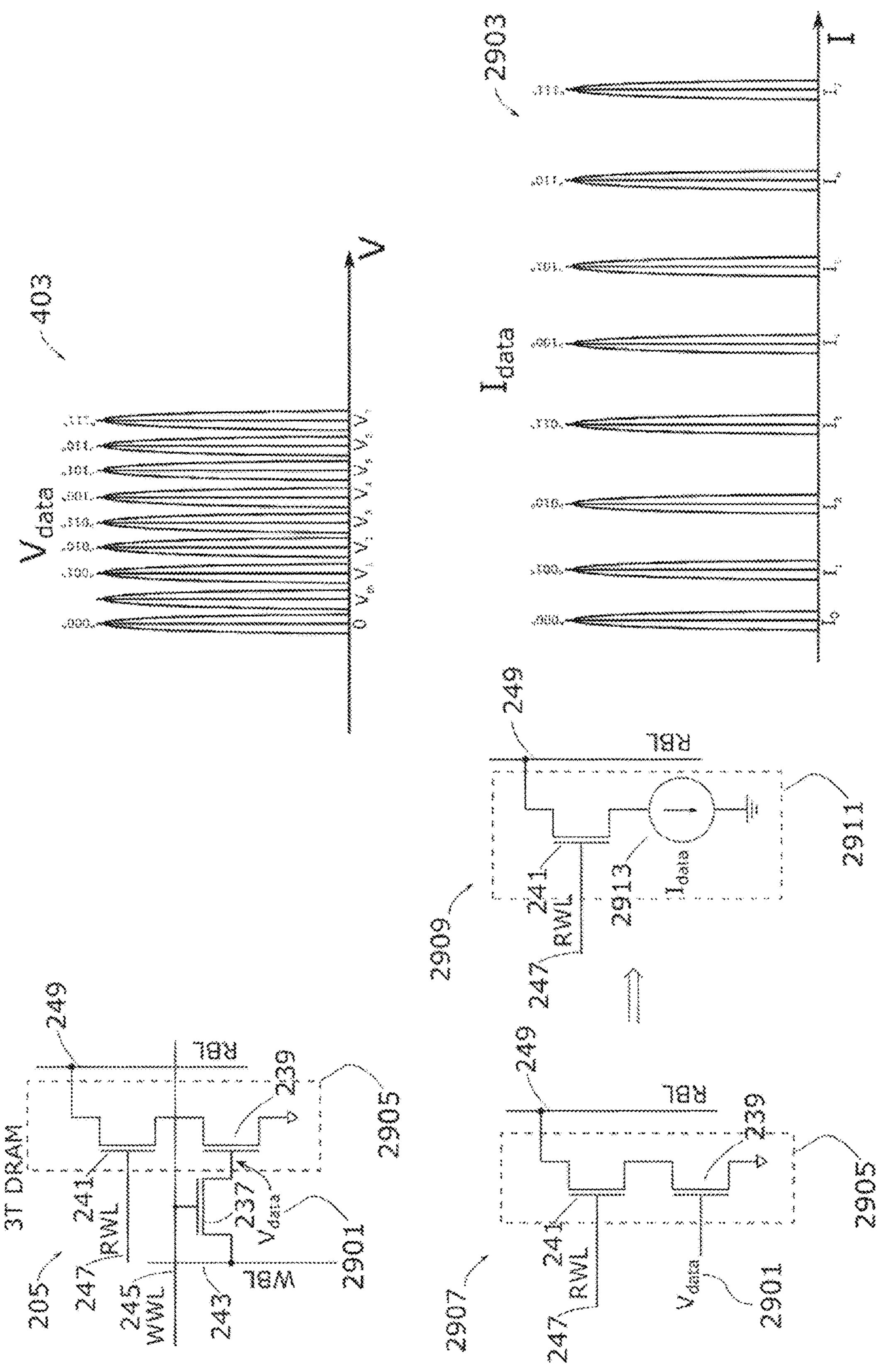
FIG. 29 shows a circuit configuration and corresponding read characteristics in accordance with at least some embodiments.

Turning now to FIG. 29, a three transistor (3T) DRAM memory cell 205 in accordance with various embodiments is discussed. The magnitude of a current that discharges a read bit line may be sensed to discern the value stored within the memory cell 205.

In this example, eight logical values 0-7 for $V_{data}$, represented in binary nomenclature in graph 403, may be stored into the 3T DRAM cell 205. In graph 403, a voltage value is represented along the x-axis. Each logical value is stored as a different voltage value. As is discussed earlier in regards to FIG. 4, the voltage value representing each logical value may not be exactly zero or "$V_1$", "$V_2$", etc. Instead, the voltage value may be within some voltage value above or below the targeted voltage values of zero, "$V_1$", "$V_2$", for example. Accordingly, voltage values that may register as a particular logical value are represented as an individual bell curve in graph 403. Each bell curve captures a potential distribution of voltage values that may correspond to a respective logical value.

The manner in which the voltage values are assigned to represent different logical values is not limited to this example and other assigning schemes may be used. That is, the assignment scheme between a voltage value and a corresponding logical value is discussed for the purpose of illustrating an embodiment and is not meant to be limiting of the type of assigning scheme that may be used. For example, the logical value "0" may be stored as a voltage value "0" while the logical value "7" is stored as a voltage value "$V_7$". Graph 403 captures one example way in which different voltage values may be used to represent different logical values. Additionally, any assigning scheme discussed in the document is considered an example and shall not constitute a limiting example.

During a read operation of the 3T DRAM cell 205, the read word line RWL 247 goes high, turning on transistor 241 and coupling the read bit line RBL to ground through the access transistor 241 in series with the storage transistor 239. The amount of current ($i_{DS}$) flowing through the storage transistor 239 depends on the voltage value of $V_{data}$ 2901 stored on its gate. In other words, storage transistor 239 may be viewed as a current source 2913 having a magnitude corresponding to the voltage value of $V_{data}$ 2901 stored on its gate. Thus, the two series-connected transistors 241 and 239 depicted in diagram 2907 as series structure 2905 may be viewed as the corresponding series structure 2911 depicted in diagram 2909 which includes variable current source 2913 taking the place of storage transistor 239. Since in this configuration the current flowing through the variable current source 2913 flows from the read bit line RBL to ground, the variable current source 2913 is also referred to herein as a variable current sink 2913.

The magnitude of the variable current source 2913 depends on the voltage value of $V_{data}$ 2901. Recall the different $V_{GS}$ curves shown in graph 305 for different values of $V_{GS}$. The higher voltage value of $V_{GS}$ (e.g., curve 325) corresponds to a larger magnitude of current than a lower voltage value of $V_{GS}$ (e.g., curve 317). This is represented in diagram 2903, which shows respective magnitudes of current ($I_0, I_1, \ldots, I_7$) corresponding to the respective voltage value ($V_0, V_1, \ldots, V_7$) of $V_{data}$ 2901. Each such current value is represented as an individual bell curve in graph 2903 as a result of the potential distribution of the respective voltage values.

The next several figures depict embodiments for determining the magnitude of the selected memory cell current (i.e., the value of variable current source 2913), which can then be used to determine the voltage value of $V_{data}$ stored in the memory cell, which in turn can be correlated to a logical value stored in the memory cell.

Figure 30:
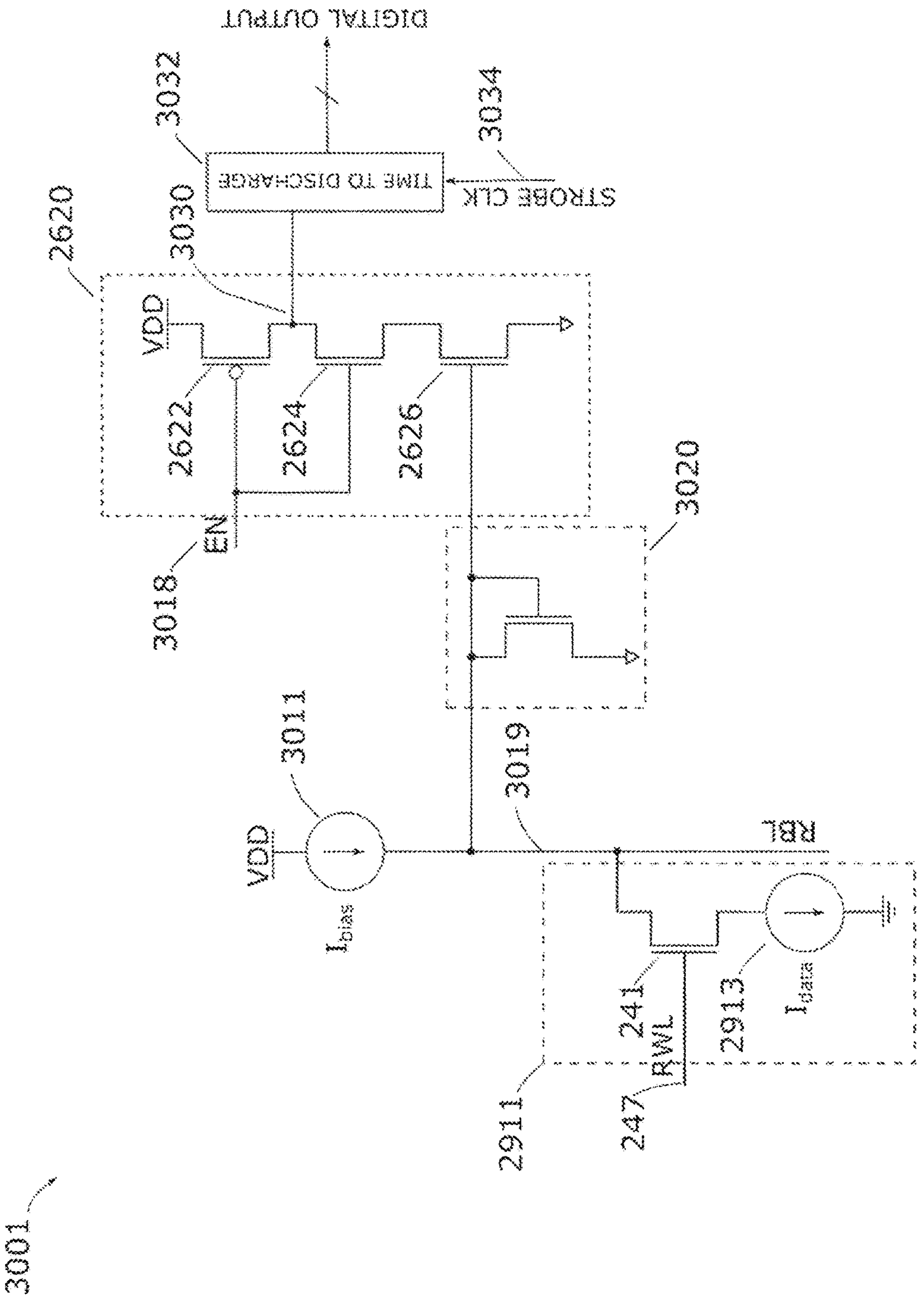
FIG. 30 shows, in partial block diagram form, a circuit configuration in accordance with at least some embodiments.

Referring now to FIG. 30, an embodiment 3001 is shown for determining the magnitude of the selected memory cell current which utilizes a time $t_0$ discharge circuit. In this configuration the read bit line RBL 3019 is loaded with a fixed bias current source 3011 connected to the upper power supply VDD. When the read word line RWL 247 is activated (e.g., driven high), the variable current sink 2913 in the selected memory cell is coupled to the read bit line RBL 3019 and sinks current from the read bit line RBL 3019. The fixed bias current source 3011 provides a source of current into the read bit line RBL 3019. The interaction of the fixed bias current source 3011, the variable current sink 2913, and the real-world characteristics of the read access transistor 241 combine to determine a resulting voltage on the read bit line RBL 3019. In particular, the voltage of the read bit line RBL 3019 will largely be determined by the larger of the fixed bias current 3011 and the variable current sink 2913, since the larger of these two currents will overpower the smaller current and drive the voltage of the read bit line RBL 3019 toward the larger magnitude current device.

Optional current divider transistor 3020 can be included to limit the voltage excursion on the read bit line 3019, as well as to more deterministically set the voltage of the read bit line 3019 based upon the difference in magnitude between the fixed bias current 3011 and the variable current sink 2913. In other words, the voltage of the read bit line 3019 will increase as the net current flowing into the read bit line 3019 increases, because the diode-connected transistor 3020 will operate higher on its characteristic I-V curve.

The voltage of the read bit line RBL 3019 may be determined by using a time $t_0$ discharge technique as described earlier herein. In this embodiment, a sensing circuit (i.e., discharge circuit) 2620 comprises two N-channel transistors 2626 and 2624 connected in series between a discharge node 3030 and ground. The gate terminal of transistor 2626 is coupled to the read bit line 3019, and the gate terminal of transistor 2624 is coupled to an enable signal EN conveyed on node 3018. A third P-Channel transistor 2622 couples the discharge node 3030 to VDD when the enable signal EN coupled to its gate terminal is inactive (e.g., low). Similar to the description in regards to FIG. 8, when the enable signal EN is active (e.g., high), the discharge node 3030 will discharge a rate based on the voltage of the read bit line 3019, which voltage, as mentioned above, likewise depends on the current $I_{data}$ flowing through variable current sink 2913 within the selected memory cell.

A time to discharge circuit 3032, such as described herein in regards to FIG. 15 or FIG. 34, may be coupled to the discharge node 3030 and driven by a strobe clock signal STROBE CLK conveyed on node 3034, to generate a digital output reflective of the magnitude of the current through the selected memory cell 2911.

Figure 31:
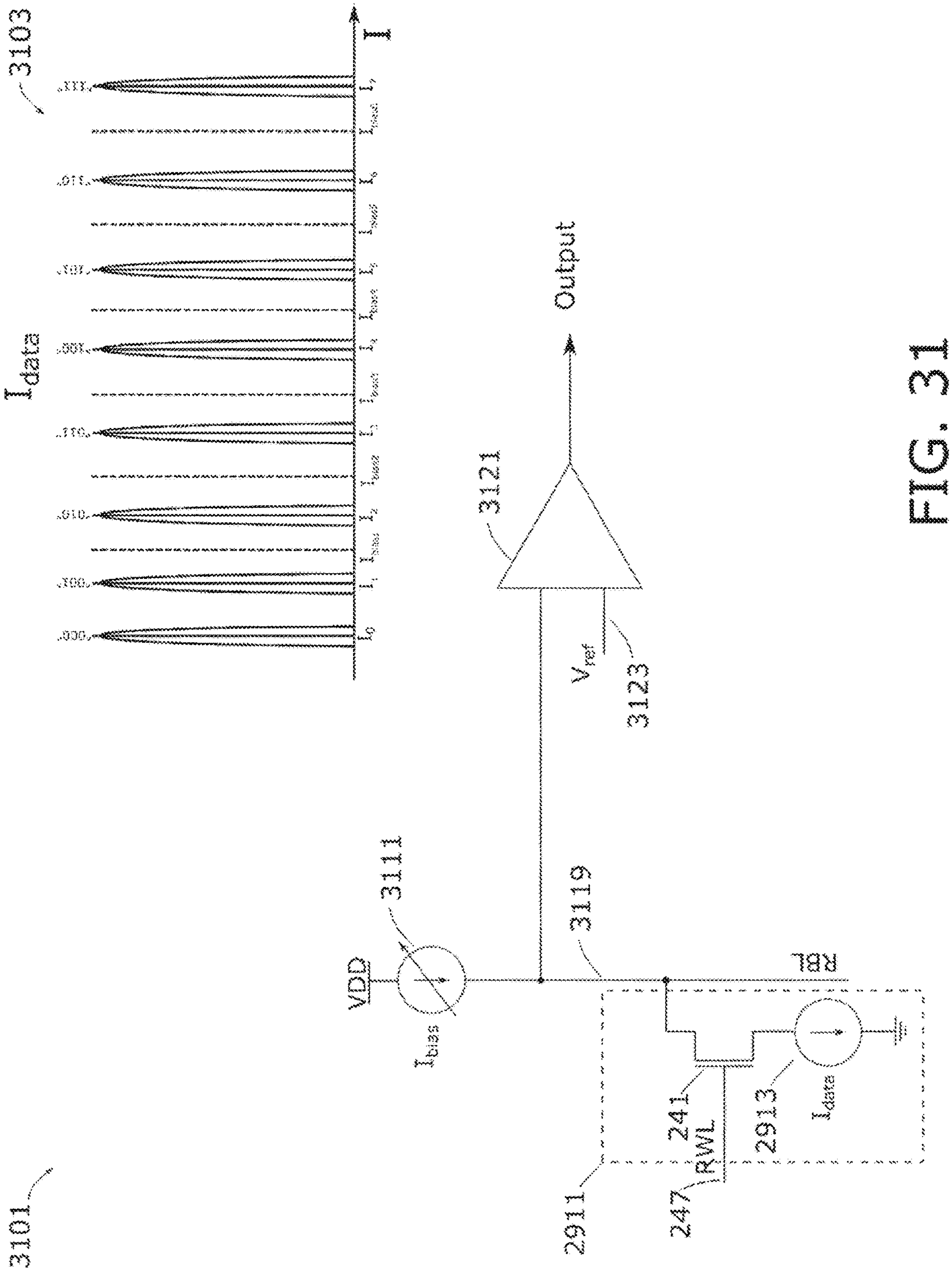
FIG. 31 shows, in partial block diagram form, a circuit configuration in accordance with at least some embodiments.

Referring now to FIG. 31, an embodiment 3101 is shown for determining the magnitude of the selected memory cell current, which utilizes a variable bias current load device and a comparator. In this embodiment the read bit line RBL 3119 is loaded with a variable bias current source 3111 connected to the upper power supply $V_{DD}$. When the read word line RWL 247 is driven high, the variable current source 2913 in the selected memory cell is coupled to the read bit line RBL 3119 and sinks current from the read bit line RBL 3119, while the variable bias current 3111 sources current into the read bit line RBL 3119. The relative magnitudes of the variable bias current source 3111 and the variable current source 2913 largely determine a resulting voltage on the read bit line RBL 3119, since the larger of these two currents will overpower the smaller current and drive the voltage of the read bit line RBL 3119 toward the larger current source. For example, if the magnitude of the variable bias current 3111 is greater than the magnitude of the variable current source 2913, the voltage of the read bit line RBL 3119 will increase (since there is a net current flowing into the read bit line RBL 3119) until the voltage either reaches the VDD voltage level, or until the magnitude of the variable bias current 3111 decreases due to the non-ideality of its constant current therethrough with diminishing voltage thereacross. Conversely, if the magnitude of the variable bias current 3111 is smaller than the magnitude of the variable current source 2913, the voltage of the read bit line RBL 3119 will decrease (since there is a net current flowing out of the read bit line RBL 3119) until the voltage either reaches the ground (e.g., $V_{SS}$) voltage level, or until the magnitude of the variable current source 2913 decreases due to the non-ideality of its constant current value with diminishing voltage (e.g., corresponding to transistor 239 no longer operating in the saturated region, but rather, as its $V_{DS}$ decreases, operating in the linear region).

Since the voltage of the read bit line RBL 3119 is essentially driven to either a relatively high voltage (near VDD) or a relatively low voltage (near ground) based upon the larger of the two current sources, the voltage of the read bit line RBL 3119 can be determined by a simple comparator 3121 and a reference voltage generally between VDD and ground. The read bit line RBL 3119 is compared to a reference voltage 3123, and the comparator's output indicates whether the read bit line is higher or lower than the reference voltage 3123. In some embodiments, the reference voltage can be approximately at the midpoint between $V_{DD}$ and ground.

The magnitude of the variable bias current source 3111 can be changed to successive values, and a new comparison performed for each successive value, to determine the value of the current through the variable current source 2913 of the selected memory cell. This is depicted in diagram 3103, which shows values of the bias current $I_{bias}$ having respective magnitudes ($I_{bias1}, I_{bias2}, \ldots, I_{bias6}$) between adjacent pairs of cell current magnitudes. For example, if the variable bias current 3111 is set to a value of $I_{bias3}$ (which has a magnitude between $I_3$ and $I_4$), the comparator 3121 output will indicate whether the memory cell current (i.e., variable current source 2913) is either less than $I_{bias3}$ (i.e., either $I_0$, $I_1$, $I_2$, or $I_3$), or greater than $I_{bias3}$ (i.e., either $I_4$, $I_5$, $I_6$, or $I_7$). Similarly, if the variable bias current 3111 is set to a value of $I_{bias4}$ (which has a magnitude between $I_4$ and $I_5$), the comparator 3121 output will indicate whether the memory cell current is either less than or greater than $I_{bias4}$.

In some embodiments, the variable bias current source 3111 can be incrementally varied from the lowest value, $I_{bias1}$, to the highest value, $I_{bias6}$, to determine the magnitude of the memory cell current through the variable current source 2913. Such a technique may be viewed as a linear search through all possible values of the bias current, $I_{bias}$, to determine the memory cell current. In some embodiments, the variable bias current 3111 can be varied in a binary search fashion to decrease the number of required comparisons. In such a binary search, the $I_{bias}$ current can be set to the middle value within a range of possible values and a comparison performed. The result of the comparison determines which value of bias current to use for the next comparison. Each comparison eliminates half the remaining choices, so the total number of comparisons can be reduced substantially. In the case of 8 possible current magnitudes, a linear search may require up to 7 comparisons before determining the memory cell current, whereas a binary search requires only 3 comparisons. An example binary search method is further described below in regards to FIG. 33. It should be noted that other binary search techniques are contemplated, including varying a voltage magnitude instead of a current magnitude. For example, a voltage applied to a transistor can be varied instead of varying a current. In another example for a traditional NVM memory, the word line voltage can be varied using a binary search rather than an incremental monotonic increase or decrease in word line voltage during a read operation, to reduce the number of comparisons required to determine the data stored in a multi-level memory cell. Moreover, a binary search can be utilized in any embodiment described above in which the word line voltage or other sensing-related circuit node voltage is shown as monotonically increasing or decreasing.

Figure 32:
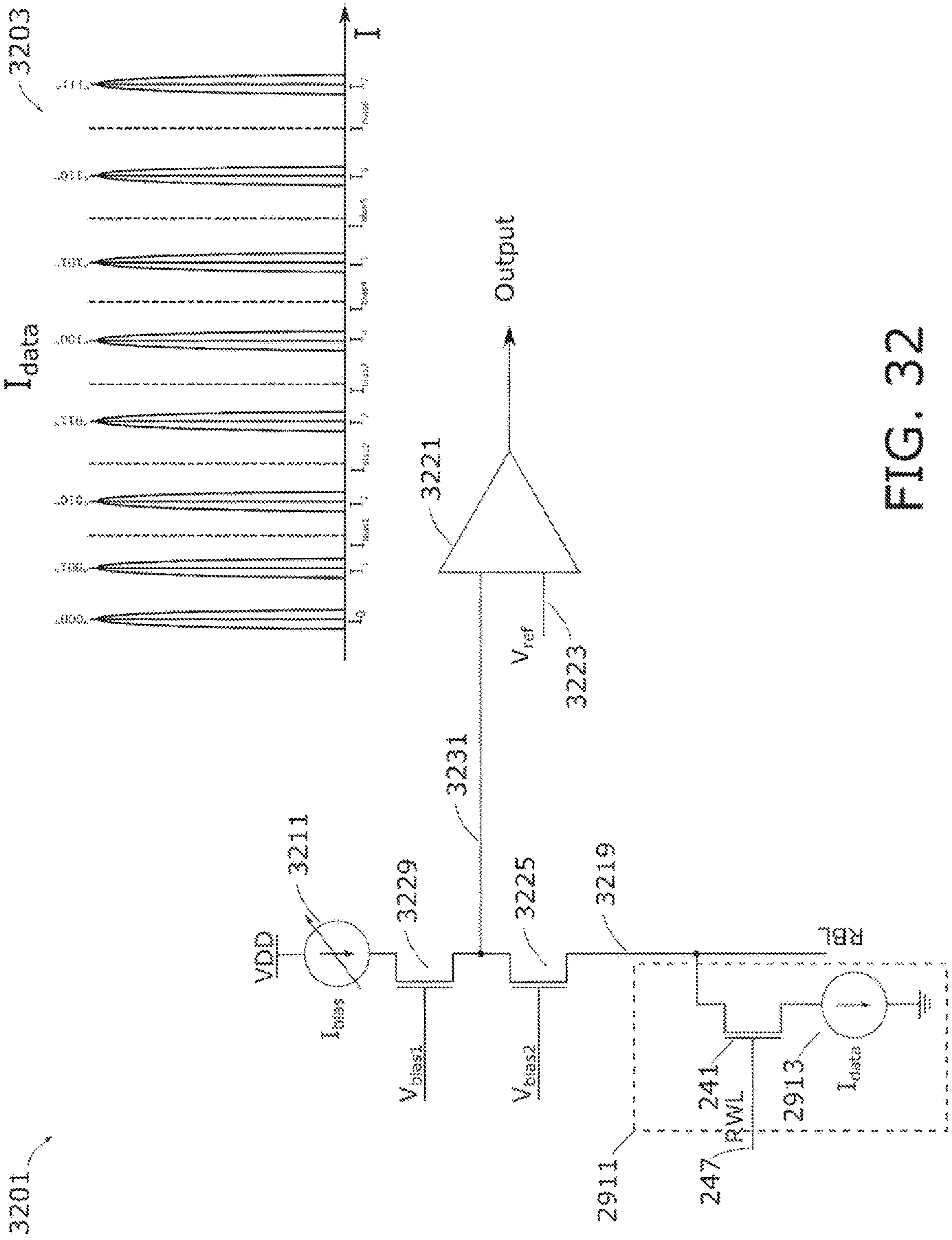
FIG. 32 shows, in partial block diagram form, a circuit configuration in accordance with at least some embodiments.

Referring now to FIG. 32, another embodiment 3201 is shown which utilizes a variable bias current load device and a comparator, but which also includes a pair of cascode transistors for limiting the voltage excursion on the sense line input to the comparator. In this embodiment a variable bias current source 3211 is connected to the upper power supply $V_{DD}$, and a first cascode transistor 3229 is coupled between the variable bias current source 3211 and a sense node 3231. A second cascode transistor 3225 is coupled between the sense node 3231 and the read bit line RBL 3219. A comparator 3221 compares the sense node 3231 against a reference voltage 3223 and generates a comparator output accordingly.

As before, when the read word line RWL 247 is driven high, the variable current source 2913 in the selected memory cell sinks current from the read bit line RBL 3219, while the variable bias current source 3211 sources current into the sense node 3231 and into the read bit line RBL 3219. The larger of these two currents will overpower the smaller current and drive the voltage of the sense node 3231 toward the larger current source. But the two cascode transistors 3225, 3229 serve to limit the voltage excursion of the sense node 3231 and the read bit line RBL 3219. For example, if the magnitude of the variable bias current source 3211 is greater than the magnitude of the variable current source 2913, the voltage of the sense node 3231 will increase, but will stop when the voltage of the sense node 3231 reaches a value that is a threshold voltage below the $V_{bias1}$ voltage on the gate of the cascode transistor 3229. Similarly, the voltage of the read bit line RBL 3219 will increase, but will stop when its voltage reaches a value that is a threshold voltage below the $V_{bias2}$ voltage on the gate of the cascode transistor 3225. Since both the read bit line RBL 3219 and the sense node 3231 can have very high capacitance, limiting the voltage excursion can improve cycle-to-cycle performance.

The cascode transistors have an additional beneficial aspect of limiting the voltage extremes across both current sources, which improves the ideality of the constant current value. For example, the cascode transistor 3225 limits the upper value of voltage on the read bit line RBL 3219 to the magnitude of $V_{bias2}$ minus the threshold voltage of transistor 3225. Without the cascode transistor 3225 present, the maximum voltage on the read bit line 3219 (and correspondingly the voltage across the variable current source 2913) would increase to a much higher voltage. By including the cascode transistor 3225, the maximum voltage on the read bit line 3219 (and correspondingly the voltage across the variable current source 2913) remains within a much smaller range, and which improves the constant current ideality of the variable current source 2913.

During operation, the voltage of the sense node 3231 is driven to a voltage that is either somewhat higher than the reference voltage 3223, or somewhat lower than the reference voltage 3223. The comparator 3221 compares the sense node 3231 against the reference voltage 3223 to generate an output that indicates whether the sense node 3231 is higher or lower than the reference voltage 3223.

As before, the magnitude of the variable bias current 3211 can be changed to successive values, and a new comparison performed for each successive value, to determine the value of the current through the variable current source 2913 of the selected memory cell (represented by series-pair 2911). This is depicted in diagram 3203, which shows values of the bias current $I_{bias}$ having respective magnitudes ($I_{bias1}$, $I_{bias2}$, . . . , $I_{bias6}$) between adjacent pairs of possible values of cell current. In some embodiments, the variable bias current 3211 can be incrementally varied to implement a linear search to determine the memory cell current. In some embodiments, the variable bias current 3211 can be varied in a binary search fashion to decrease the number of required comparisons.

Figure 33:
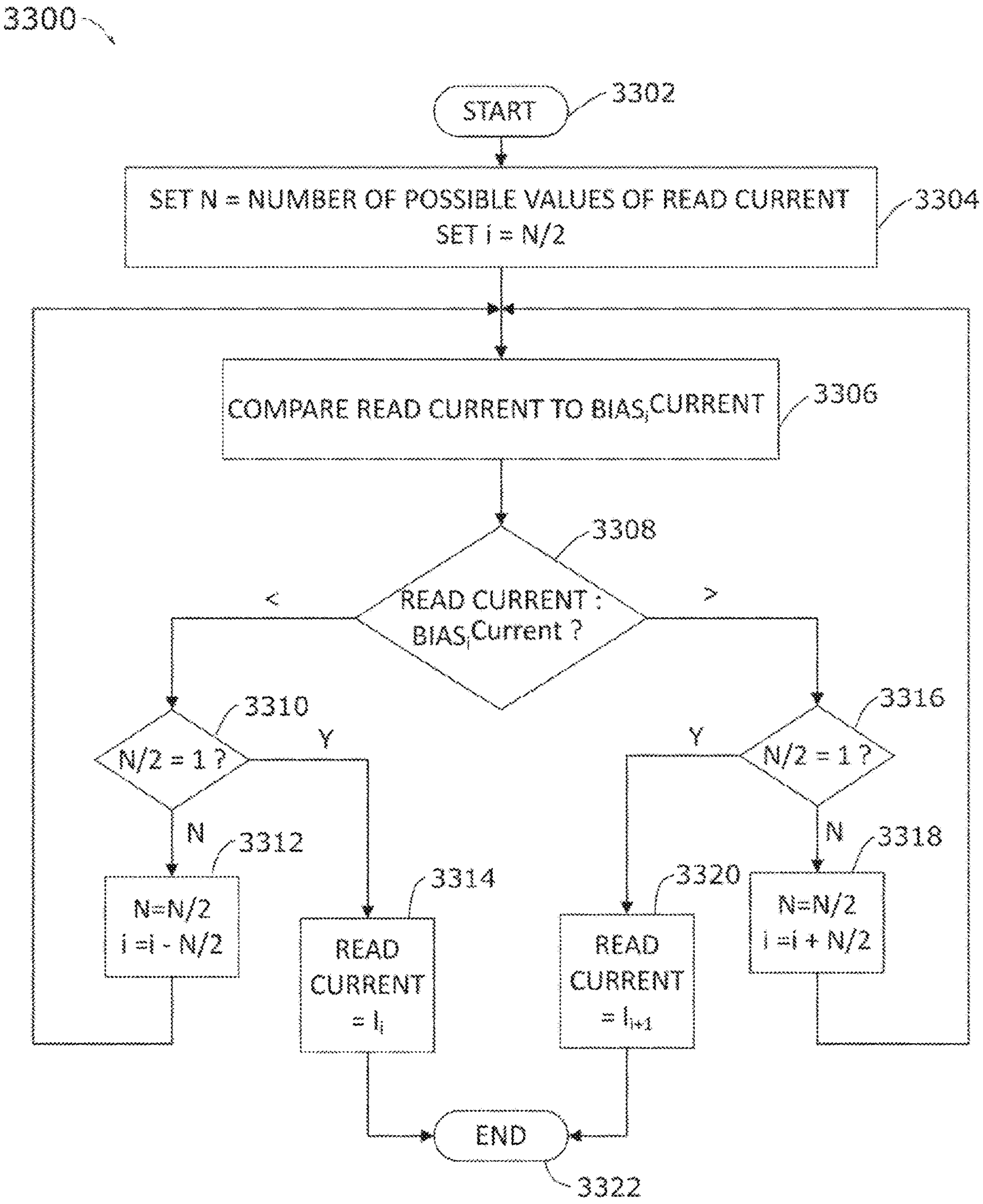
FIG. 33 shows a flowchart of an example method in accordance with at least some embodiments.

Referring now to FIG. 33, a generalized example method 3300 for performing such a binary search is described. In this example, assume eight possible values of the read current, being $I_1$, $I_2$, . . . , $I_8$, and seven values of the bias current, each interposed between adjacent pairs of possible read current values, being $I_{bias1}$, $I_{bias2}$, . . . , $I_{bias7}$. The procedure begins at START block 3302. At block 3304, a variable N is set to the number of possible values of read current, which is set to a value of eight in this example. Also, a variable i is set to N/2, which in this example is thus set to a value of four.

Flow then proceeds to block 3306, which compares the read current to the $I_{biasi}$ current. At this point the selected bias current is the middle value of bias current, which is $I_{bias4}$. If the read current is less than the $I_{biasi}$ current, decision block 3308 directs the flow to block 3310, which performs a check to determine whether the binary search is complete. At this point, of course, it is not complete, as N has a value equal to 8. Flow therefore proceeds to block 3312, which sets N equal to half its previous value, and sets i equal to its previous value minus N/2. This has the effect of reducing by half the number of remaining possible values of read current, and setting a new bias current in the middle of this new range of remaining possible values. Under the assumptions in this example, at this point the value of N=4, the value of i-2, and the selected bias current is now $I_{bias2}$. Flow then returns to block 3306 to perform a comparison of read current against the $I_{bias2}$ current.

If the read current is greater than the $I_{bias2}$ current, decision block 3308 directs the flow to block 3316, which performs a check to determine whether the binary search is complete. Under the assumptions thus far, at this point N/2 has a value equal to 2, and the search is not complete. Flow therefore proceeds to block 3318, which sets N equal to half its previous value, and sets i equal to its previous value plus N/2. This has the effect of reducing by half the number of remaining possible values of read current, and setting a new bias current in the middle of this new range of remaining possible values. Under the assumptions thus far, at this point the value of N=2, the value of i=3, and the selected bias current is now $I_{bias3}$.

Flow then returns to block 3306 to perform another comparison of read current to the $I_{biasi}$ current (e.g., now set to $I_{bias3}$). If the read current is less than the $I_{biasi}$ current, decision block 3308 directs the flow to block 3310 to determine whether the binary search is complete. At this point N/2 has a value equal to 1, and the search is complete. Flow therefore proceeds to block 3314, which deems the read current has a value of $I_{read(i)}$ (e.g., $I_{read3}$ under this example) and the procedure stops at END block 3322. Alternatively, if the read current is greater than the $I_{biasi}$ current (e.g., now set to $I_{bias3}$), decision block 3308 directs the flow to block 3316, which likewise determines that the binary search is complete. Flow therefore proceeds to block 3320, which deems the read current has a value of $I_{read(i+1)}$ (e.g., $I_{bias4}$ under this example) and the procedure stops at END block 3322.

In an embodiment, the binary search may be used for determining more than one bit of information stored in a memory cell. In an embodiment, determining the more than one bit of information may include reading an output of a read port of the memory cell. In an embodiment, the read port has an impedance that varies in accordance with, and is indicative of, a data value stored in the memory cell. In an embodiment, the data value is one of at least three different data values that the memory cell is capable of storing. In other words, the method, shown in FIG. 33, efficiently narrows down the possible read current values through successive comparisons, allowing for determination of stored data values in the memory cell, using the binary search.

In an embodiment, the memory cell may be at least one of: volatile memory cell and a non-volatile memory cell. In an embodiment, the output of the read port is configured to perform a function operation comprising at least one of: an arithmetic operation, a logical operation, a logistic operation, an activation operation, and the like.

In an embodiment, the memory cell corresponds to a memory cell of a plurality of memory cells. In an embodiment, the binary for determining the information stored in the plurality of memory cells performed, depends on the respective value in each of the plurality of memory cells. In another embodiment, the binary search for determining the information stored in the plurality of memory cells requires a logarithmic base two of possible different data values stored in the memory cells. In an embodiment, the binary search is performed by applying a variable reference coupled to the read port of the memory cell. In an embodiment, the variable reference is a variable reference bias current.

Many details of such a binary search can be changed without departing from the general technique. For example, the subscript notations for N possible values can run from 1 to N, or can run from 0 to N−1, or some other scheme, and the specific details of certain method blocks are modified accordingly. Nevertheless, such a binary search functions to eliminate half the possible values with each comparison, and to reset the reference current (i.e., bias current) to a new value at or near the midpoint of the remaining range of possible values before the next comparison.

Several embodiments described herein, such as embodiments in FIGS. 9, 10, 12, etc., may be used to implement a function such as an activation function or a threshold function or a weighted function or a logistic function. That is, in several embodiments discussed herein, an activation function may define the output of a storage node where $V_{data}$ is stored, given an input or set of inputs. The particular activation function or logistic function that applies are several and varied. Further, several embodiments discussed herein may be used to perform operations that are arithmetic or logical.

As can be appreciated, many of the embodiments described herein incorporate a memory cell having an impedance that varies in accordance with the data value stored therein (i.e., a variable impedance memory cell). The data value is read from the memory cell based upon a variable time delay of a related circuit node (i.e., signal node), for example, a bit line, a read bit line, etc. In some embodiments, a signal node is discharged at a rate that varies in accordance with the data value stored in the memory cell, and the time for that signal node to discharge to a particular value can be measured, and the data value inferred from that time-to-discharge measurement. Such time-to-discharge read techniques can be utilized with many types of memory circuits, as noted herein, and particularly to volatile and non-volatile memory technologies, including PN Junction memory devices, resistive memory devices, magnetoresistive memory devices, and spin-torque memory devices, and further including memory devices based upon silicon, carbon (e.g., carbon nanotubes), or other non-silicon semiconductor materials. In addition, the teachings herein regarding time-to-discharge read techniques and corresponding circuits may also be applied to analogous time-to-charge read techniques and corresponding circuits, such as, for example, in an embodiment having a P-type transistor whose source terminal is coupled to an upper power supply node instead of an N-type transistor whose source terminal is coupled to a lower power supply node. Consequently, such time-to-discharge and time-to-charge techniques and embodiments described herein may collectively be viewed as "time-to-transition" techniques in which a circuit (e.g., a read circuit, a memory cell selection circuit, etc.), effects a voltage transition of one node (e.g., a signal node) at a variable rate corresponding to the voltage of another node. In various embodiments, the signal node can be a bit line, a read bit line, and/or other suitable circuit node. In some embodiments, such a technique includes determining a variable time delay of a signal node voltage change corresponding to a variable impedance of a selected memory cell or other functional circuit. In some embodiments, such a technique includes determining a variable time delay of a signal node voltage change corresponding to the voltage of a first node that results from a first circuit coupling a signal value onto the first node. In some embodiments the first circuit can be a memory cell, such as a 1TDRAM memory cell. In some embodiments the first circuit can be a function circuit.

In some of the embodiments described above, a calibration operation, such as a calibration time-to-transition measurement, is performed before actually sensing data from a selected memory cell. Such a calibration operation can remove the effects of any offsets (e.g., comparator offset voltage, transistor mismatch, resistance mismatch, etc.)

when reading a selected memory cell, because in a given data path the same offsets affect the calibration operation in the same fashion as they affect the read operation. This is particularly helpful with modern processes incorporating extremely scaled transistors operating at very low voltages.

Consistent with the above disclosure, the examples enumerated in the following clauses are specifically contemplated and are intended as a non-limiting set of examples.

Clause 1. A memory device comprising:

a plurality of memory cells, each memory cell having a variable impedance that varies in accordance with a respective data value stored therein; and a read circuit configured to read the data value stored within a selected memory cell based upon a variable time delay determination of a signal node voltage change corresponding to the variable impedance of the selected memory cell.

Clause 2. The memory device according to clause 1, wherein:

each respective data value corresponds to a plurality of bits.

Clause 3. The memory device according to any preceding clause, wherein:

the variable impedance comprises a variable current.

Clause 4. The memory device according to any preceding clause, wherein:

the variable impedance of each memory cell arises from a transistor within the cell whose gate voltage varies with the data written thereto.

Clause 5. The memory device according to any preceding clause, wherein:

the plurality of memory cells comprises volatile memory cells.

Clause 6. The memory device according to any preceding clause, wherein:

the plurality of memory cells comprises non-volatile memory cells.

Clause 7. The memory device according to any preceding clause, wherein:

each memory cell comprises more than one transistor whose respective gate voltage varies with the data written thereto; and said more than one transistor together determine the variable impedance of the memory cell.

Clause 8. The memory device according to any preceding clause, wherein:

the signal node comprises a read bit line node.

Clause 9. The memory device according to any preceding clause, wherein:

the read circuit, together with a selection circuit, is configured to effect a change in voltage of the signal node at a variable rate corresponding to the variable impedance of the selected memory cell, and to read the data value stored within the selected memory cell based upon the variable time delay determination of the signal node voltage change.

Clause 10. The memory device according to any preceding clause, wherein:

the read circuit is configured to discharge the signal node at a variable rate corresponding to the variable impedance of a selected memory cell;

the variable time delay determination of the signal node voltage change comprises a time-to-discharge measurement of the signal node voltage change; and the signal node comprises a read bit line node.

Clause 11. The memory device according to any preceding clause, wherein:

the read circuit is configured to charge the signal node at a variable rate corresponding to the variable impedance of a selected memory cell;

the variable time delay determination of the signal node comprises a time-to-charge measurement of the signal node; and the signal node comprises a read bit line node.

Clause 12. A memory device comprising:

a plurality of memory cells in an array; and a read circuit configured to effect a voltage transition of a signal node at a variable rate corresponding to a data value stored within a selected memory cell, and to perform a time-to-transition measurement of the signal node to determine the data value stored within the selected memory cell.

Clause 13. The memory device according to clause 12, wherein:

each respective data value corresponds to a plurality of bits.

Clause 14. The memory device according to any of clauses 12-13, wherein:

the variable impedance of each memory cell arises from a transistor within the cell whose gate voltage varies with the data written thereto.

Clause 15. The memory device according to any of clauses 12-14, wherein:

the plurality of memory cells comprises volatile memory cells.

Clause 16. The memory device according to any of clauses 12-15, wherein:

each memory cell comprises more than one transistor whose gate voltage varies with the data written thereto; and said more than one transistor together determine the variable impedance of the memory cell.

Clause 17. The memory device according to any of clauses 12-16, wherein:

the read circuit is further configured to perform, before selecting the selected memory cell, a calibration time-to-transition measurement of the signal node to calibrate a reference condition of the signal node; and the read circuit is further configured to compare the time-to-transition measurement against the calibration time-to-transition measurement to determine the data value stored in the selected memory cell.

Clause 18. The memory device according to any of clauses 12-17, wherein the read circuit comprises:

a time-to-discharge measurement circuit having an input coupled to the signal node, and having a delay line that includes a plurality of delay stages, each coupled to a respective one of a plurality of registers that are responsive to a common strobe clock.

Clause 19. The memory device according to any of clauses 12-18, wherein the time-to-discharge measurement circuit further comprises:

an input stage having an input coupled to the signal node, and having an output coupled to the delay line, said input stage configured to generate a timing signal on its output when the signal node has fallen to a predetermined percentage of its initial voltage.

Clause 20. The memory device according to any of clauses 12-19, wherein:

the signal node comprises a read bit line node; and each respective data value corresponds to a plurality of bits.

References to "one embodiment", "an embodiment", "some embodiments", "various embodiments", or the like indicate that a particular element or characteristic is included in at least one embodiment of the invention. Although the phrases may appear in various places, the phrases do not necessarily refer to the same embodiment or example.

Regarding terminology used herein, many of the node names and signal names include subscripts to better distinguish between distinct instantiations of similar nodes and signals (e.g., $WL_0$ and $WL_1$), as such usage is well understood in the art. Nevertheless, any inadvertent use herein without such subscript is not intended to imply any difference relative to a subscripted version of the same name (e.g., Vbias and $V_{bias}$) unless the context clearly requires such. In addition, any use herein of a term including a lower case portion thereof is not intended to imply any difference relative to an upper case version of the same name (e.g., $V_{TH}$ and $V_{th}$) unless the context clearly requires such.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high," and "circuit 10 drives OUT high." Such shorthand phrases for describing circuit operation used herein are more efficient to communicate details of circuit operation, particularly because the schematic diagrams in the figures clearly associate various signal names with the corresponding circuit blocks and nodes. For convenience, and otherwise unnamed node conveying the CLK signal may be referred to as the CLK node. Similarly, phrases such as "pull high." "drive high," and "charge" are generally synonymous unless otherwise distinguished, as are the phrases "pull low," "drive low," and "discharge." It is believed that use of these more concise descriptive expressions enhances clarity and teaching of this disclosure. It is to be appreciated by those skilled in the art that each of these and other similar phrases may be interchangeably used to describe common circuit operation, and no subtle inferences should be read into varied usage within this description.

An insulated gate field effect transistor (IGFET) may be conceptualized as having a control terminal which controls the flow of current between a first current handling terminal and a second current handling terminal. Although IGFET transistors are frequently discussed as having a drain, a gate, and a source, in most such devices the drain is interchangeable with the source. This is because the layout and semiconductor processing of the transistor is frequently symmetrical (which is typically not the case for bipolar transistors). For an N-channel IGFET transistor, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in N-channel IGFET device equations merely refers to whichever drain or source terminal has the lower voltage at any given point in time. For example, the "source" of the N-channel device of a bi-directional CMOS transfer gate depends on which side of the transfer gate is at the lower voltage. To reflect this symmetry of most N-channel IGFET transistors, the control terminal may be deemed the gate, the first current handling terminal may be termed the "drain/source", and the second current handling terminal may be termed the "source/drain". The source and drain terminals may also be referred to as conduction electrodes. Such a description is equally valid for a P-channel IGFET transistor, since the polarity between drain and source voltages, and the direction of current flow between drain and source, is not implied by such terminology. Alternatively, one current-handling terminal may arbitrarily deemed the "drain" and the other deemed the "source", with an implicit understanding that the two are not distinct, but interchangeable. It should be noted that IGFET transistors are commonly referred to as MOSFET transistors (which literally is an acronym for "Metal-Oxide-Semiconductor Field Effect Transistor"), even though the gate material may be polysilicon or some material other than metal, and the dielectric may be oxynitride, nitride, or some material other than oxide. The casual use of such historical legacy terms as MOS and MOSFET should not be interpreted to literally refer to only a metal gate FET having an oxide dielectric.

Regarding power supplies, a single positive power supply voltage (e.g., a 2.5 volt power supply) used to power a circuit is frequently named the "$V_{DD}$" power supply. In an integrated circuit, transistors and other circuit elements are actually connected to a $V_{DD}$ terminal or a $V_{DD}$ node, which is then operably connected to the $V_{DD}$ power supply. The colloquial use of phrases such as "tied to $V_{DD}$" or "connected to $V_{DD}$" is understood to mean "connected to the $V_{DD}$ node", which is typically then operably connected to actually receive the $V_{DD}$ power supply voltage during use of the integrated circuit. The reference voltage for such a single power supply circuit is frequently called "$V_{SS}$." Transistors and other circuit elements are actually connected to a $V_{SS}$ terminal or a $V_{SS}$ node, which is then operably connected to the $V_{SS}$ power supply during use of the integrated circuit. Frequently the $V_{SS}$ terminal is connected to a ground reference potential, or just "ground." Describing a node which is "grounded" by a particular transistor or circuit (unless otherwise defined) means the same as being "pulled low" or "pulled to ground" by the transistor or circuit.

Generalizing somewhat, the first power supply terminal is frequently named "$V_{DD}$", and the second power supply terminal is frequently named "$V_{SS}$." Historically the nomenclature "$V_{DD}$" implied a DC voltage connected to the drain terminal of an MOS transistor and $V_{SS}$ implied a DC voltage connected to the source terminal of an MOS transistor. For example, legacy PMOS circuits used a negative VDD power supply, while legacy NMOS circuits used a positive $V_{DD}$ power supply. Common usage, however, frequently ignores this legacy and uses $V_{DD}$ for the more positive supply voltage and $V_{SS}$ for the more negative (or ground) supply voltage unless, of course, defined otherwise. Describing a circuit as functioning with a "$V_{DD}$ supply" and "ground" does not necessarily mean the circuit cannot function using other power supply potentials. Other common power supply terminal names are "$V_{CC}$" (a historical term from bipolar circuits and frequently synonymous with a +5 volt power supply voltage, even when used with MOS transistors which lack collector terminals) and "GND" or just "ground."

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While the disclosed devices and techniques have been described in light of the embodiments discussed above, one skilled in the art will also recognize that certain substitutions may be easily made in the circuits without departing from the teachings of this disclosure. Also, many circuits using NMOS transistors may be implemented using PMOS transistors instead, as is known in the art, provided the logic polarity and power supply potentials are reversed. In this vein, the transistor conductivity type (i.e., N-channel or P-channel) within a CMOS circuit may be frequently reversed while still preserving similar or analogous operation. Moreover, implementation of the disclosed devices and techniques is not necessarily limited to CMOS technology, and thus implementations utilizing NMOS, PMOS, and various bipolar or other semiconductor fabrication technologies are also contemplated, including PN junction memory devices and nanotube devices.

The various techniques, structures, and methods described above are contemplated to be used alone as well as in various combinations. The above discussion is meant to be illustrative of the principles and various embodiments of the present invention, and it should be understood that the drawings and detailed description herein are to be regarded in an illustrative rather than a restrictive manner, and are not intended to be limiting to the particular forms and examples disclosed. Numerous variations and modifications will become apparent to those skilled in the art once the above disclosure is fully appreciated. It is intended that the following claims be interpreted to embrace all such variations and modifications.

What is claimed is:

1. A memory cell, comprising:
a data node;
a first transistor;
a second transistor;
a third transistor;
a fourth transistor;
a write port for writing data to be stored in the memory cell;
a read port having a variable impedance that varies in accordance with a data value stored therein, wherein the data value is one of at least three different data values that the memory cell is capable of storing;
a second read port; and
a second write port;
wherein the second transistor and the third transistor are coupled in series between the read port and a fixed reference;
wherein the first transistor is coupled between the write port and the data node;
wherein the fourth transistor and the second transistor are coupled in series to the second read port; and
wherein the fourth transistor is coupled between the second write port and the data node.

2. The memory cell of claim 1, wherein:
the write port is coupled with a write bit line; and
the read port is coupled with a read bit line.

3. The memory cell of claim 2, wherein:
the write bit line and the read bit line are orthogonal to each other.

4. The memory cell of claim 1, wherein:
the write port is coupled with the write bit line;
the second read port is coupled with a second read bit line; and
the write bit line and the second read bit line are orthogonal to each other.

5. The memory cell of claim 1, wherein:
the read port is coupled with the read bit line;
the second write port is coupled with a second write bit line; and
the read bit line and the second write bit line are orthogonal to each other.

6. A method, comprising:
determining more than one bit of information stored in a memory cell, wherein the determining comprises:
reading an output of a read port of the memory cell, wherein the read port has an impedance that varies in accordance with, and is indicative of, a data value stored therein, and
wherein the data value is one of at least three different data values that the memory cell is capable of storing;
wherein the determining is performed by a binary search of a plurality of possible read current values using a variable reference bias current coupled to the read port; and
wherein determining the more than one bit of information comprises detecting when a voltage of the read port falls below a predetermined threshold voltage using respective ones of a plurality of strobe clocks.

7. The method of claim 6, wherein the memory cell is a volatile memory cell.

8. The method of claim 6, wherein the memory cell is a non-volatile memory cell.

9. The method of claim 6, wherein the memory cell is a 3T DRAM memory cell.

10. The method of claim 6, wherein the output of the read port is configured to perform a function operation.

11. The method of claim 10, wherein the function operation is an arithmetic operation.

12. The method of claim 10, wherein the function operation is a logical operation.

13. The method of claim 10, wherein the function operation is a logistic operation.

14. The method of claim 10, wherein the function operation is an activation operation.

15. The method of claim 6, wherein the memory cell corresponds to a memory cell of a plurality of memory cells;
the binary search to determine the information stored in the plurality of memory cells performed depends on the respective value in each of the plurality of memory cells.

16. The method of claim 15, wherein the binary search to determine the information stored in the plurality of memory cells requires a logarithmic base two of possible different data values stored in the memory cells.

17. The method of claim 6, wherein the variable reference is a variable reference bias current.

* * * * *